US006275064B1

(12) United States Patent
Agrawal et al.

(10) Patent No.: US 6,275,064 B1
(45) Date of Patent: Aug. 14, 2001

(54) SYMMETRICAL, EXTENDED AND FAST DIRECT CONNECTIONS BETWEEN VARIABLE GRAIN BLOCKS IN FPGA INTEGRATED CIRCUITS

(75) Inventors: Om P. Agrawal, Los Altos; Herman M. Chang, Cupertino; Bradley A. Sharpe-Geisler; Giap H. Tran, both of San Jose, all of CA (US)

(73) Assignee: Vantis Corporation, Sunnyvale, CA (US)

( * ) Notice: Subject to any disclaimer, the term of this patent is extended or adjusted under 35 U.S.C. 154(b) by 0 days.

(21) Appl. No.: 08/996,361

(22) Filed: Dec. 22, 1997

(51) Int. Cl.[7] ............................ G06F 7/38; H03K 19/173; H03K 19/177
(52) U.S. Cl. .................................. 326/39; 326/38
(58) Field of Search .................... 326/37, 38, 39, 326/40, 41, 47; 365/230

(56) References Cited

U.S. PATENT DOCUMENTS 5,581,199   12/1996   Pierce et al. .
5,982,193 * 11/1999   Agrawal et al. ........................ 326/39

OTHER PUBLICATIONS

Hauck et al, "Mesh Routing Topologies for Multi–FPGA Systems," IEEE, entire document, 1994.*
Kwiat et al, "Modeling a Versatile FPGA for Prototyping Adaptive Systems," IEEE, entire document, 1995.*

* cited by examiner

Primary Examiner—Patrick Wamsley
(74) Attorney, Agent, or Firm—Fliesler Dubb Meyer & Lovejoy LLP

(57) ABSTRACT

A Field Programmable Gate Array (FPGA) device includes a plurality of variable grain blocks (VGBs) and a plurality of interconnect lines for providing program-defined routing of signals between the VGBs. The VGBs include a plurality of L-organized CBBs (configurable logic blocks) having function-producing resources. Each CBB includes 6 term inputs, 2 control inputs and one direct connect output. Each CBB includes two configurable building elements having 3 term inputs and 1 control input, respectively. The plurality of interconnect lines includes a direct connect architecture for providing programmably-selectable, dedicated connections between a center VGB, in particular a CBB, and neighboring VGBs. The direct connect architecture and positioning of inputs and outputs enables 1) enhanced flexibility and efficiency in the configuration placement and routing software 2) efficiently emulates random logic nets and 3) reduces many direct connect line wire lengths.

28 Claims, 30 Drawing Sheets

SYMMETRICAL, EXTENDED AND FAST DIRECT CONNECTIONS BETWEEN VARIABLE GRAIN BLOCKS IN FPGA INTEGRATED CIRCUITS

CROSS REFERENCE TO RELATED APPLICATIONS

The following copending U.S. patent applications are assigned to the assignee of the present application, and their disclosures are incorporated herein by reference:

CROSS REFERENCE TO RELATED PATENTS

The following U.S. patents are assigned to the assignee of the present application, and their disclosures are incorporated herein by reference:
- (A) U.S. Pat. No. 5,212,652 issued May 18, 1993 to Om Agrawal et al. and entitled, PROGRAMMABLE GATE ARRAY WITH IMPROVED INTERCONNECT STRUCTURE;
- (B) U.S. Pat. No. 5,621,650 issued Apr. 15, 1997 to Om Agrawal et al. and entitled, PROGRAMMABLE LOGIC DEVICE WITH INTERNAL TIME-CONSTANT MULTIPLEXING OF SIGNALS FROM EXTERNAL INTERCONNECT BUSES; and
- (C) U.S. Pat. No. 5,185,706 issued Feb. 9, 1993 to Om Agrawal et al. and entitled, PROGRAMMABLE GATE ARRAY WITH LOGIC CELLS HAVING CONFIGURABLE OUTPUT ENABLE.

BACKGROUND

1. Field of the Invention

The invention is generally directed to integrated circuits, more specifically to Programmable Logic Devices (PLDs), and even more specifically to a subclass of PLDs known as Field Programmable Gate Arrays (FPGAs).
- (A) Ser. No. 08/828,520, now U.S. Pat. No. 5,905,385, filed Apr. 1, 1997 by Bradley A. Sharpe-Geisler and originally entitled, "MEMORY BITS USED TO COUPLE LOOK UP TABLE INPUTS TO FACILITATE INCREASED AVAILABILITY TO ROUTING RESOURCES PARTICULARLY FOR VARIABLE SIZED LOOK UP TABLES FOR A FIELD PROGRAMMABLE GATE ARRAY (FPGA)";
- (B) Ser. No. 08/931,798, filed Sep. 16, 1997 by Bradley A. Sharpe-Geisler and originally entitled, "CIRCUITRY TO PROVIDE FAST CARRY";
- (C) Ser. No. 08/700,616, now U.S. Pat. No. 5,740,069 filed Aug. 16, 1996 by Om Agrawal et al. and entitled, "PROGRAMMABLE LOGIC DEVICE (PLD) HAVING DIRECT CONNECTIONS BETWEEN CONFIGURABLE LOGIC BLOCKS (CLBs) AND CONFIGURABLE INPUT/OUTPUT BLOCKS (IOBs) (AS AMENDED)" (as a continuing divisional with chained cross referencing back to Ser. No. 07/394,221 filed Aug. 15, 1989);
- (D) Ser. No. 08/912,763 filed Aug. 18, 1997, by Bradley A. Sharpe-Geisler and originally entitled, "OUTPUT BUFFER FOR MAKING A 2.5 VOLT CIRCUIT COMPATIBLE WITH A 5.0 VOLT CIRCUIT";
- (E) Ser. No. 08/948,306 filed Oct. 9, 1997, by Om Agrawal et al. and originally entitled, "VARIABLE GRAIN ARCHITECTURE FOR FPGA INTEGRATED CIRCUITS";
- (F) Ser. No. 08/966,049 filed Dec. 22, 1997, by Om Agrawal et al. and originally entitled, "DUAL PORT SRAM MEMORY FOR RUN-TIME USE IN FPGA INTEGRATED CIRCUITS";
- (G) Ser. No. 08/995,615 filed Dec. 22, 1997, by Om Agrawal et al. and originally entitled, "A PROGRAMMABLE INPUT/OUTPUT BLOCK (IOB) IN FPGA INTEGRATED CIRCUITS";
- (H) Ser. No. 08/995,614, now U.S. Pat. No. 5,982,193, filed Dec. 22, 1997, by Om Agrawal et al. and originally entitled, "INPUT/OUTPUT BLOCK (IOB) CONNECTIONS TO MAXL LINES, NOR LINES AND DENDRITES IN FPGA INTEGRATED CIRCUITS";
- (I) Ser. No. 08/995,612, now U.S. Pat. No. 5,990,702, filed Dec. 22, 1997, by Om Agrawal et al. and originally entitled, "FLEXIBLE DIRECT CONNECTIONS BETWEEN INPUT/OUTPUT BLOCKs (IOBs) AND VARIABLE GRAIN BLOCKs (VGBs) IN FPGA INTEGRATED CIRCUITS";
- (J) Ser. No. 08/997,221 filed Dec. 22, 1997, by Om Agrawal et al. and originally entitled, "PROGRAMMABLE CONTROL MULTIPLEXING FOR INPUT/OUTPUT BLOCKs (IOBs) IN FPGA INTEGRATED CIRCUITS";
- (K) Ser. No. Not Yet Known filed Dec. 22, 1997, by Bradley Sharpe-Geisler and originally entitled, "MULTIPLE INPUT ZERO POWER AND/NOR GATE FOR USE WITH A FIELD PROGRAMMABLE GATE ARRAY (FPGA)"; and,
- (L) Ser. No. 08/996,492 filed Dec. 22, 1997, by Bradley Sharpe-Geisler and originally entitled, "INPUT BUFFER PROVIDING VIRTUAL HYSTERESIS".

2. Description of Related Art

Field-Programmable Logic Devices (FPLDs) have continuously evolved to better serve the unique needs of different end-users. From the time of introduction of simple PLDs such as the Advanced Micro Devices 22V10 Programmable Array Logic device (PAL), the art has branched out in several different directions.

One evolutionary branch of FPLDs has grown along a paradigm known as Complex PLDs or CPLDs. This paradigm is characterized by devices such as the Advanced Micro Devices MACH family. Examples of CPLD circuitry are seen in U.S. Pat. No. 5,015,884 (issued May 14, 1991 to Om P. Agrawal et al.) and U.S. Pat. No. 5,151,623 (issued Sep. 29, 1992 to Om P. Agrawal et al.).

Another evolutionary chain in the art of field programmable logic has branched out along a paradigm known as Field Programmable Gate Arrays or FPGAs. Examples of such devices include the XC2000 and XC3000 families of FPGA devices introduced by Xilinx, Inc. of San Jose, Calif. The architectures of these devices are exemplified in U.S. Pat. Nos. 4,642,487; 4,706,216; 4,713,557; and 4,758,985; each of which is originally assigned to Xilinx, Inc.

An FPGA device can be characterized as an integrated circuit that has four major features as follows.

(1) A user-accessible, configuration-defining memory means, such as SRAM, EPROM, EEPROM, anti-fused, fused, or other, is provided in the FPGA device so as to be at least once-programmable by device users for defining user-provided configuration instructions. Static Random Access Memory or SRAM is of course, a form of reprogrammable memory that can be differently programmed many times. Electrically Erasable and reprogrammable ROM or EEPROM is an example of nonvolatile reprogrammable memory. The configuration-defining memory of an FPGA device can be formed of mixture of different kinds of memory elements if desired (e.g., SRAM and EEPROM).

(2) Input/Output Blocks (IOBs) are provided for interconnecting other internal circuit components of the FPGA device with external circuitry. The IOBs' may have fixed configurations or they may be configurable in accordance with user-provided configuration instructions stored in the configuration-defining memory means.

(3) Configurable Logic Blocks (CLBs) are provided for carrying out user-programmed logic functions as defined by user-provided configuration instructions stored in the configuration-defining memory means. Typically, each of the many CLBs of an FPGA has at least one lookup table (LUT) that is user-configurable to define any desired truth table, —to the extent allowed by the address space of the LUT. Each CLB may have other resources such as LUT input signal pre-processing resources and LUT output signal post-processing resources. Although the term 'CLB' was adopted by early pioneers of FPGA technology, it is not uncommon to see other names being given to the repeated portion of the FPGA that carries out user-programmed logic functions. The term, 'LAB' is used for example in U.S. Pat. No. 5,260,611 to refer to a repeated unit having a 4-input LUT.

(4) An interconnect network is provided for carrying signal traffic within the FPGA device between various CLBs and/or between various IOBs and/or between various IOBs and CLBS. At least part of the interconnect network is typically configurable so as to allow for programmably-defined routing of signals between various CLBs and/or IOBs in accordance with user-defined routing instructions stored in the configuration-defining memory means. Another part of the interconnect network may be hard wired or nonconfigurable such that it does not allow for programmed definition of the path to be taken by respective signals traveling along such hard wired interconnect. A version of hard wired interconnect wherein a given conductor is dedicatedly connected to be always driven by a particular output driver, is sometimes referred to as 'direct connect'.

Modern FPGAs tend to be fairly complex. They typically offer a large spectrum of user-configurable options with respect to how each of many CLBs should be configured, how each of many interconnect resources should be configured, and how each of many IOBs should be configured. Rather than determining with pencil and paper how each of the configurable resources of an FPGA device should be programmed, it is common practice to employ a computer and appropriate FPGA-configuring software to automatically generate the configuration instruction signals that will be supplied to, and that will cause an unprogrammed FPGA to implement a specific design.

FPGA-configuring software typically cycles through a series of phases, referred to commonly as 'partitioning', 'placement', and 'routing'. This software is sometimes referred to as a 'place and route' program. Alternate names may include, 'synthesis, mapping and optimization tools'.

In the partitioning phase, an original circuit design (which is usually relatively large and complex) is divided into smaller chunks, where each chunk is made sufficiently small to be implemented by a single CLB, the single CLB being a yet-unspecified one of the many CLBs that are available in the yet-unprogrammed FPGA device. Differently designed FPGAs can have differently designed CLBs with respective logic-implementing resources. As such, the maximum size of a partitioned chunk can vary in accordance with the specific FPGA device that is designated to implement the original circuit design. The original circuit design can be specified in terms of a gate level description, or in Hardware Descriptor Language (HDL) form or in other suitable form.

After the partitioning phase is carried out, each resulting chunk is virtually positioned into a specific, chunk-implementing CLB of the designated FPGA during a subsequent placement phase.

In the ensuing routing phase, an attempt is made to algorithmically establish connections between the various chunk-implementing CLBs of the FPGA device, using the interconnect resources of the designated FPGA device. The goal is to reconstruct the original circuit design by reconnecting all the partitioned and placed chunks.

If all goes well in the partitioning, placement, and routing phases, the FPGA configuring software will find a workable 'solution' comprised of a specific partitioning of the original circuit, a specific set of CLB placements and a specific set of interconnect usage decisions (routings). It can then deem its mission to be complete and it can use the placement and routing results to generate the configuring code that will be used to correspondingly configure the designated FPGA.

In various instances, however, the FPGA configuring software may find that it cannot complete its mission successfully on a first try. It may find, for example that the initially-chosen placement strategy prevents the routing phase from completing successfully. This might occur because signal routing resources have been exhausted in one or more congested parts of the designated FPGA device. Some necessary interconnections may have not been completed through those congested parts. Alternatively, all necessary interconnections may have been completed, but the FPGA configuring software may find that simulation-predicted performance of the resulting circuit (the so-configured FPGA) is below an acceptable threshold. For example, signal propagation time may be too large in a speed-critical part of the FPGA-implemented circuit.

In either case, if the initial partitioning, placement and routing phases do not provide an acceptable solution, the FPGA configuring software will try to modify its initial place and route choices so as to remedy the problem. Typically, the software will make iterative modifications to its initial choices until at least a functional place-and-route strategy is found (one where all necessary connections are completed), and more preferably until a place-and-route strategy is found that brings performance of the FPGA-implemented circuit to a near-optimum point. The latter step is at times referred to as 'optimization'. Modifications attempted by the software may include re-partitionings of the original circuit design as well as repeated iterations of the place and route phases.

There are usually a very large number of possible choices in each of the partitioning, placement, and routing phases. FPGA configuring programs typically try to explore a multitude of promising avenues within a finite amount of time to see what effects each partitioning, placement, and routing move may have on the ultimate outcome. This in a way is analogous to how chess-playing machines explore ramifications of each move of each chess piece on the end-game. Even when relatively powerful, high-speed computers are used, it may take the FPGA configuring software a significant amount of time to find a workable solution. Turn around time can take more than 8 hours.

In some instances, even after having spent a large amount of time trying to find a solution for a given FPGA-implementation problem, the FPGA configuring software may fail to come up with a workable solution and the time spent becomes lost turn-around time. It may be that, because of packing inefficiencies, the user has chosen too small an FPGA device for implementing too large of an original circuit.

Another possibility is that the internal architecture of the designated FPGA device does not mesh well with the organization and/or timing requirements of the original circuit design.

Organizations of original circuit designs can include portions that may be described as 'random logic' (because they have no generally repeating pattern). The organizations can additionally or alternatively include portions that may be described as 'bus oriented' (because they carry out nibble-wide, byte-wide, or word-wide, parallel operations). The organizations can yet further include portions that may be described as 'matrix oriented' (because they carry out matrix-like operations such as multiplying two, multidimensional vectors). These are just examples of taxonomical descriptions that may be applied to various design organizations. There may be more. The point is that some FPGA structures may be better suited for implementing random logic while others may be better suited for implementing bus oriented designs or other kinds of designs.

If the FPGA configuring software fails in a first run, the user may choose to try again with a differently-structured FPGA device. The user may alternatively choose to spread the problem out over a larger number of FPGA devices, or even to switch to another circuit implementing strategy such as CPLD or ASIC (where the latter is an Application Specific hardwired design of an IC). Each of these options invariably consumes extra time and can incur more costs than originally planned for.

FPGA device users usually do not want to suffer through such problems. Instead, they typically want to see a fast turnaround time of no more than, say 4 hours, between the time they complete their original circuit design and the time a first-run FPGA is available to implement and physically test that design. FPGA users also usually want the implementing FPGA circuit to provide an optimal emulation of the original design in terms of function packing density, cost, speed, power usage, and so forth irrespective of whether the original design is taxonomically describable generally as 'random logic', or as 'bus oriented', or as a combination of these, or otherwise.

When multiple FPGAs are required to implement a very large original design, high function packing density and efficient use of FPGA internal resources are desired so that implementation costs can be minimized in terms of both the number of FPGAs that will have to be purchased and the amount of printed circuit board space that will be consumed.

Even when only one FPGA is needed to implement a given design, a relatively high function packing density is still desirable because it usually means that performance speed is being optimized due to reduced wire length. It also usually means that a lower cost member of a family of differently sized FPGAs can be selected or that unused resources of the one FPGA can be reserved for future expansion needs.

In summary, end users want the FPGA configuring software to complete its task quickly and to provide an efficiently-packed, high-speed compilation of the functionalities provided by an original circuit design irrespective of the taxonomic organization of the original design.

In the past, it was thought that attainment of these goals was primarily the responsibility of the computer programmers who designed the FPGA configuring software. It has been shown however, that the architecture or topology of the unprogrammed FPGA can play a significant role in determining how well and how quickly the FPGA configuring software completes the partitioning, placement, and routing tasks.

An improved FPGA architecture that helps FPGA configuring software to better reach its goals was disclosed in U.S. Pat. No. 5,212,652, issued May 18, 1993 to Agrawal et al. The improvement provided a symmetrically balanced distribution of logic function resources and routing resources in both horizontal and vertical directions so that placement and routing was not directionally constrained to, for example, a left-to right signal flow orientation. Balanced availability of logic function-implementing resources and signal-routing resources was provided to give the FPGA configuring software more degrees of freedom in each of the partitioning, placement, and routing phases. This increased the likelihood that congestion would be avoided during placement and routing because circuit implementation could be more uniformly distributed instead of being concentrated along a particular direction. It also increased the probability that more efficient solutions would be found in the iterative optimization phases because optimization attempts would not be constrained by pre-existing congestions.

U.S. patent application Ser. No. 08/700,616 now U.S. Pat. No. 5,740,069 (hereinafter "'616 application"), entitled "Programmable Logic Device (PLD) Having Direct Connections Between Configurable Logic Blocks (CLBs) and Configurable Input/Output Blocks (IOBs), filed Aug. 15, 1989 by Agrawal et al., disclosed signal-routing resources, and in particular, direct connections between CLBs. Direct connect outputs and inputs were positioned on all four sides of a CLB. A single direct connect output was positioned on each side of a CLB. Similarly, four direct connect inputs were positioned on each side of a CLB. The positioning of direct connect inputs and outputs on a CLB, as well as positioning of the direct connect lines, enables a symmetrically balanced distribution of direct connect signal routing resources.

Further advances in integrated circuit manufacturing technologies have now enabled higher densities of logic function-implementing circuits and higher densities of signal routing resources. This presents opportunities for further-improvements.

SUMMARY OF THE INVENTION

An improved direct connect architecture in accordance with the invention features direct connections between a repeating pattern of logic-implementing, Variable Grain Blocks or 'VGBs'.

In a preferred class of embodiments, plural VGBs are symmetrically arranged and wedged together in a manner similar to slices of a symmetrically-cut pie. The congregated or 'wedged-together' VGBs form a super-VGB structure. Each such super-VGB includes centralized means for merging together the resources of its respective VGBs so that the super-VGB can offer even higher levels of functionality than are provided by each of its constituent VGBs.

In further accordance with the invention, plural super-VGBs are distributed in a matrix across an FPGA device. VGB-to-VGB interconnect lines extend along sides of the super-VGBs. In a preferred embodiment, there are at least four VGBs in each super-VGB. Each of these four VGBs preferably has an L-shaped (or V-shaped) internal organization that lies adjacent to, or forms a peripheral part of the super-VGB.

Within each such L-shaped internal organization, there is provided a symmetrical distribution of function-spawning units. These function-spawning units, which are also referred to herein as 'Configurable Building Elements' or CBEs, may be used to acquire input signals and to initiate the synthesis of a spectrum of functions of increasing complexity within the corresponding VGB.

In one embodiment, there is a same, even number of CBEs along each leg (each primary typographic stroke) of the L-shaped internal organization of each VGB. Input decoder means are provided for linking together input term acquiring resources of neighboring CBEs and allowing such CBEs to share acquired input term signals so that such neighboring CBEs can process same signals in parallel. This sharing of acquired input term signals allows for efficient folding together or compounding of elemental resources as will be detailed below.

Each function-spawning unit (CBE) has a user-configurable signal-acquiring means (CIE) for acquiring a subset of LUT input terms from adjacent interconnect lines. A user-configurable lookup table (LUT) is further provided within each of the function-spawning units (CBEs) for processing corresponding ones of the acquired LUT input terms. A decoding section (which is part of the above-mentioned input decoder means) is additionally provided between the CIE and LUT of each CBE for supporting the function synthesis process wherein plural CBEs (Configurable Building Elements) are compounded to define higher levels of functionality.

In one embodiment, each super-VGB is surrounded by diversified set of interconnect resources. These diversified interconnect resources may include: general bidirectional interconnect lines of varying lengths; switch boxes that provide programmable interconnection between the general bidirectional interconnect lines; and unidirectional direct connect lines.

In one embodiment, the inputs of a first leg or two CBBs which are positioned at the top side of a VGB are programmably connected to the direct connect outputs of eight neighboring VGBs. In particular, the respective direct connect outputs from legs or two CBBs in four respective adjacent and four respective next-adjacent VGBs are connected by direct connect lines to the two CBBs' inputs in the center VGB. Each CBB has eight inputs and one direct connect output. Accordingly, the center VGB may receive 16 direct connect inputs from neighboring VGBs.

In still another embodiment, the inputs of a second leg or two CBBs which are positioned at the left side of a center VGB are programmably connected to the direct connect outputs of eight neighboring VGBs. In particular, the respective direct connect outputs from legs or two CBBs in four respective adjacent and four respective next-adjacent VGBs are connected by the direct connect lines to the two CBBs' inputs in the center VGB. In this embodiment, the center VGB also receives 16 direct connect inputs from neighboring VGBs. The 16 direct connect inputs include 6 general term inputs and 2 control input for each CBB. The control input is coupled to a common control function circuit in a super VGB.

The direct connect lines may be programmably connected by a multiplexer including a plurality of programmable interconnect points (PIPs).

In yet another embodiment, a L-organized VGB includes four CBBs. Each CBB has a direct connect output programmably connected to a direct connect line. The direct connect line is connected to respective inputs in eight neighboring VGBs including adjacent and next-adjacent VGBs. In particular, the direct connect line is connected to two CBBs in the four respective adjacent and four respective next-adjacent VGBs. Accordingly, a center VGB may output four different direct connect output signals to eight neighboring VGBs.

In another embodiment, a center VGB has a CBB direct connect output programmably connected to diagonal VGBs. In particular, a direct connect line may be programmably connected to four sets of VGBs positioned northwest, northeast, southeast, and southwest of a center VGB.

Consequences of the Variable Grain Architecture

The direct connections between the VGBs, and in particular direct connections between the CBBs in the variable grain architecture, enables a plurality of advantageous cooperations and consequences.

First, each VGB has up to 32 direct connect inputs (8 inputs per CBB) which may be programmably connected directly to neighboring VGB direct connect outputs. The additional direct connect inputs, as compared to the direct connect inputs suggested in the '616 application, allow for greater degrees of freedom in the FPGA configuration software. In particular, the routing phase has additional direct connect inputs to use in attempting to establish connections between adjacent chunk-implemented VGBs. Also, when the FPGA configuration software implements the increased number of direct connections in a routing phase, other inter-connect resources which would have been otherwise consumed are now available. This additional resource may also allow the FPGA configuration software to have more input possibilities which may reduce the number of iterations needed to establish suitable connections. Further, the FPGA configuration software may be able to more densely pack an FPGA-implemented circuit due to the increased direct connect resources. A more densely packed FPGA-implemented circuit may allow for reducing the number of necessary FPGAs used in a particular application or allow for future expansion.

Second, each VGB has four direct connect outputs from four respective CBBs which can be directly connected to inputs of adjacent and next-adjacent VGBs. Like the additional direct connect inputs, the additional direct connect outputs to adjacent and next-adjacent VGBs enables more flexibility in the FPGA configuration software, as well as allows for a more efficient FPGA-implemented circuit. For example, the FPGA configuration software has the flexibility of placing a given chunk into either CBB in a particular VGB leg. Also, the direct connect signal propagation time to neighboring VGBs is substantially equal for either CBB in a particular leg.

Third, additional direct connections between adjacent VGBs increase the performance of the FPGA-implemented circuit. Generally, direct connect lines offer reduced signal propagation times between VGBs in comparison to general connect resources. Thus, the FPGA configuration software is able to use the additional faster direct connect resources in configuring the FPGA-implemented circuit.

A fourth advantage of the present direct connect architecture arises from the positioning of the VGB direct connect inputs and outputs in the L-organized arrangement of CBEs. The positioning of the VGB direct connect inputs and outputs reduces direct connect wire length used in many FPGA-implemented circuits. Thus, direct connect signal propagation delays may be reduced by reducing the resistance, capacitance and inductance associated with reduced direct connect wire lengths. Further, direct connect wires do not have to span additional interconnect channels.

The reduced direct connect line lengths and reduced interconnect channel crossings enables reduced signal propagation time, reduced manufacturing costs and increased function packing density in FPGAs.

Fifth, the present direct connect architecture provides an efficient implementation of most random logic nets. Typically, random logic nets require short and fast connections between neighboring logic elements. The direct connect architecture and dedicated drive amplifiers providing the speed and length between logic elements necessary to emulate short connections in random logic.

Sixth, the FPGA configuration software efficiently repositions a plurality of circuit chunks requiring high speed direct connect signals placed in a first group of VGBs into a second group of VGBS. The first group of VGBs form a "cross-hair" which includes a first column of VGBs and a first row of VGBs. The first row of VGBs and first column of VGBs intersect at a common center VGB. In an embodiment, every VGB in the first group, except for the center common VGB, may be a center VGB for the second group of VGBs.

The first group of circuit chunk implemented VGBs may have particular direct connect signal timing requirements between VGBs met by the present direct connect architecture. The symmetric VGB and direct connect architecture enable the FPGA configuration software to reposition the plurality of circuit chunks in the first group into the second group of VGBs and still meet the direct connect signal timing requirements between circuit chunk implemented VGBs in the second group. The direct connect signal delays between particular circuit implemented chunks in the first group is substantially the same as the direct connect signal delays between respective circuit implemented chunks in the second group.

Other aspects of the invention will become apparent from the below detailed description.

BRIEF DESCRIPTION OF THE DRAWINGS

The below detailed description makes reference to the accompanying drawings, in which.

DETAILED DESCRIPTION

Figure 1:
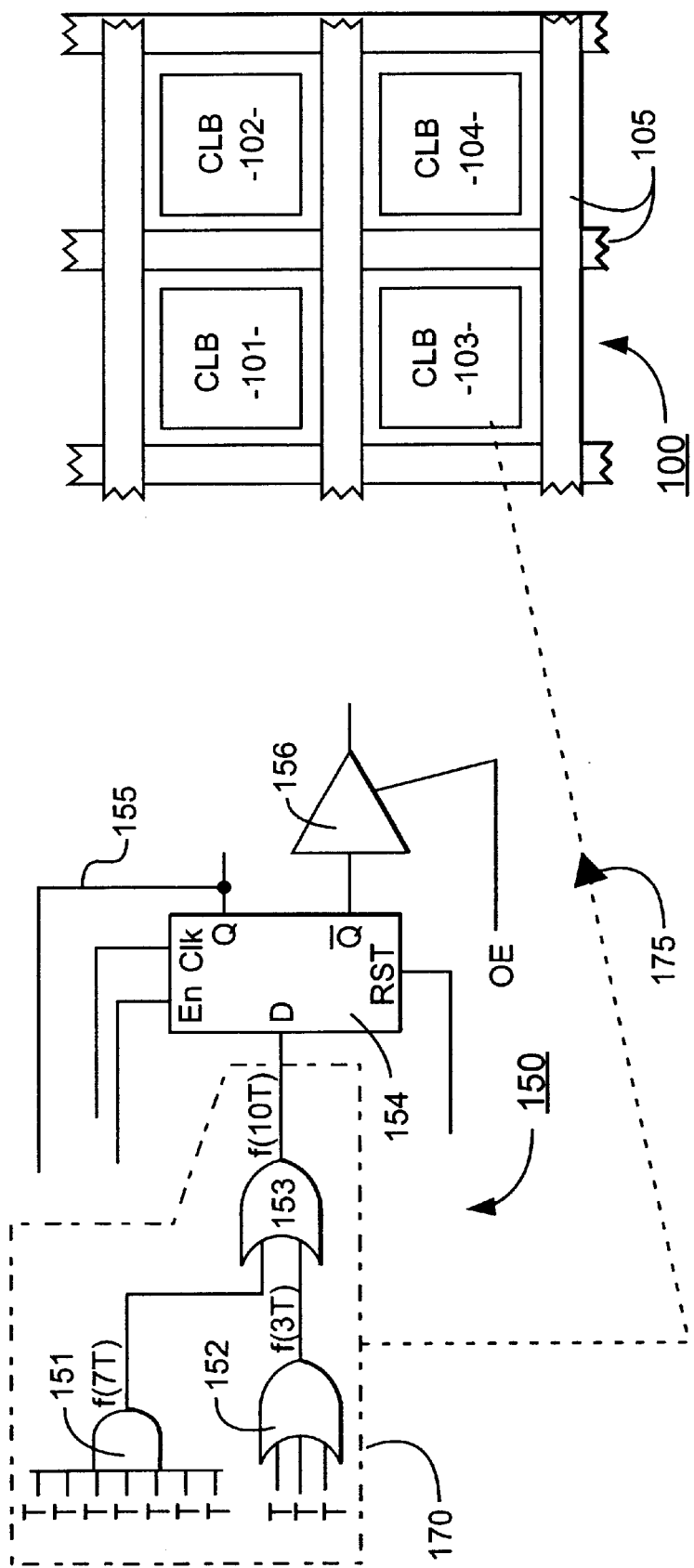
FIG. 1 illustrates an example of partitioning and placement as applied to a generic FPGA device.

FIG. 1 shows at 100 a basic FPGA architecture in which a matrix of configurable logic blocks (CLBs) 101–104 are distributed within an interconnect mesh 105. This basic FPGA architecture 100 will be used to illustrate some aspects of FPGA design and configuration.

A number of FPGA terms will be used throughout the specification. The term 'CLB' as used herein generally refers to a Boolean function generating block whose structure is essentially repeated throughout the device. Each CLB usually has at least one programmable lookup table (LUT), but may have more LUTs. Each CLB may have other resources such as data-storage elements (e.g., flip flops) and local feedback means for creating sequential state machines.

The term 'interconnect mesh' as used herein generally refers to a repeated pattern of connection-providing resources which carry signal traffic between CLBs. An analogy can be made to the mesh of public highways (expressways) and public streets that carry vehicle traffic in modern cities. The interconnect mesh of an FPGA may also include connection-providing resources that can carry signal traffic between CLBs and input/output blocks (IOBs). As used herein, 'IOB' refers to a repeated structure (not shown in FIG. 1) that provides interface between points outside the FPGA device and FPGA-internal components.

The term 'intra-connection' resources (note the 'ra' sequence before the hyphen) is used herein to refer to connection-providing resources that are dedicated to carrying signals essentially only inside a particular entity such as a CLB or an IOB. Such intra-connection resources are to be distinguished from 'inter-connection resources' (note the 'er' sequence before the hyphen). In general, intraconnection is a relative term which should accompany the entity to which it is dedicated. Thus CLB-intraconnection refers to connection resources that are dedicated to carrying signals essentially only inside a particular CLB.

The term 'inter-connection resources' is used herein to refer to connection-providing resources that can carry signals between two or more CLBs and/or between two or more IOBs and/or between a CLB and an IOB.

To distinguish intra-connection resources over interconnection resources, an analogy can be made to the private driveway of a private house as distinguished from an adjacent public highway (expressway) or an adjacent public street, where the latter generally carries passing-by general traffic as well as private traffic of the private driveway.

Interconnection resources in the FPGA include both those that provide programmable routing of signals between any desired CLBs and/or IOBs and those that provide fixed routing (hardwired transmission) of signals between specific IOBs and/or specific CLBs. One type of fixed-route interconnect resource is a line that is always (fixedly) driven by a dedicated output but can have its carried signal programmably coupled to one or more inputs. Such unidirectional, fixed-route lines are generally referred to herein as 'direct connect lines'.

Interconnect resources which provide programmably-definable routing of signals between CLBs and/or IOBs can include 'maximum length' lines (MaxL lines) which span essentially the full workable length of the FPGA device along one of its major axes (e.g., the horizontally-extending x axis or the vertically-extending y axis). MaxL lines are also referred to as 'longlines'.

The programmably-configurable interconnect resources can further include 'short-haul segments' which extend for lengths significantly less than those of the longlines. Short-haul segments generally terminate on both ends at interconnect 'switch boxes'. The switch boxes provide programmably-definable interconnections between terminal ends of short-haul connectors merging into the switch boxes.

Once a specific interconnect line is 'consumed' for carrying a first signal, that interconnect resource cannot be used to at the same time carry a second signal. Similarly, once a specific, logic function-providing resource is 'consumed' for carrying out a first logic function, that same logic function-providing resource cannot be used to at the same time carry out a completely different, second logic function.

When an FPGA is used to implement a given, original circuit design, successive portions of the FPGAs interconnect resources and logic function-providing resources are consumed by corresponding portions of the original circuit design.

PARTITIONING AND PLACEMENT EXAMPLE

FIG. 1 shows at 150 an example of a circuit design portion whose functionality is to be implemented within generic FPGA device 100. Sample circuit section 150 may include a first logic gate 151 (an AND gate) having seven inputs and one output. Each of the input signals is referred to as a Boolean 'term' (T). The output signal of gate 151 is therefore a function of seven terms and this is denoted by the shorthand, 'f(7T)'.

Similarly, a second gate 152 (OR gate) in original design 150 is shown to have three independent input terms and its output function is therefore denoted as f(3T).

A third gate 153 (OR) receives the f(7T) and f(3T) outputs of gates 151 and 152 and produces therefrom an output signal f(10T) which is a Boolean function of all ten input terms.

Element 154 of original design 150 represents a data storage device such as a D-type flip-flop. Storage element 154 includes a data input terminal (D), a stored-data output terminal (Q), an inverted output terminal (Qbar), a reset terminal (RST), a clock input terminal (Clk) and a clock enable terminal (En). Line 155 represents a high speed feedback (FB) connection which couples an output of storage device 154 either to define one of the input terms (T) of gates 151–152 or to define an input of another, not-shown logic gate which closely precedes one of gates 151–152.

Element 156 of original design 150 represents a 3-state output driver (tri-state drive) which outputs a binary signal when enabled and whose output goes into a high impedance state when its output enable (OE) control terminal is deactivated. When not in the high impedance state, the output of driver 156 charges and/or discharges a capacitive load 157. The capacitive load can be in the form of a cable, or a system bus line, and/or a set of further gate inputs.

Dashed box 170 represents a possible first partitioning of original circuit portion 150 into a circuit chunk that is to be placed within, and implemented by, a specific CLB, say the one at 103. Dashed line 175 represents this specific placement.

If the initially assigned CLB 103 contains enough not-yet-consumed resources to implement the first partition 170, the initial placement of partition 170 completes and the same resources of CLB 103 are deemed to be consumed by the now placed, partition 170.

After such successful placement of partition 170 in CLB 103, another partitioned portion of the original design 150 (e.g., flip flop 154) is placed elsewhere, say in CLB 102. Thereafter, the interconnect resources of interconnect mesh 105 are consumed to reconnect the partitions. Eventually, a series of further placements and interconnect routings completes the implementation of circuit 150 in target FPGA 100.

Figure 2:
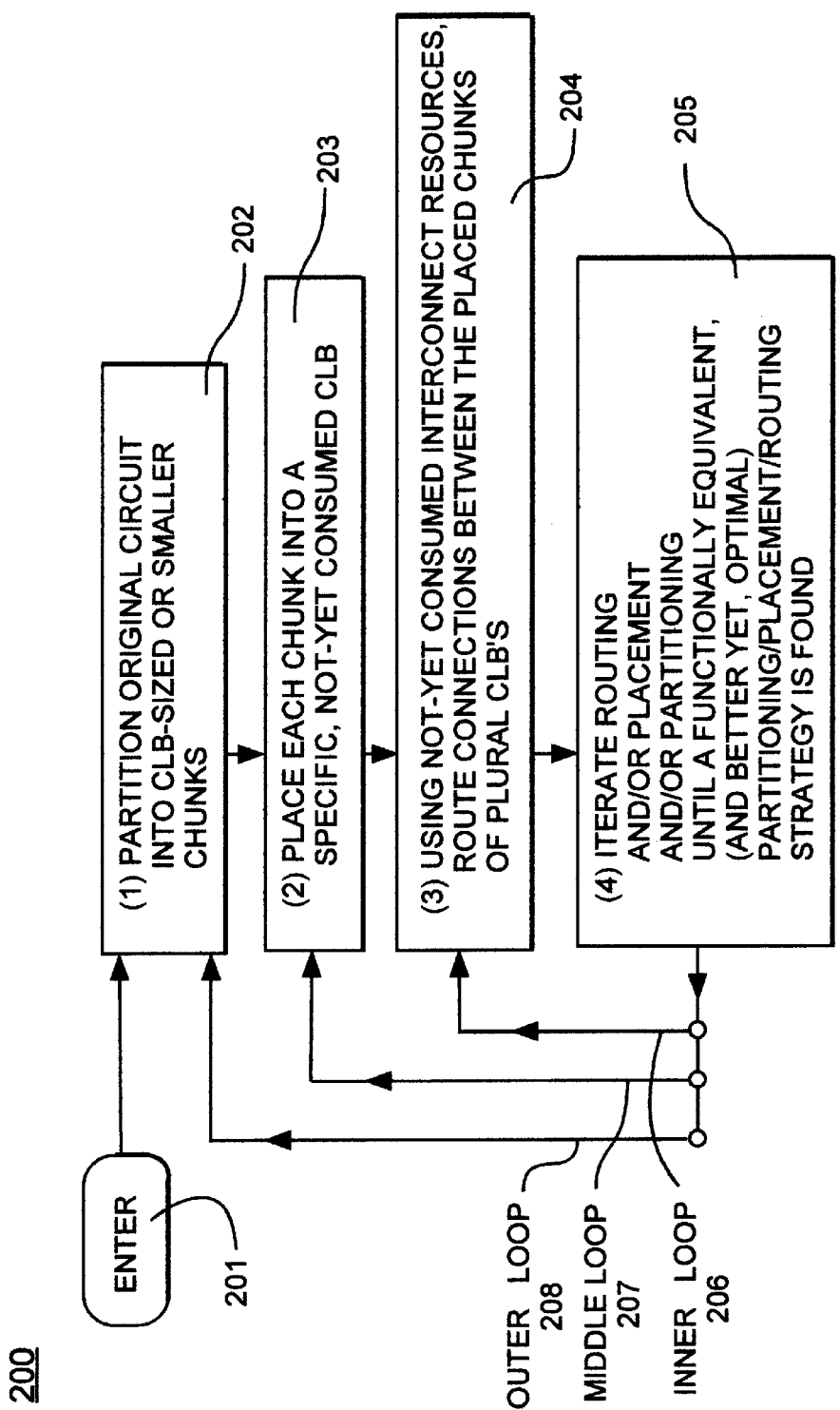
FIG. 2 shows a generalized flow chart for FPGA configuring software.

FIG. 2 outlines the general procedure for an FPGA configuring software module 200. Module 200 receives specifications for an original circuit design such as 150 at entrance point 201. Its task is to configure a designated FPGA such as 100 to implement the functions of the original circuit design 150. This is to be done under the constraints of the finite number of logic function-providing resources 101–104 and interconnect resources provided in FPGA 100.

At step 202, the FPGA-configuring software module 200 partitions the original circuit design (150) into a plurality of CLB-sized or smaller chunks. A 'CLB-sized chunk', or a smaller chunk, is a partitioned circuit portion that can be fully implemented by the target CLB (e.g., 103). Such implementation includes: (1) timely receipt of all input signals flowing into the partitioned chunk (for example all ten independent input terms or T's of partition 170); (2) timely carrying out of all the data processing functions of the partition (e.g., producing the ten term output, f(10T)); and (3) timely provision of a sufficient number of outputs at sufficient speed and power.

Partitioning and placement are not always successful on first try. Assume by way of example that CLB 103 contains only one, not-yet-consumed, lookup table (LUT) capable of handling up to, but not more than eight input terms (8T). In such a case, partition 170 would not fit into CLB 103 and cannot be placed there. Either the initial partition has to be reduced or another CLB with greater not-yet-consumed resources has to be found.

If the re-partitioning strategy is followed here, the illustrated partition 170 might be shrunk to encompass only the 3-input termed OR gate 152 instead gates 151, 152 and 153. Of course, that would be an inefficient use of the f(8T) function-providing capabilities of CLB 103. The smarter step for the FPGA configuring software 200 would have been to shrink partition 170 to encompass only the 7-input termed AND gate 151. Then gates 152 and 153 would be moved into a different partition. This is just an example of the strategy problems that are encountered by the FPGA configuring software and not indicative of any specific algorithm.

In general, partitioning step 202 tries to adjust its operations to closely match the function-providing resources available within each CLB 101–104 so that the partitioning chunks are neither larger than what can be accommodated nor too small.

As indicated for the following step 203, each partitioned chunk is virtually 'placed' in a specific, not-yet-consumed CLB. Once the partition-implementing resources of a specific CLB (e.g., 103) are consumed by one or more chunks already placed therein, that CLB is no longer available for supporting further chunks. In such a case, for each next chunk, the placement step 203 looks for another CLB with not-yet-consumed resources to support that next chunk.

At subsequent routing step 204, an attempt is made to use the available interconnect resources 105 to re-establish connections between the partitioned and placed chunks. As indicated, successive ones of not-yet consumed interconnect resources are consumed in turn in an attempt to route connections between the specifically placed chunks in the various CLBs. The goal is to reconstruct the original design 150.

At step 205, the FPGA-implemented solution that results from the prior partitioning, placement and routing steps 202–204 is examined to see whether a functionally equivalent implementation of the original circuit design 150 has been successfully obtained using the available resources of FPGA 100.

If some connections are still incomplete or are too slow, inner iteration loop 206 may be followed. In loop 206, different routing strategies are tried using the available interconnect resources 105 of the FPGA to see if a better routing solution can be found.

If the re-routing attempts are not successful by themselves, middle iteration loop 207 may be attempted to try different placement strategies in hopes of obtaining a functional or better implementation.

Finally, if trials with different placements 207 and different routings 206 do not succeed, outer iteration loop 208 may be followed in an attempt to try different partitioning strategies as well.

If the outer most loop 208 fails to provide a functional and acceptable result after a predefined number of attempts, the software module 200 will typically report an inability to implement the original circuit design 150 in the target FPGA 100. The user may be asked to retry with another FPGA having more resources and/or a different architecture.

Suppose that step 205 determines that a functional implementation for the original circuit 150 has been obtained after only one run of each of steps 202–204. Even here, it is often desirable to continue the inner, middle, and even outer iterations loops 206–208 in hopes of finding more optimal implementations of the original circuit design 150. The more optimal implementations may provide higher operating speeds, less power usage, or denser packing within the implementing FPGA 100.

After step 205 obtains a functional final implementation, the inputs of unused gates, if any, are normally configured so as to be tied to a steady logic 1 or logic 0. This is done to avoid having floating inputs that in the presence of switching noise, may cause their respective gate outputs to switch and generate further noise.

Although the partitioning, placement and routing phases have been presented above as being carried out in a specific order (partitioning first, then placement, then routing), there is nothing requisite about this order. Those skilled in the art will appreciate that the phases can be intermixed according to a variety of orderings. For example, during optimization some routings may be defined first and then the effects of different placements may be investigated while the defined routings are temporarily held fixed.

Improvements can and have been made to FPGA configuring software modules such as the one shown in FIG. 2. However, there is a limit to how far such improvements can proceed on the software side. This is so because the FPGA configuring software module 200 is inherently constrained by the quantities, types, granulations, and distribution of resources provided within the target FPGA device 100.

At some point, the design of the FPGA 100 itself must be improved in some substantial way in order to obtain better implementations of the original design 150.

A First Symmetric Architecture

Figure 3A:
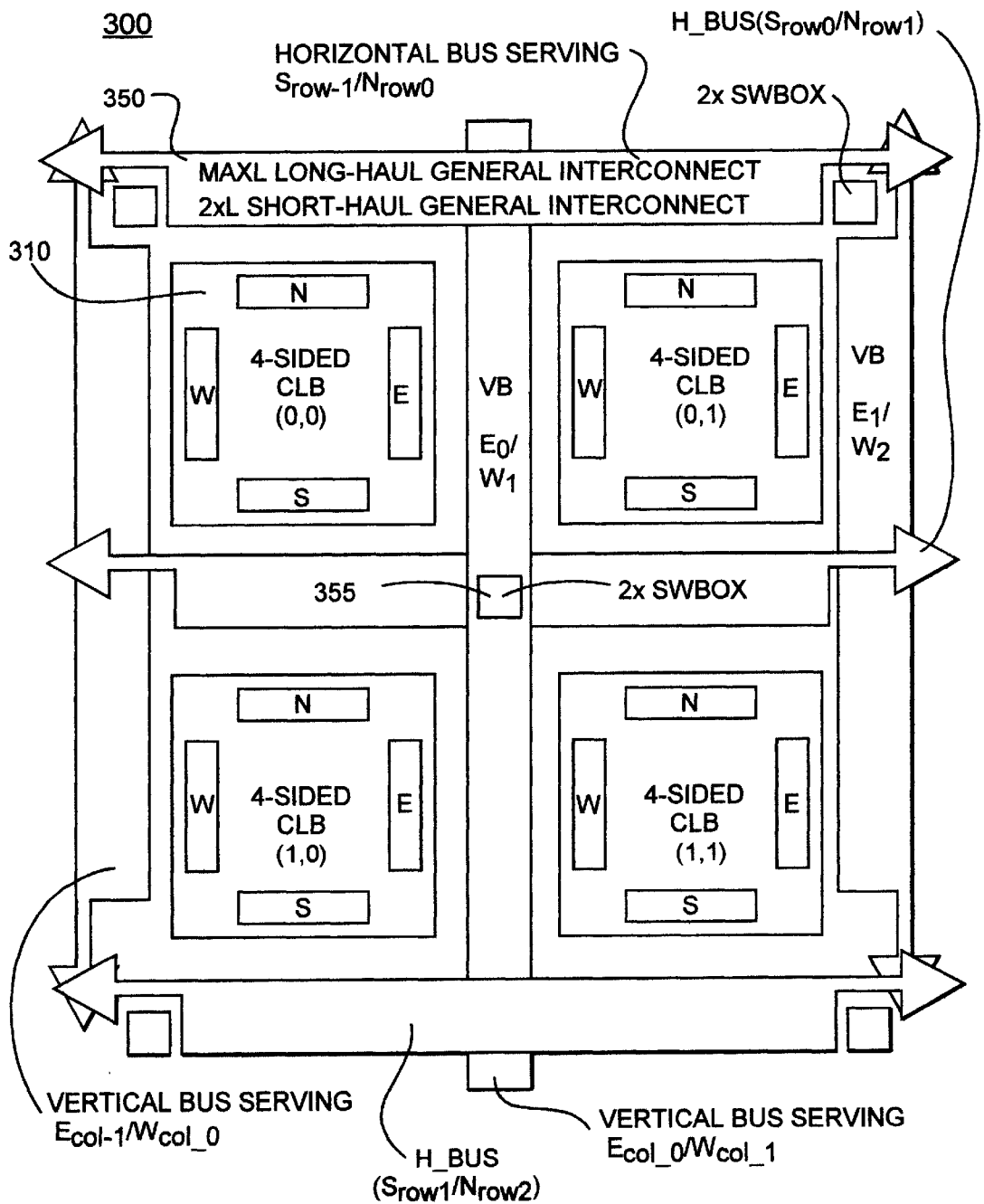
FIG. 3A schematically illustrates a previously suggested symmetric architecture having 4-sided CLBs with function synthesizing cores.

FIG. 3A schematically illustrates a symmetrical organization 300 of a type previously suggested in U.S. Pat. No. 5,212,652. In this architecture 300, each CLB such as 310 is topologically organized as a four-sided symmetrical object. The four illustrated CLBs are identified by relative row and column as (0,0), (0,1), (1,0) and (1,1). Equivalent input/output ports are symmetrically distributed about the periphery of each four-sided CLB. A function synthesizing core is provided at the center of each four-sided CLB.

In FIG. 3A, these four peripheral ports of each CLB are denoted as N, E, S and W according to the points of the compass. Each of the input/output ports (N, E, S, W) has specialized input terminals for respectively receiving direct connect signals, or longline signals, or signals from short-haul general-interconnect segments.

Some topological observations can be made about the architecture 300 shown in FIG. 3A. The symmetrical arrangement of input and output resources about the periphery of each CLB 310 provides equal degrees of freedom for placement, partitioning and routing. As explained above, this can advantageously help the FPGA configuring software to complete its job. However, because of the central disposition of LUTs, all LUT-input signals invariably flow the full distance from the peripheral ports (N, E, S, W) through a transition layer into the center and all LUT-developed signals invariably flow the full distance back out again from core, through transition layer to a PIE layer, irrespective of whether simpler or more complex functions are being developed, and irrespective of whether the resultant output signals are destined for output onto high-speed direct connect lines or output onto potentially-slower longlines. Moreover in the architecture 300 of FIG. 3A, each of the four peripheral ports (N, E, S, W) has its own longline driving amplifier (e.g., 325), which same amplifier 325 is also used for driving short-haul conductor segments.

Another topological observation to be made respecting architecture 300 (FIG. 3A) is that there is a symmetrical distribution of horizontal and vertical interconnect buses cutting between the respectively-facing N-S and E-W ports of all immediately adjacent CLBs. This inherently places distance between such counter-facing N-S and E-W ports.

Also, there is a 'sidedness' to each port. If one wishes to cascade functions of the CLB by for example moving a signal output from the N port of a CLB 310 to the E or S port of the same CLB 310 via the interconnect, the routing algorithm has to generally circumnavigate about the corners of the CLB. This tends to add delay because of signal passage through switch boxes.

The interconnect resources of architecture 300 are granulated to include so-called double-wide short-haul general interconnect segments (also identified in FIG. 3A as '2xL' lines) and longlines. Four-way switch boxes are provided in staggered fashion at the intersections of the double-wide lines. This combination of interconnect resources is schematically illustrated at 350. (Important note: the definition of 2xL as used in FIG. 3A does not apply to higher numbered figures. As will be seen, in FIG. 4 the 2xL lines shown therein each spans four CBBs.)

Note that a first horizontal bus (top of FIG. 3A) services the north side ports of relative row 0 and the south side ports of relative row −1. A second horizontal bus (middle) services the south side ports of relative row 0 and the northern ports of relative row 1. A third horizontal bus (bottom) services the southern ports of relative row 1 and the northern ports of relative row 2. Thus, at least three separate, horizontal buses are needed to service each 2-by-2 matrix of CLBs.

In similar fashion, three vertical buses are similarly called for to service the respective western and eastern ports of relative columns −1 through +2.

Switch boxes such as that at 355 are placed between the neighboring four corners of every set of four CLBs (0,0 through 1,1) in architecture 300. This layout has a tendency to push the 4 CLBs (0,0–1,1) radially apart relative to box 355. Packing density of CLBs may suffer as a result.

Also, vertical and horizontal interconnect buses cut through each respective quartet of CLBs (0,0–1,1) to cross at switch boxes such as the illustrated 355. The cutting-through of interconnect buses also has a tendency to push the 4 CLBs (0,0–1,1) radially apart from box 355, particularly if the design is scaled up to give each of the vertical and horizontal interconnect buses more lines. Such scaling-up also tends to make switch box 355 larger because it will generally have more switches for providing routing between the larger numbers of interconnect wires.

In summation it is seen that, although the symmetrically-arranged architecture 300 of FIG. 3A enables FPGA configuring software (such as 200 of FIG. 2) to more efficiently configure FPGAs because resources are symmetrically distributed in a balanced way relative to all four points of the compass (N, E, S, W), problems develop as one tries to scale the design to provide for more interconnect wires per bus.

Figure 3B:
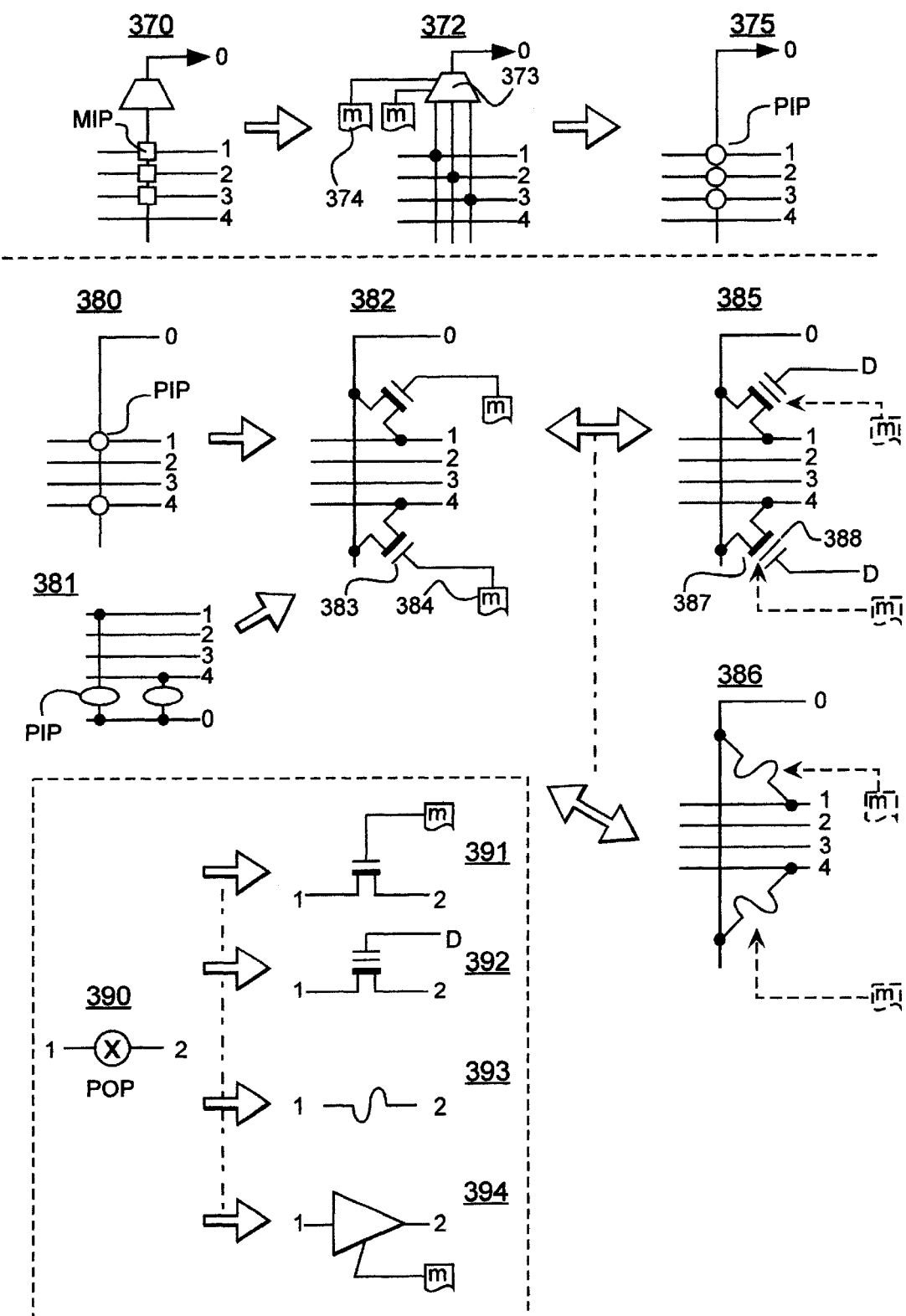
FIG. 3B provides a legend for some schematic symbols used in the present disclosure.

Before exploring details of the new direct connect architecture, the legend of FIG. 3B will be explained. Unless otherwise stated, a single line going into a multiplexer symbol such as shown at 370 of FIG. 3B represents an input bus of plural wires. Each open square box such as the MIP shown at 370 represents a point for user-configurable acquisition of a signal from the crossing line (e.g., 1, 2, 3). One implementation is shown at 372. Multiplexer 373 is controlled by configuration memory bits 374. The number of configuration memory bits 374 can vary depending on the number of MIPs (multiplexer input points) and whether selection decoding is carried out or not. One embodiment that has no selection decoding is shown at 375. Here, a PIP is placed at each MIP occupied intersection of output line 0 with crossing lines 1–4. Each of these PIPs is understood to have a single configuration memory bit controlling its state. In the active state the PIP creates a connection between the crossing lines. In the inactive state the PIP leaves an open between the illustrated crossing lines. Each of the crossing lines remains continuous however in its respective direction (x or y).

PIPs (each of which is represented by a hollow circle covering a crossing of two continuous lines) may be implemented in a variety of manners as is well known in the art. Two PIPs are shown at 380 for programmably creating a coupling between line 0 and respective ones of lines 1 and 4. In one embodiment shown at 382, pass transistors such as MOSFET 383 have their source and drain coupled to the crossing lines while the transistor gate is controlled by a configuration memory bit such as 384. In an alternate embodiment shown at 385, nonvolatilely-programmable floating gate transistors such as 387 have their source and drain coupled to the crossing lines. The charge on the floating gate 388 represents the configuration memory bit. A dynamic signal D or a static turn-on voltage may be applied to the control gate as desired. In yet another alternate embodiment shown at 386, nonvolatilely-programmable fuses or anti-fuses have their ends connected to the crossing lines. Each of examples 382, 385 and 386 demonstrates a bidirectional PIP for which signal flow between the crossing lines (e.g., 0 and 1) can move in either direction. Where desirable, PIPs can also be implemented with unidirectional signal coupling means such as AND gates, tri-state drivers (see 394), and so forth.

An alternate symbol for a PIP is constituted by a hollow ellipse covering a strapping connection between two parallel lines such as shown at 381. The schematic of 381 is an alternate way of representing the circuit of 380.

Another symbol used herein is the POP such as shown at 390. POP stands for 'Programmable Opening Point' and it is represented by a hollow circle with an 'X' inside. Unless otherwise stated, each POP is understood to have a single configuration memory bit controlling its state. In the active state the POP creates an opening between the colinear lines (1,2) entering it. In the inactive state the POP leaves closed an implied connection between the colinear lines (1,2) entering it. Possible implementations of POPs are shown at 391 through 394. In EEPROM implementation 392, the control gate signal D will be typically tied to the channel-inducing state so that the charge on the floating gate controls the POP state exclusively. The tri-state driver implementation of 394 is unidirectional of course. Many other alternatives will be apparent to those skilled in the art.

Figure 3C:
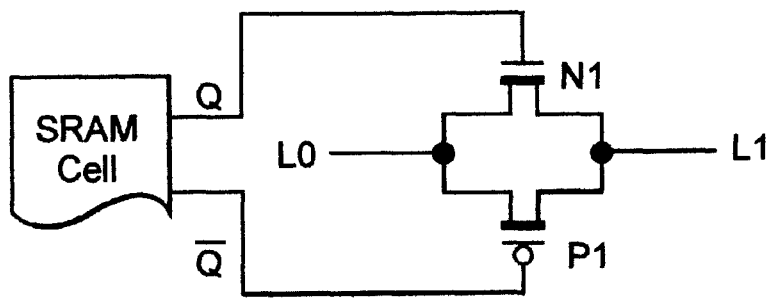
FIGS. 3C and 3D provide schematics for transmission gate type PIPs (programmable interconnect points) driven by complementary outputs of an SRAM cell.

FIG. 3C shows yet another implementation of a bidirectional PIP at 395. Lines L0 and L1 are the programmably interconnectable entities. In this particular case, the controlling memory is an SRAM cell (Static Random Access Memory) having opposed Q and Q-bar outputs. The Q output drives the gate of an N-channel MOSFET, N1 of the PIP. The Q-bar output drives the gate of an P-channel MOSFET, P__1 of the PIP. In general, transistor P__1 should be made with a larger channel width than that of transistor N__1 to compensate for the lower mobility of carriers in the P-channel of the P__1 device.

Figure 3D:
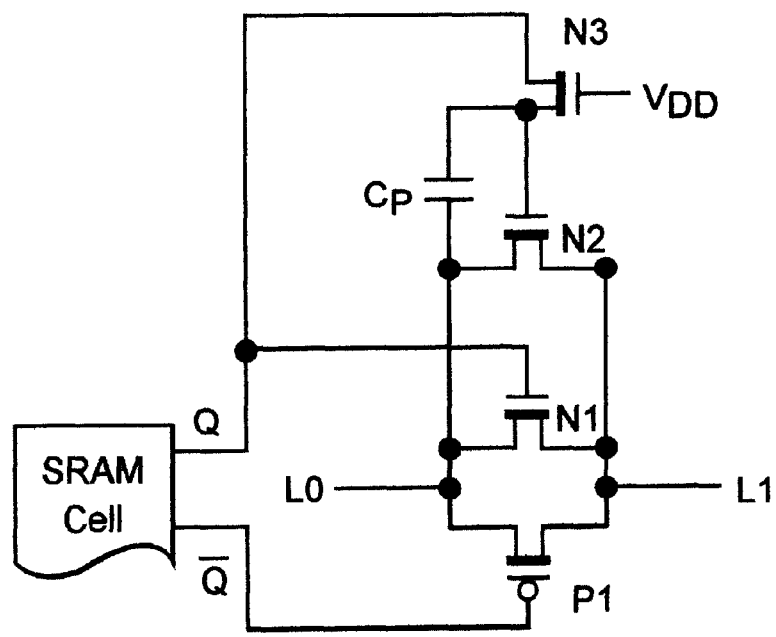

FIG. 3D shows yet another implementation of a bidirectional PIP at 398. Like reference symbols are used where appropriate for elements having like counterparts in FIG. 3C. The PIP shown at 398 may be referred to as a boot-strapped transmission gate. The parasitic gate-to-source capacitance $C_p$ of additional N-transistor N__2 may be used improve the conductivity of the PIP between L0 and L1 when Q is high (and Q-bar is at a lower voltage) and a low-to-high transition appears at L0 for transmission onto L1. Capacitance $C_p$ couples the low-to-high transition to the gate of N_2. N_3 had pre-established a slightly below threshold voltage on the gate of N_2 by virtue of N_3 having its drain coupled to the high Q, the source of N_3 being connected to the gate of N_2, and the gate of N_3 being coupled to $V_{DD}$, the high voltage rail of the device. The capacitively coupled low-to-high transition boosts the voltage of N_2's gate above threshold and turns N_2 on. This assists the normally slower P_1 device with passing the low-to-high transition from L0 to L1. As such P_1 can be made with a channel width that is comparatively smaller than the width used for the PMOS device in the PIP 395 of FIG. 3C.

Figure 4:
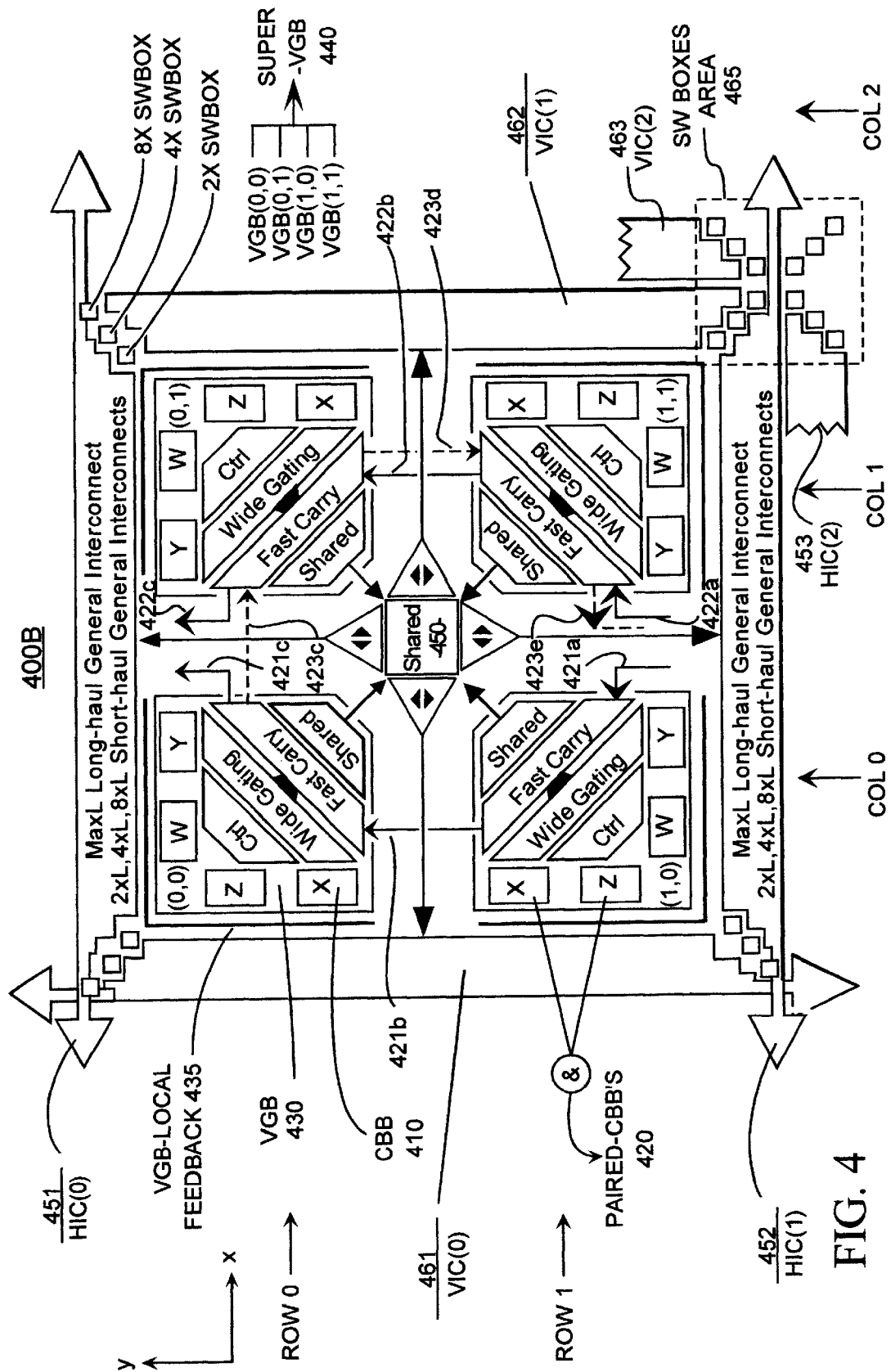
FIG. 4 illustrates more details of an L-organized super-VGB and surrounding interconnect resources of an FPGA device in accordance with the present invention.

Referring now to FIG. 4, this figure provides a mid-scopic view of a novel, tile-able structure 400B in accordance with the present invention. By 'tile-able' it is meant that structure 400B is capable of being tiled across a plane to define a tightly packed matrix. The mid-scopic view of FIG. 4 is to be understood as being taken at a magnification level that is in between those of more microscopic views (such as that of FIG. 6) and more macroscopic views (such as that of FIG. 6). The more microscopic views reveal greater levels of detail which may not be seen in more macroscopic views. The more microscopic views reveal gross architectural features which may not be seen in more microscopic views. It is to be understood that for each more macroscopic view, there can be many alternate microscopic views and that the illustration herein of a sample microscopic view does not limit the possible embodiments of the macroscopic view.

The mid-scopic view of FIG. 4 shows four VGBs brought tightly together in mirror opposition to one another. The four, so-wedged together VGBs are respectively designated as (0,0), (0,1), (1,0) and (1,1). The four VGBs are also respectively and alternatively designated herein as VGB_A, VGB_B, VGB_C, and VGB_D.

Reference number 430 points to VGB_A which is located at relative row and column position (0,0). Some VGB internal structures such as CBBs Y, W, Z, and X are visible in the mid-scopic view of FIG. 4. Further VGB internal structures such as each VGBs common controls developing (Ctrl) section, each VGBs wide-gating supporting section, each VGBs carry-chaining (Fast Carry) section, and each VGBs coupling to a shared circuit 450 of a corresponding super-structure (super-VGB) are also visible in the mid-scopic view of FIG. 4. The darkened connections between the carry-propagating and wide-gating sections indicates that some circuits may be shared in an overlapping manner between the two.

The mid-scopic view of FIG. 4 additionally shows four interconnect channels surrounding VGBs (0,0) through (1,1). The top and bottom, horizontally extending, interconnect channels (HICs) are respectively identified as 451 and 452. The left and right, vertically extending, interconnect channels (VICs) are respectively identified as 461 and 462. Two other interconnect channels that belong to other tiles are partially shown at 453 and 463 so as to better illuminate the contents of switch boxes area 465. Switch boxes area 465 contains an assortment of 2xL switch boxes, 4x switch boxes and 8x switch boxes.

As seen broadly in FIG. 4, the group of four VGBs, (0,0) through (1,1) are organized in mirror image relationship to one another relative to corresponding vertical and horizontal centerlines (not shown) of the group and even to some extent relative to diagonals (not shown) of the same group. Vertical and horizontal interconnect channels (VICs and HICs) do not cut through this mirror-wise opposed congregation of VGBs. As such, the VGBs may be wedged-together tightly.

VGB(0,1) may be generally formed by flipping a copy of VGB(0,0) horizontally. VGB(1,1) may be similarly formed by flipping a copy of VGB(0,1) vertically. VGB(1,0) may be formed by flipping a copy of VGB(1,1) horizontally, or alternatively, by flipping a copy of VGB(0,0) vertically. The mirror-wise symmetrical packing-together of the four VGBs (0,0 through 1,1) is referred to herein as a 'Super Variable Grain Block' or a super-VGB 440.

In a preferred embodiment, the mirror symmetry about the diagonals of the super-VGB is not perfect. For example, there is a Fast Carry section in each VGB that allows VGBs to be chained together to form multi-nibble adders, subtractors or counters. For a detailed description of the Fast Carry section and the difference between CBBs, see the above-identified incorporated by reference applications entitled, "CIRCUITRY TO PROVIDE FAST CARRY" and "VARIABLE GRAIN ARCHITECTURE FOR FPGA INTEGRATED CIRCUITS".

FIG. 4 also illustrates the L-shaped internal structure of each VGB (which structure includes the X, Z, W, and Y Configurable Building Blocks) neighbors an intersection of orthogonally extending interconnect resources (channels). One example of such an orthogonal intersection is the crossing of HIC(0) —which Horizontal Interconnect Channel is also referenced as 451—with VIC(0), where the latter Vertical Interconnect Channel is also referenced as 461. Other such orthogonal intersections occur at the following respective crossings: 451–462, 452–461 and 452–462.

The southeast quadrant of the 451–461 intersection is neighbored by the L-shaped internal structure of VGB(0,0). The southwest quadrant of the 451–462 intersection is neighbored by the L-shaped internal structure of VGB(0,1). The northeast quadrant of the 452–461 intersection is neighbored by the L-shaped internal structure of VGB(1,0). And the northwest quadrant of the 452–462 intersection is neighbored by the L-shaped internal structure of VGB(1,1).

The X and Z CBBs define a vertical first leg of the L-structure of their respective VGB. The W and Y CBBs define a horizontal second leg of the L-structure.

Note in FIG. 4 that the placement of W and Y is flipped when going from VGB(0,0) to VGB(0,1). The placement of W and Y is similarly flipped when going from VGB(1,0) to VGB(1,1). That places the FTY-possessing, Y CBBs of different VGBs adjacent to one another. Such adjacent Y CBBs may be folded together with the aid of a DyOE control signal.

Just as with W and Y, the X and Z CBBs are basically the same but do not have to be entirely the same. There are some input and output capabilities that X may have which Z does not, and vice versa.

For a detailed description describing generating function terms from LUTs in the X, Z, W, and Y CBBs, see the above-identified incorporated by reference application entitled, "VARIABLE GRAIN ARCHITECTURE FOR FPGA INTEGRATED CIRCUITS".

Figure 5A:
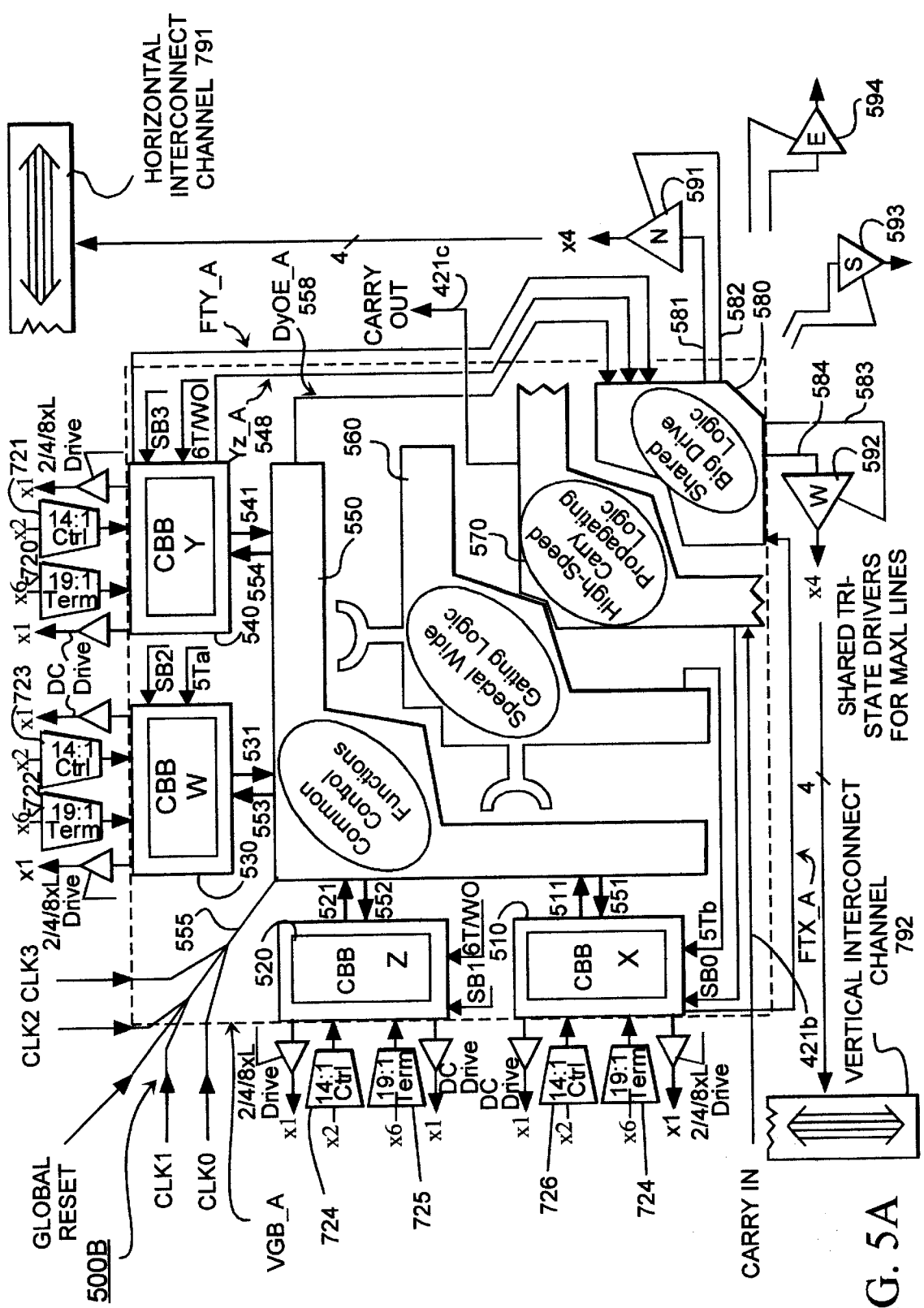
FIG. 5A shows further details of L-organization within a quadrant of an super-VGB structure such as that shown in FIG. 4.

FIG. 5A shows various details of a first Variable Grain Block 500B (also referred to as VGB_A) at a more microscopic viewing level than that of FIG. 4. It is understood that the other VGBs, namely, _B, _C and _D of each super-VGB have similar resources arranged in respective mirror-opposed symmetry with those of the illustrated VGB_A.

Figure 5B:
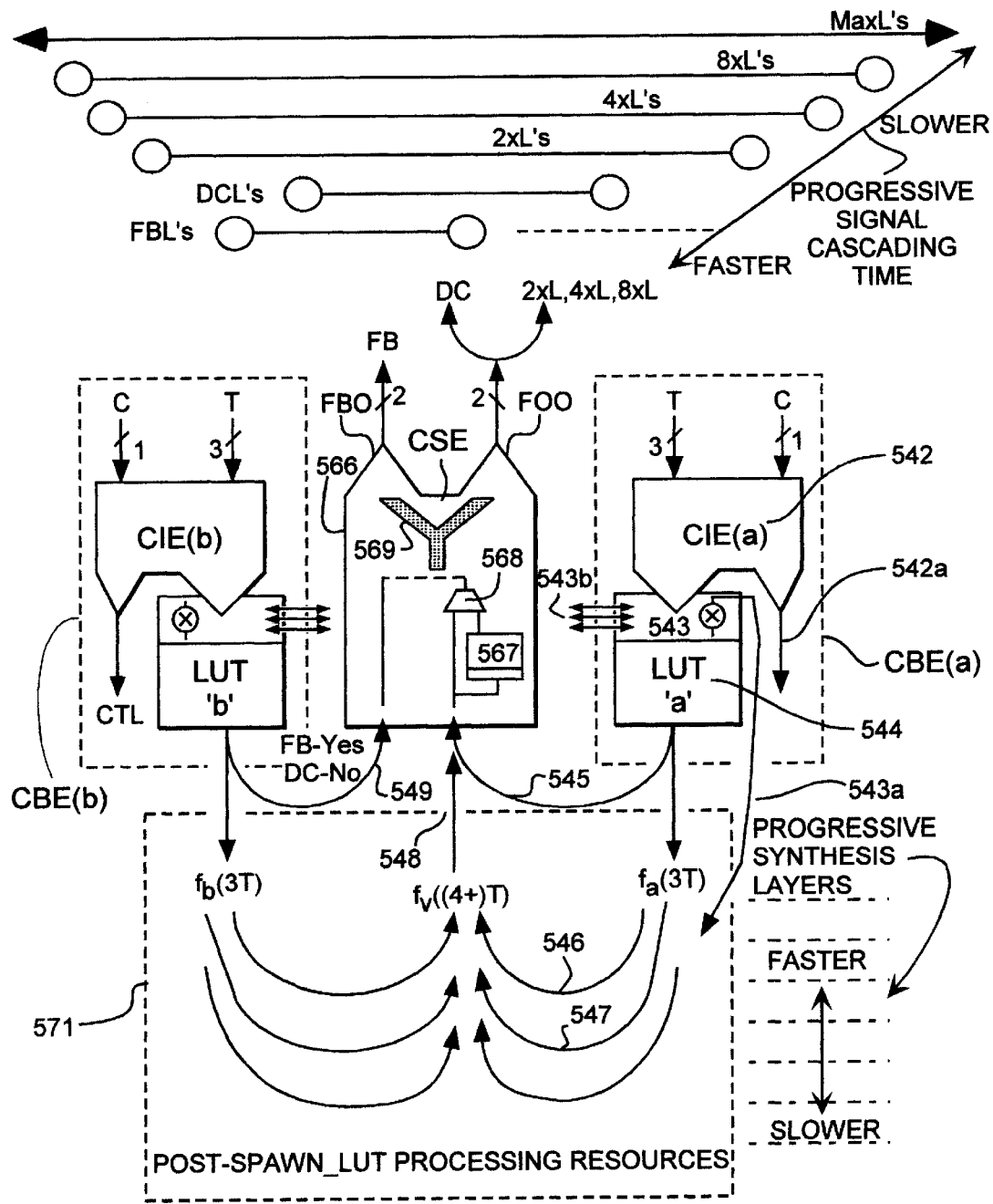
FIG. 5B illustrates selected parts of a CBB, and selected parts of its encompassed pair of CBEs, and schematics for surrounding function synthesizing structures and immediately neighboring interconnect lines.

The common controls developing section 550 collects a first plurality of control signals 511, 521, 531 and 541 from respective CBBs 510 (X), 520 (Z), 530 (W), and 540 (Y). These control signals are acquired by way of respective, controls input multiplexers (14:1 Ctrl) of the respective CBBs X,Z,W,Y. There are two such controls input multiplexers (14:1 Ctrl) dedicated to each CBB. Each pair of controls input multiplexers may be considered part of the CBB to which they are dedicated as are the dedicated direct-connect (DC) drive amplifier, the 2/4/8xL drive amplifier, and the six 19:1 terms input multiplexers (19:1 Term) of each CBB. In FIG. 5B, each CIE such as 542 is shown to be responsible for acquiring one control signal and 3 input term signals from the adjacent interconnect and/or VGB intraconnect resources.

The common controls developing section 550 of FIG. 5A further collects a second plurality of control signals 555 directly from the adjacent horizontal and vertical interconnect channels (HIC and VIC) without using the signal selecting resources of the surrounding CBBs. Signals 555 include GR, CLK0, CLK1, CLK2 and CLK3. CLK0 and CLK1 are clock signals that come directly off the vertical interconnect channel. CLK2 and CLK3 are clock signals that come directly off the horizontal interconnect channel. GR is a Global Rest signal that is universally available to all VGBs and therefore has no directional constraints. It is accordingly shown as coming in diagonally into the VGB. Such diagonal disbursement of the GR signal is not generally the best way to distribute GR. It can be alternatively carried in one or both of the vertical or horizontal interconnect channels. In one embodiment, the GR signal is carried by a dedicated GR longline provided in each of the VICs.

Common controls developing section 550 processes the collected signals 511, 521, 531, 541, and 555, and then returns corresponding common control signals back to the CBBs as indicated by return paths 551 through 554. In one embodiment, individual return paths 551–554 are replaced by a common return bus that transmits the same returned control signals to all the CBBs of the VGB 500B.

Common controls developing section 550 of VGB_A also produces a 'for-sharing' dynamic control signal 558 (DyOE_A) which signal is forwarded to the super-VGBs shared logic section 580. A portion of this shared logic section 580 is seen in FIG. 5A. It is understood that the common controls sections of the other VGBs within the subsuming super-VGB, namely VGBs: _B, _C, and _D, respectively supply additional for-sharing, dynamic control signals DyOE_B, DyOE_C and DyOE_D (not shown) to shared logic section 580.

Each CBB also directs at least one of its respective output signals to shared logic section 580. Line 548 which feeds signal Yz_A to 580 is an example. It is understood that the remaining CBBs, namely, X, Z, and W of the same VGB_A respectively feed signals Xz_A, Zz_A, and Wz_A to 580. It is further understood that the CBBs of the other VGBs within the subsuming super-VGB, namely VGBs: _B, _C, and _D, respectively supply additional signals of like designations, Xz_J, Zz_J, Wz_J, and Yz_J to their respective sections 580, where _J designates here the respective one of VGBs _B, _C, and _D.

The designation 'DyOE' for signals such as 558 is intended to imply here that such a signal performs an output enabling function and that such a signal additionally performs a dynamic selection function. The designation 'Yz_A' for signals such as 548 is intended to imply here that such a signal may be output by a tri-state amplifier (or another like device having a high-Z/high output-impedance state) such as the illustrated quartet of northern HIC-driving amplifiers 591 and/or such as the illustrated quartet of western VIC-driving amplifiers 592.

Selected ones of the Xz_J, Zz_J, Wz_J, and Yz_J signals may be routed to respective ones of input terminals (e.g., 581 and 584) of the longline driving amplifiers 591 through 594. At the same time, selected ones of the DyOE signals may be routed to respective ones of the output-enable control terminals (e.g., 582 and 583) of the longline driving amplifiers 591 through 594. Shared resources 591 through 594 may thus be used by any of the CBBs for outputting a result signal onto VGB-adjacent longlines. Although FIG. 5A only shows the connections of the respective northern quartet 591 and western quartet 592 of driving amplifiers to the north HIC and west VIC, it is understood that the southern quartet 593 and eastern quartet 594 of driving amplifiers similarly connect to a respectively adjacent, south HIC and east VIC.

FIG. 5A illustrates multiplexers 720–727 which cross with the locally-adjacent horizontal interconnect channel 791 (HIC) and locally-adjacent vertical interconnect channel 792 (VIC) in a partially populated manner. See FIG. 8.

By 'partially populating', it is meant here that, for example, HIC 791 contains more interconnect lines than are connected to by any one of multiplexers 720 and 721. Each of multiplexers 720 and 721 contains a unique subset of programmable-interconnect-points (PIPS) that form a partially-filled crossbar with HIC 791 rather than a fully-populated crossbar with HIC 791. Use of such partially-populated crossbars in place of fully-populated crossbars is known in the art. The advantage is reduced capacitive loading on the interconnect lines. The disadvantage is reduced flexibility in choosing which interconnect lines (of HIC 791) will serve as a source for an acquired control signal.

In the illustrated example, HIC 791 (the horizontal interconnect channel) contains the following resources: eight double-length (2xL) lines, four quad-length (4xL) lines, four octal-length (8xL) lines, sixteen full-length (MaxL) lines, sixteen direct-connect (DC) lines, eight feedback (FB) lines and two dedicated clock (CLK) lines.

Figure 8:
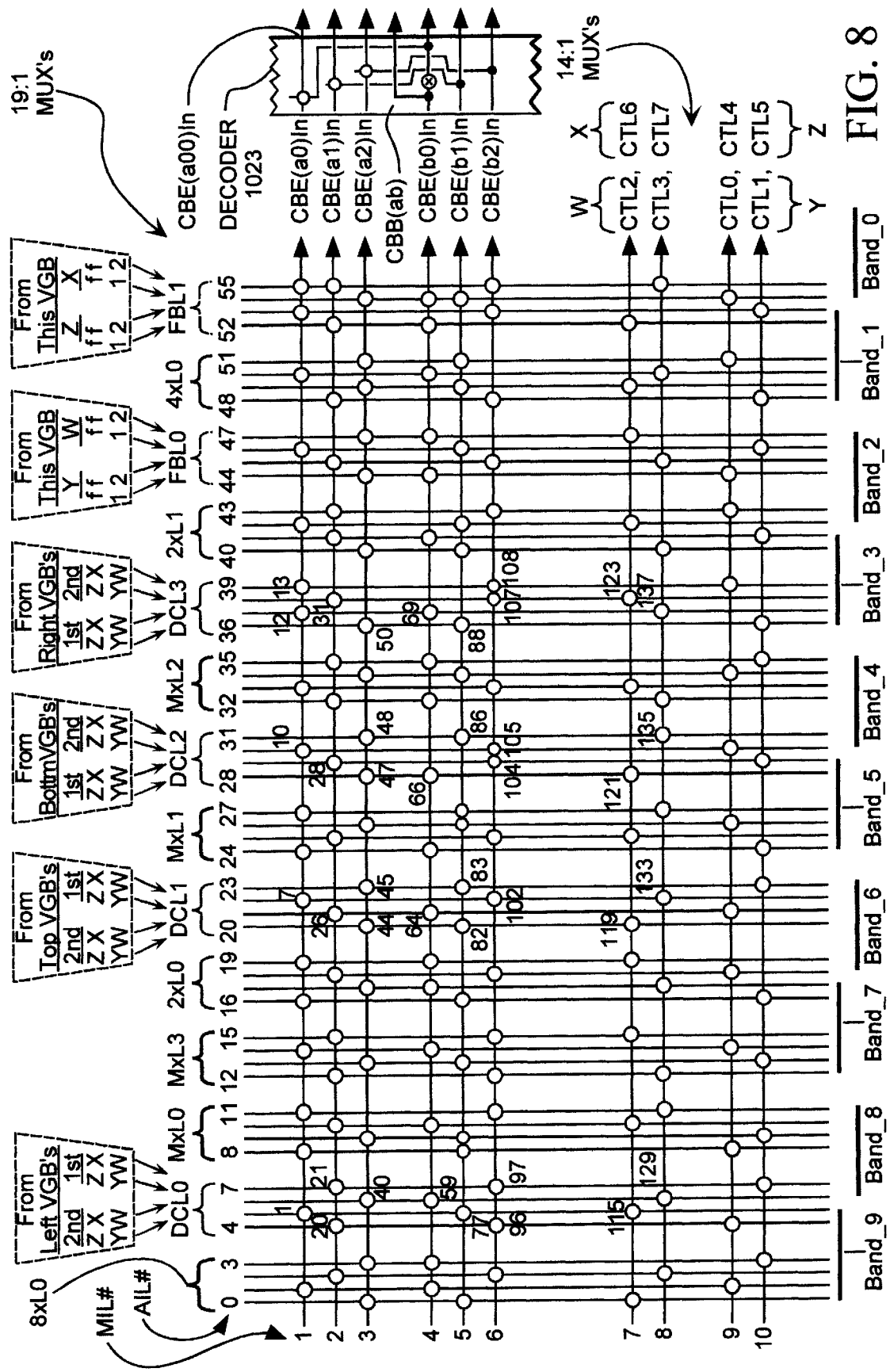
FIG. 8 illustrates a partial-populating scheme for the input-term and control-signal acquiring multiplexers of the respective X, Z, W, Y Configurable Building Blocks.

FIG. 8 illustrates one partial-populating scheme in accordance with the invention for the 56 lines of each HIC or VIC. It is within the contemplation of the invention to use other partial populating patterns. It is also within the contemplation of the invention to have overlap between acquirable line sets by using control acquiring multiplexers with more MIPs if desired, but of course that also increases space utilization within the integrated circuit.

Returning to FIG. 5B, there are further consequences that follow from the provision of function spawning resources (e.g., CBEs) at the periphery of the L-organized section of each VGB and from the progressive synthesis of more complex functions as one moves deeper into the VGB. More specifically, the signal propagation times that are associated with the steps of: (a) acquiring input-term signals from a first subset of interconnect lines, (b) passing the acquired signals through one or more LUTs, and (c) returning LUT-derived result signals to other interconnect lines, can vary depending on how much routing or other processing occurs before an input term is delivered to an LUT and how much further routing or other processing occurs after the LUT produces its result.

In FIG. 5B, the delay of input-term acquisition for a first CBE(a) is represented by CIE section 542. The delay of pre-LUT decoding is represented by section 543. (Section 543 includes a POP for blocking an intercepted input term signal 543a and forwarding that intercepted signal 543a to deeper synthesis layers. Section 543 further includes an inputs sharing means 543 which allows sharing of acquired input term signals between CBES. These items are shown in FIG. 8.)

The delay of passing acquired input term signals through the respective LUT 'a' is represented by section 544 of FIG. 5B. Path 545 represents the quickest return path for directing the LUTs immediate-result signal $f_a(3T)$ back to a corresponding Configurable Sequential Element (CSE) 566.

Within the CSE 566, the signal carried by path 545 can then flow through a CSE-internal flip flop 567 or it can bypass the flip flop by way of multiplexer 568. The output of multiplexer 568 splits as indicated by Y-structure 569 for output to two feedback lines (FBLS) or for feedout (FOO) to a direct connect (DC) line or for feedout to assorted other interconnect resources (the 2xL, 4xL and 8xL lines).

FIG. 5B shows the immediately-adjacent interconnect and VGB-intraconnect resources arranged hierarchically according to relative transmission speeds. The generally fastest and/or shortest types of lines are drawn closest to the output ports (FBO/FOO) of the Configurable Sequential Element (CSE) while the generally slower and/or longer types of lines are drawn progressively further away. It is to be understood that signal transmission speed can be a function of drive power as well as line loading. Thus, the mere fact that a particular interconnect line is shorter than another does not guarantee that the first will allow signals to get to their intended destinations faster than the second.

As seen in FIG. 5B, the VGBs local feedback lines (FBLs) typically define the shortest and least capacitively loaded interconnect lines by way of which a result signal derived from one of the CBEs and/or CBBs can be cascaded to another CBE and/or CBB of the same Variable Grain Block. Because they generally have the lowest capacitive loading, the VGBs local feedback lines (FBLs) may be driven by a low fan-out output port of the CSE. This output port is designated as FBO. If speed is important, an LUT result signal may be cascaded via path 545 to a next such LUT (in the same VGB) by way of the FBO output port and by way of the corresponding, local feedback lines (FBLs) of the VGB.

The so-called direct connect lines (DCLs) are generally longer and/or more capacitively loaded than the FBLs. At the same time, the DCLs are generally shorter and/or less capacitively loaded than other interconnect lines such as the illustrated 2xL lines, 4xL lines and 8xL lines. Because of this, a separate, appropriately-powered, line driving amplifier (see DC Drive in FIG. 5A) is provided within the feedout output port (FOO) for driving the DCLs. If the LUT result signal of short path 545 has to reach a point outside the local VGB but within reach of an immediately adjacent DCL, such forwarding of the signal via the DCLs is preferred when speed is of the essence. In one embodiment, each DC Drive amplifier is tuned so that CBE to CBE delay is essentially the same when routed either by way of the feedback lines (FBLs) or by way of the direct connect lines (DCLs).

The so-called bidirectional general interconnect lines in the 2xL through 8xL categories are generally shorter and/or less capacitively loaded than the MaxL lines. Because of this, a separate, appropriately-powered, line drive amplifier (see 2/4/8xL Drive in FIG. 5A) is provided within the feedout output port (FOO) for driving the 2xL through 8xL categories of immediately adjacent lines. Each 2/4/8xL Drive amplifier is differently powered than a corresponding one of the DC Drive amplifiers.

The FPGAs maximum-length longlines or MaxL lines are the longest, and therefor generally most capacitively loaded of the interconnect lines. Because of this, separate, appropriately-powered, line drive amplifiers (see 591–594 in FIG. 5A) are provided within the shared core of the super-VGB for driving the MaxL lines category of immediately adjacent lines. Each MaxL Drive amplifier is generally more powerful than a corresponding one of the 2/4/8xL Drive amplifiers.

FIG. 5B also shows the relative delay time of the progressive function synthesizing layers within the VGB. As indicated, the fastest turn around time is generally realized by routing the LUTs immediate-result signal $f_a(3T)$ immediately to the CSE 566 via path 545. If the LUTs immediate-result signal $f_a(3T)$ is to be further compounded with result signals derived from other LUTs in a post-LUT processing section 571, then the return of the correspondingly synthesized result signal, $f_x((4+)T)$ by way of path 548 can take longer.

Signal $f_x((4+)T)$ represents a progressively synthesized signal. The delay associated with the first level of post-LUT synthesis is represented by 546. The greater delay associated with more progressive levels of synthesis is represented by 547. The $f_x((4+)T)$ signal returned by path 548 can then flow through the CSEs flip flop 567 or bypass the flip flop by way of multiplexer 568 to reach output fanout section 569. Output fanout section 569 then forwards the synthesis result signal (545–547,549) for output from the CBB. The choice of subsequent forwarding lines (FBLs, DCLs, 2xL's, 4xL's, 8xL's, or MaxL's) that are used to further carry the signal forwarded by fanout section 569 is dependent on the progressive time delay factors described above for the $f_a(3T)$ signal.

In the particular embodiment of FIG. 5B, the 'b' CBE is not fully equivalent to the 'a' CBE. The fastest return path 549 of CBE(b) bypasses elements 567 and 568, goes directly to output structure 569. Signals returned by path 549 of this embodiment cannot feedout to a direct connect (DC) line although they can connect to an FB line or to one of the 2xL through 8xL lines.

It is within the contemplation of the invention however to alternatively have an arrangement wherein CBE(a) and CBE(b) do have identical access to all the output sequencing resources of the Configurable Sequential Element (566). In such alternative embodiments, a second flip flop such as 567 and a second bypass multiplexer such as 568 are provided for servicing CBE(b). The trade-off, of course is increased area utilization within the integrated circuit, which could lead to larger sized dies, and possibly lower yields in mass production.

Although not shown in FIG. 5B, signals returned by either of the 'a' or 'b' LUTs on respective paths 545, 549 or the $f_x((4+)T)$ signal of path 548 can be fed to the longest length interconnect lines (MaxL lines) via the super-VGB shared drives.

Figure 6:
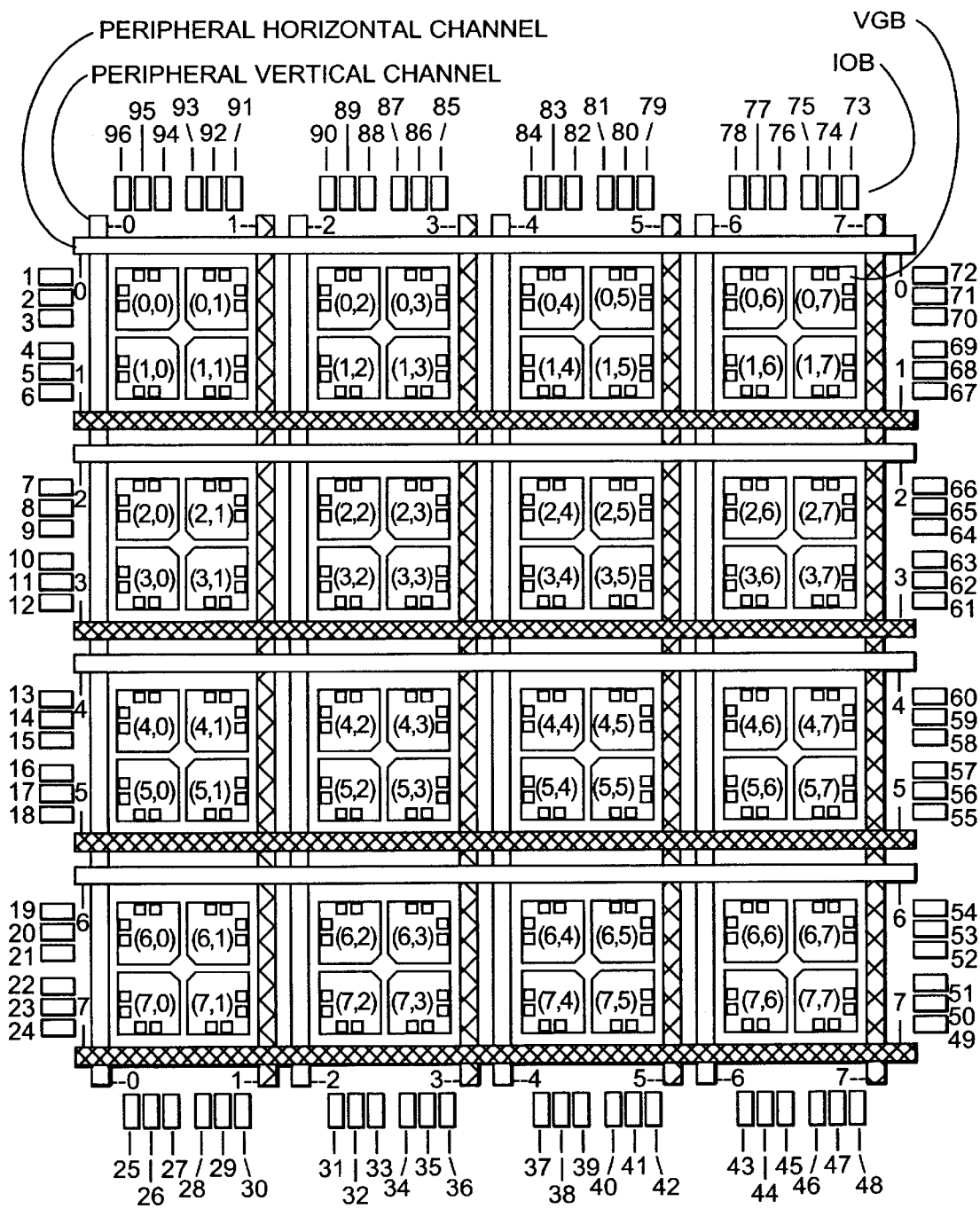
FIG. 6 illustrates a first FPGA in accordance with the invention having an 8×8 matrix of VGBs (a 4×4 tiled matrix of super-VGBs and surrounding interconnect resources)

FIG. 6 shows a macroscopic view of an FPGA device 800 in accordance with the invention. The illustrated structure is formed on a monolithic integrated circuit. In one embodiment having a matrix of 20-by-20 VGBs, the integrated circuit is formed on a semiconductor die having an area of about 120,000 mils$^2$ or less. The integrated circuit includes at least five metal layers for forming interconnect. The direct connect lines and longlines of the interconnect are preferably implemented entirely by the metal layers so as to provide for low resistance pathways and thus relatively small RC time constants on such interconnect lines. Logic-implementing transistors of the integrated circuit have channel lengths of 0.35 microns or less. Amplifier output transistors and transistors used for interfacing the device to external signals may be larger, however.

FPGA device 800 is defined as a regular matrix. In the illustrated embodiment there are four super-VGBs in each row and also four super-VGBs in each column. Each super-VGB contains four VGBs. Each super-VGB is bounded by two horizontal and two vertical interconnect channels (HICs and VICs). This combination of super-VGB and surrounding interconnect resources is tiled as seen. The tiling provides adjacent pairs of interconnect channels within the core of the device 800. Peripheral channels (HIC0, HIC7, VIC0, VIC7) are not paired. Switch matrix boxes (not shown, see FIG. 6) are formed at the intersections at the respective vertical and horizontal interconnect channels. In one embodiment, the switch matrix boxes use the bootstrapped transmission gate circuit of FIG. 3D for forming configurable connections through such switch boxes.

At the periphery of the device 800, there are three input/output blocks (IOBs) for each row of VGBs and for each column of VGBs. The IOBs in the illustrated embodiment are shown numbered from 1 to 96. The VGBs are numbered according to their column and row positions. The centrally-shared resources of each super-VGB are represented by the diamond-shaped hollow at the center of each super-VGB. Longline driving amplifiers are understood to occupy these diamond-shaped hollows to have their respective outputs coupling vertically and horizontally to the adjacent HICs and VICs of their respective super-VGBs.

Each super-VGB in FIG. 6 has four CBBs along each of its four sides. The four CBBs of each such interconnect-adjacent side of the super-VGBs can store a corresponding four bits of data in their respective CSEs so as to define a nibble of data for output onto the adjacent interconnect lines. Each VGB contains four CBBs which can acquire and process a nibble's worth of data. One of these processes is nibble-wide addition within each VGB. Another of these processes is implementation of a 4:1 multiplexer. The presentation of CBBs in groups of same number (e.g., 4 per side of a super-VGB and 4 within each VGB) provides for a balanced handling of multi-bit data packets along rows and columns of the FPGA matrix. For example, nibbles may be processed in parallel by one column of CBBs and the results may be efficiently transferred in parallel to an adjacent column of CBBs for further processing. One more specific example is formation of a barrel-shifter in one or more columns of CBBs (using implemented 4:1 multiplexers) followed by formation of an adder with self feedback in an adjacent column of VGBs. The combination can define an efficiently packed, binary multiplier. The horizontal interconnect can carry multiplication results in parallel to further, column oriented circuits as appropriate by way of a diversified set of different-length interconnect lines.

Figure 7:
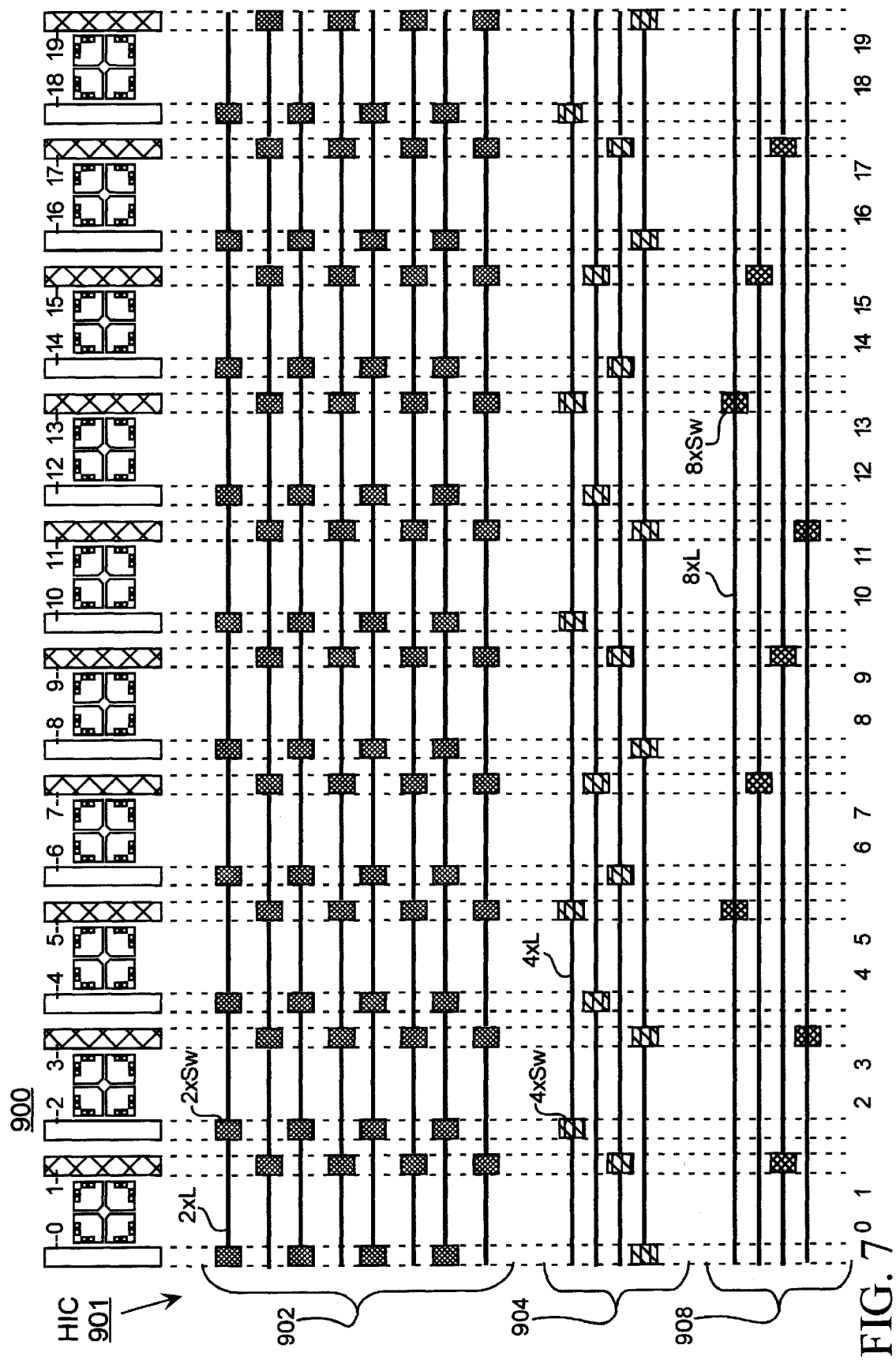
FIG. 7 shows a distribution of different-length horizontal interconnect lines (2xL, 4xL, 8xL) and associated switch boxes as aligned relative to vertical interconnect channels in a 20×20 matrix of VGBs (10×10 super-VGBs)

FIG. 7 shows a distribution 900 of different-length horizontal interconnect lines (2xL, 4xL, 8xL) and associated switch boxes of a single horizontal interconnect channel (HIC) 901, as aligned relative to vertical interconnect channels in an FPGA of the invention. This particular FPGA has a 20×20 matrix of VGBs (10×10 super-VGBs). Core channels 1 through 18 are laid out as adjacent pairs of odd and even channels. Peripheral channels 0 and 19 run alone along side IOBs (See FIG. 6).

HIC 901 is understood to have 58 lines. However, only the eight 2xL lines, the four 4xL lines, and the four 8xL lines of HIC 901 are shown in FIG. 7.

Group 902 represents the 2xL lines of HIC 901 and their corresponding switch boxes. All 2xL lines span the distance of essentially two adjacent VGBs. Most 2xL lines terminate at both ends into corresponding 2x switch boxes (2xSw's). The terminating 2xSw boxes are either both in even-numbered channels or both in odd-numbered channels. Exceptions occur at the periphery where either an odd or even-numbered channel is nonexistent. As seen in embodiment 900, interconnections can be made via switch boxes from the 2xL lines of HIC 900 to any of the odd and even-numbered vertical interconnect channels (VICs) 0–19. 2xL lines may be used by adjacent quadruplets of CBBs for carrying out a through-the-AIL strapping function which is described below.

Group 904 represents the 4xL lines of HIC 901 and their corresponding switch boxes. Most 4xL lines span the distance of essentially four, linearly-adjacent VGBs and terminate at both ends into corresponding 4x switch boxes (4xSw's). The terminating 4xSw boxes are either both in even-numbered channels or both in odd-numbered channels. As seen in embodiment 900, interconnections can be made via switch boxes from the 4xL lines of HIC 900 to any of the odd and even-numbered vertical interconnect channels (VICs) 0–19.

Group 908 represents the 8xL lines of HIC 901 and their corresponding switch boxes. Most 8xL lines (7 out of 12) span the distance of essentially eight, linearly-adjacent VGBs. A fair number of other 8xL lines (5 out of 12) span distances less than that of eight, linearly-adjacent VGBs. Each 8xL line terminates at least one end into a corresponding 8x switch box (8xSw). The terminating 8xSw boxes are available in this embodiment only in the core odd-numbered channels (1, 3, 5, 7, 9, 11, 13, 15 and 17). Thus, in embodiment 900, interconnections can be made via switch boxes from the 8xL lines of HIC 900 to any of the nonperipheral, odd-numbered vertical interconnect channels (VICs).

Each VGB can be viewed as corresponding to 2 bits of produced data when considered one side (2 CBBs) at a time. Under this view, the 2xL lines can each supply a control or input term signal for producing nibble-wide (4-bits wide) result signals. Further under this view, the 4xL lines can each supply a control or input term signal for producing byte-wide (8-bits wide) result signals. And yet further under this view, the 8xL lines can each supply a control or input term signal for producing word-wide (16-bits wide) result signals.

Each VGB can be alternatively viewed as corresponding to 4 bits (one nibble) of produced data when considered two sides (4 CBBs) at a time. Under this alternate view, the 2xL lines can each supply a control or input term signal for producing byte-wide result signals. Further under this alternate view, the 4xL lines can each supply a control or input term signal for producing word-wide result signals. And yet further under this alternate view, the 8xL lines can each supply a control or input term signal for producing doubleword-wide (32-bits wide) result signals.

FIG. 8 illustrates a partial-populating scheme for the input-term and control-signal acquiring multiplexers of the respective X, Z, W, and Y Configurable Building Blocks of one embodiment in accordance with the invention. The adjacent interconnect lines (AIL) are respectively numbered as 0 through 55. The two dedicated CLK lines of each interconnect channel and the additional GR line in each VIC are not included in this count. In one embodiment, AIL# 0–55 represent interconnect lines in the most immediately adjacent channel for each of CBBs X, Z, W, and Y.

In an alternate embodiment, AIL# 0–55 represent interconnect lines in the most immediately adjacent channel for each of CBBs X and Y while for the other CBBs, Z and W, the AIL# 0–55 of FIG. 8 represent the interconnect lines of the next adjacent channel. The exception is at the periphery of the matrix (see FIG. 6) where there is no next adjacent channel, in which case AIL# 0–55 represent interconnect lines in the most immediately adjacent channel also for CBBs Z and W. This alternate configuration allows each VGB to acquire input term signals and control signals from both the even-numbered and odd-numbered interconnect channels that surround it. It is of course within the contemplation of the invention to have other configurations, such as for example wherein the CBBs that reach the most immediately adjacent channel are X and W rather than X and Y; and such as wherein the CBBs that reach the next adjacent channel are X and Y rather than Z and W.

Multiplexer input lines (MIL) are numbered in FIG. 8 as 1 through 10. MIL# 1–3 correspond to the three 19:1 input term acquiring multiplexers of a first CBE (e.g., 'a') in each of the X, Z, W, Y CBBs. MIL# 4–6 correspond to the three 19:1 input term acquiring multiplexers of a second CBE (e.g., 'b') in each of the X, Z, W, Y CBBs. MIL# 7–8 correspond to the two 14:1 control signal acquiring multiplexers of each of the W and X CBBs. MIL# 9–10 correspond to the two 14:1 control signal acquiring multiplexers of each of the Y and Z CBBs.

The illustrated partially-populated distribution of PIPs over the intersections of AIL# 0–55 and MIL# 1–10 should be self-explanatory in view of the legend shown in FIG. 3B.

AIL# 0–3 represent the four 8xL lines in each interconnect channel. AIL# 4–7 represent a first group (DCL0) of four of the 16 direct connect lines in each interconnect channel. The remaining DCLs are represented by the 20–23 (DCL1), 28–31 (DCL2) and 36–39 (DCL3) sets of AIL. AIL# 8–11 represent a first group (MxL0) of four of the 16 MaxL lines in each interconnect channel. The remaining MxLs are represented by the 24–27 (MxL1), 32–35 (MxL2) and 12–15 (MxL3) sets of AIL.

AIL# 16–19 represent a first group (2xL0) of four of the 8 2xL lines in each interconnect channel. The other four 2xL lines are represented by the 40–43 (2xL1) group. AIL# 44–47 represent a first group (FBL0) of four of the 8 feedback lines in each interconnect channel. The other four feedback lines are represented by the 52–55 (FBL1) group. AIL# 48–51 represent the four 4xL lines in each interconnect channel.

Signal sources for the direct connect lines and the feedback lines are indicated respectively above corresponding AIL groups. In group DCL0 for example, AIL 7 is driven by either the X or the W DC driver of the neighboring VGB that is immediately to the left of the current VGB. AIL 6 is driven by either the Z or the Y DC driver of the neighboring VGB that is immediately to the left of the current VGB. AIL 5 is driven by either the X or the W DC driver of the next-adjacent VGB that is to the left of the current VGB. AIL 4 is driven by either the Z or the Y DC driver of the next-adjacent VGB that is to the left of the current VGB.

Each of MIL# 0–6 is loaded by essentially the same number of 19 PIPs that form the corresponding 19:1 multiplexer. As such, there is roughly a same amount of signal propagation delay in going through each such multiplexer to the corresponding LUT. There is some additional delay or loading from PIPs and POPs that form the intervening decoder layer. A representative part of that layer is shown at 1023.

Note that for each of AIL# 0–55 there are at least two PIP connections to two different MIL, one of which is placed in the MIL# 1–3 set and another of which is in general, differently placed in the MIL# 4–6 set. In other words, are at least two possible MIL which can be used to acquire an input term signal moving along a given AIL and feed the acquired signal to one or the other of two possible LUTs ('a' or 'b'). Thus if one of the two 19:1 multiplexers that can couple to a given AIL is already consumed, or the corresponding LUT is already consumed, the FPGA configuring software has the possibility of alternatively using the other multiplexer and/or LUT for implementing a circuit chunk that requires a particular input term signal moving along the given AIL.

Each of AIL# 54 and 55 have at least three PIP connections to a respective three different MIL. Feedback signals from the f1 and f2 lines of the X CSE therefore have 3 possible ways of being transmitted into the respective MIL# 1–6 inputs of any one of the X, Z, W, and Y Configurable Building Blocks of the same VGB. These MIL# 1–6 inputs are alternatively named as CBE(a0)In, CBE(a1)In, CBE(a2)In, CBE(b0)In, CBE(b1)In, and CBE(b2)In in FIG. 8. Note that CBE(b0)In is different from the others in that a POP (Programmable Opening Point) is provided for it in decoder section 1023. CBB(ab) represents an intercepted signal that may be used for compounding or folding together the 'a' and 'b' parts of the corresponding CBB.

Note also that in the case where the PIPs of the signal-acquiring multiplexers of FIG. 8 are of the bidirectional type (e.g., FIGS. 3C or 3D), simultaneous activation of two or more PIPs on a same AIL (during FPGA configuration time), creates a bidirectional strapping interconnection between the corresponding MIL of those PIPs. Such a use of the PIPs of the signal-acquiring multiplexers of FIG. 8 falls herein under the description, 'through-the-AIL strapping'. Not every embodiment however can use this kind of through-the-AIL strapping in a generic way to strap from one MIL to a next a signal that had been generically sourced onto a line other than the strapping AIL. One of the requirements is that the PIPs in the signal-acquiring multiplexers of FIG. 8 be conductive enough (large enough) to get signals through within the systemspecified time. If these PIPS are too small, such use of through-the-AIL strapping should be avoided. On the other hand, if the signal that is being strapped onto the two MIL was sourced onto the strapping AIL from an appropriate AIL drive amplifier, the size of the PIPs of the signal-acquiring multiplexers of FIG. 8 should not be an impediment to carrying on through-the-AIL strapping because the drive amplifier is designed to drive the signal in timely fashion through those loads.

Note further that in the case where the PIPs of the signal-acquiring multiplexers of FIG. 8 are again of the bidirectional type (e.g., FIGS. 3C or 3D), simultaneous activation during FPGA configuration time of two or more PIPs on a same MIL (multiplexer input line), can create a bidirectional strapping interconnection between the corresponding AIL of those PIPs. Such a use of the PIPs of the signal-acquiring multiplexers of FIG. 8 is referred to herein as 'through-the-MIL strapping'. The latter function may be particularly useful when a signal is being acquired via a direct connect line (DCL) from another VGB and it is desirable to simultaneously couple such a DCL-carried signal to another kind of AIL within the interconnect channel, say to a vertical 2xL line when the direct connect source was a horizontally displaced VGB. Again, not every embodiment can use through-the-MIL strapping. If the PIPs of the signal-acquiring multiplexers are too small, and the DC drive amplifiers are not powerful enough to drive the added load, the through-the-MIL strapping function should be avoided and other means should be used for routing signals.

Figure 9:
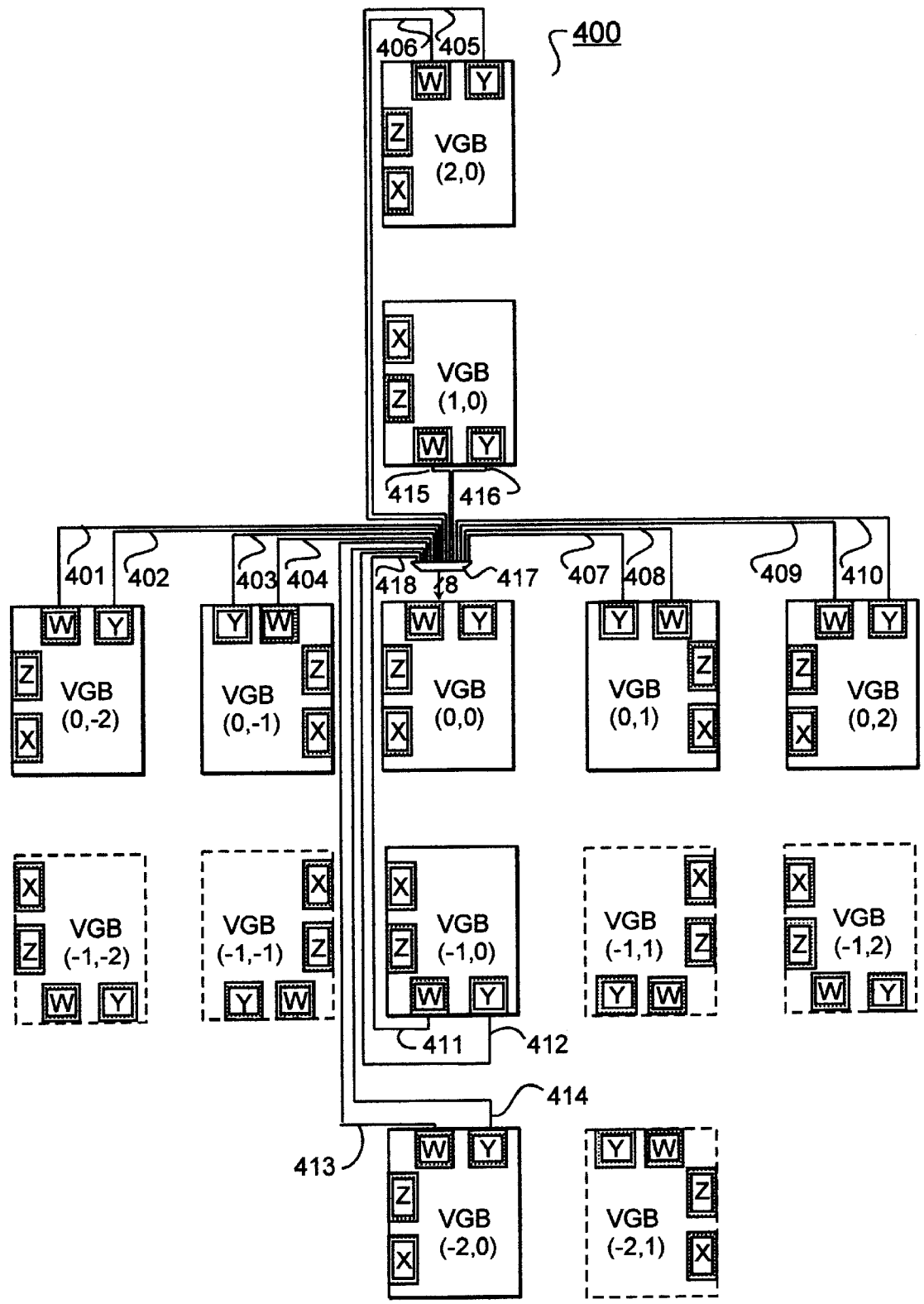
FIG. 9 illustrates direct connections between VGBs, and in particular, direct connections between W and Y CBB outputs in neighboring VGBs and center VGB inputs.
Figure 10:
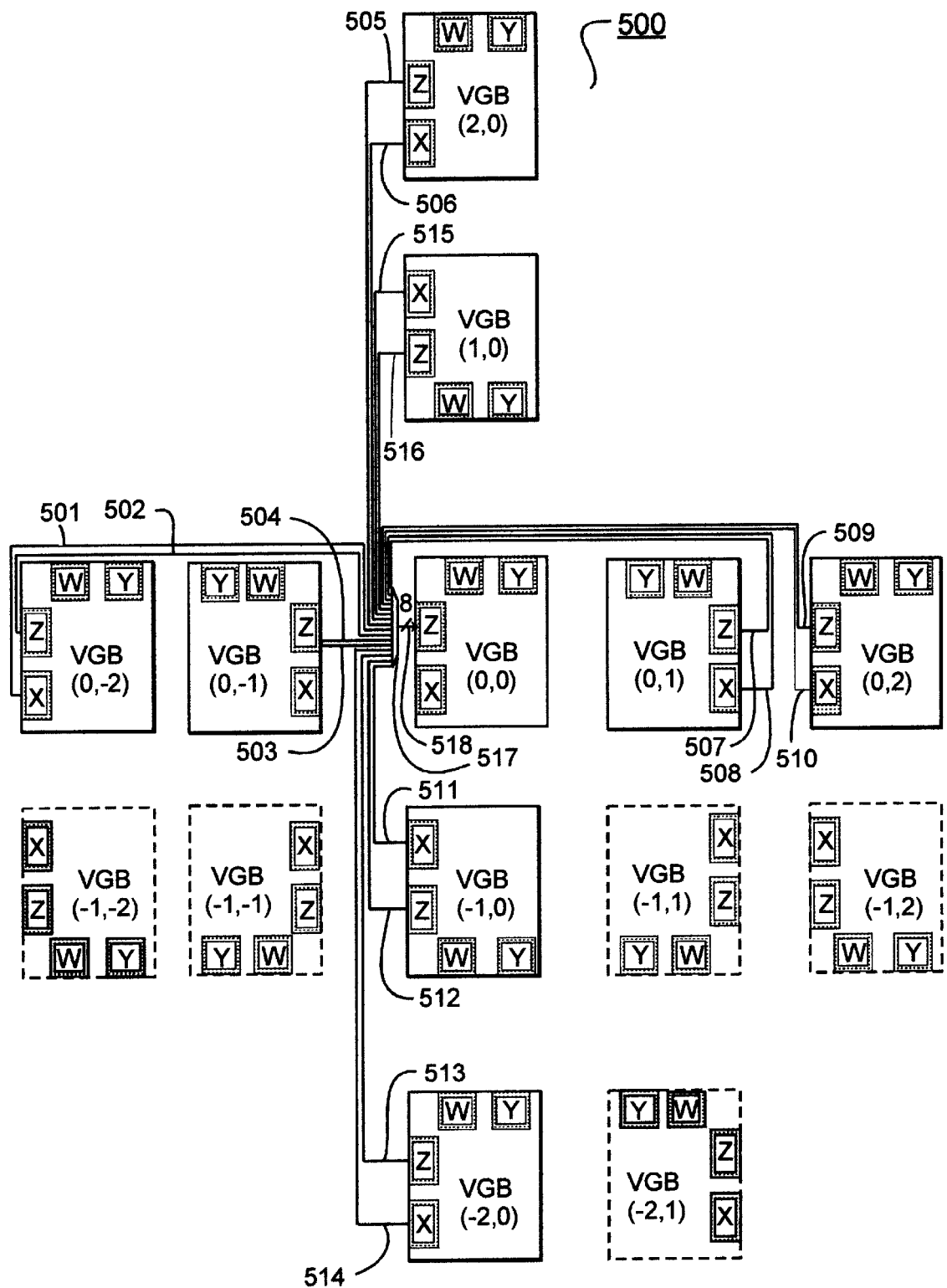
FIG. 10 illustrates direct connections between VGBS, and in particular, direct connections between Z and X CBB outputs in neighboring VGBs and center VGB inputs.

FIGS. 9 and 10 illustrate a direct connect architecture between VGBs according to the present invention. In particular, FIG. 9 illustrates a direct connect architecture 400 between nine VGBs. Direct connect architecture 400 is repeated throughout a FPGA, such as the FPGA illustrated in FIG. 6, according to the present invention.

According to one embodiment, each VGB has a CBB Z, X, W and Y as illustrated in FIG. 5A. Further, each CBB includes a CSE and CBEs as illustrated in FIG. 5B. As described above, CBBs may be positioned in a symmetric L-shaped organization. CBBs W and Y are positioned on the top (N-North) or bottom (S-South) sides of the VGBs. CBBs Z and X are positioned on the left (W-West) or right (E-East) sides of the VGBs. CBBs W and Y are considered a first leg of the L-shaped organization where CBBs X and Z are considered a second leg of the L-shaped organization.

VGB(2,0), VGB(1,0), VGB(0,0), VGB(-1,0), VGB(-2,0) are arranged consecutively in a first column. VGB(0,-2), VGB(0,-1), VGB(0,0), VGB(0,1) and VGB(0,2) are arranged consecutively in a first row, wherein VGB(0,0) is a center VGB. The group of VGBs: VGB(2,0), VGB(1,0), VGB(0,0), VGB(-1,0), VGB(-2,0), VGB(0,-2), VGB(0,-1), VGB(0,1), and VGB(0,2) are positioned in the form of a cross-hair. VGB(0,1), VGB(0,2), VGB(-1,0), VGB(-2,0), VGB(0,-1), VGB(0,-2), VGB(1,0), and VGB(2,0) are considered neighboring VGBs of the center VGB(0,0). VGB(0,1), VGB(-1,0), VGB(0,-1) and VGB(1,0) are considered adjacent VGBs to center VGB(0,0). VGB(0,2), VGB(-2,0), VGB(0,-2) and VGB(2,0) are considered next-adjacent VGBs to center VGB(0,0).

Direct connections between VGB(0,0) and the neighboring VGBs are illustrated by direct connect lines 401–416. Direct connect lines from the neighboring VGBs connect to multiplexer 417. In an embodiment, multiplexer 417 includes both input-term acquiring multiplexer 722 and control-signal acquiring multiplexer 723 illustrated in FIG. 5A. In an embodiment, multiplexer 417 comprises a set of PIPs as illustrated in FIG. 8. These PIPs may be selectively configured to connect specific direct connect lines to particular CBB inputs. The 6 term inputs (CBE(a0)In, CBE(a1)In, CBE(a2)In, CBE(b0)In, CBE(b1)In, CBE(b2)In) and 2 control inputs (CTL2, CTL3) of CBB W in VGB(0,0) are connected by lines 418 to multiplexer 417. In an embodiment, lines 418 include MIL# 1–8 as illustrated in FIG. 8.

In particular, FIG. 9 illustrates direct connections from the neighboring VGBs to a CBB W in VGB(0,0). Direct connect output signals generated from CBB W in VGB(0,-2) are transferred on direct connect line 401 to multiplexer 417. A direct connect drive amplifier, as illustrated in FIG. 5A, from a CSE in CBB W is used to output the direct connect output signal. An output signal may likewise be output from CBB Y in VGB(0,-2) on direct connect line 402 to multiplexer 417. Outputs from CBB Y and CBB W in VGB(0,-1) are generated on direct connect lines 403 and 404, respectively. Direct connect lines 403 and 404 are likewise connected to multiplexer 417.

Similarly, output signals from VGB(2,0) may be generated from CBB W and CBB Y on direct connect lines 406 and 405, respectively, to multiplexer 417. These signals then are transferred from multiplexer 417 to lines 418, which are connected to CBB W of VGB(0,0). Output signals generated from VGB(1,0) may be generated from CBB W and CBB Y on direct connect lines 415 and 416, respectively, to multiplexer 417. Multiplexer 417 then may transfer the output signals on lines 418 to CBB W of VGB(0,0).

VGB(0,1) and VGB(0,2), like VGB(0,-2) and VGB(0,-1) have similar direct connections. Output signals generated from CBB W in VGB(0,1) are transferred on direct connect line 408 to multiplexer 417. Multiplexer 417 then outputs a signal on lines 418 to CBB W in VGB(0,0). An output signal may likewise be output from CBB Y in VGB(0,1) on direct connect line 407 to multiplexer 417. Outputs from CBB Y and CBB W in VGB(0,2) are generated on direct connect lines 410 and 409, respectively. Direct connect lines 409 and 410 are then connected to multiplexer 417, which outputs selected signals on lines 418 to CBB W in VGB(0,0).

Output signals from VGB(-1,0) are generated from CBB W and CBB Y on direct connect lines 411 and 412, respectively, to multiplexer 417. These signals then may be selectively transferred from multiplexer 417 to lines 418, which are connected to CBB W inputs in VGB(0,0). Output signals generated from VGB(-2,0) are generated from CBB W and CBB Y on direct connect lines 413 and 414, respectively, to multiplexer 417. Multiplexer 417 then selectively transfers the output signals on lines 418 to CBB W inputs in VGB(0,0).

In an embodiment, a similar direct connect architecture for inputting signals into CBB Y of VGB(0,0) from the CBBs Y and W in neighboring VGBs may be used in addition to the direct connect architecture 400 illustrated in FIG. 9.

FIG. 10 illustrates a direct connect architecture 500 between nine VGBs. In particular, FIG. 10 illustrates a direct connect architecture between CBBs Z and X in neighboring VGBs and CBB Z in VGB(0,0). According to one embodiment, each VGB has a CBB Z, X, W and Y as illustrated in FIG. 10.

VGB(2,0), VGB(1,0), VGB(0,0), VGB(-1,0), VGB(-2,0) are arranged consecutively in a first column. VGB(0,-2), VGB(0,-1), VGB(0,0), VGB(0,1) and VGB(0,2) are arranged consecutively in a first row wherein VGB(0,0) is a center VGB. VGB(0,1), VGB(0,2), VGB(-1,0), VGB(-2,0), VGB(0,-1), VGB(0,-2), VGB(1,0), and VGB(2,0) are considered neighboring VGBs of center VGB(0,0). Direct connections between VGB(0,0) and the neighboring VGBs are illustrated by direct connect lines 501–516. Direct connect lines from the neighboring VGBs are connected to multiplexer 517. In an embodiment, multiplexer 517 includes both input-term acquiring multiplexer 724 and control acquiring multiplexer 725 as illustrated in FIG. 5A. In an embodiment, multiplexer 517 comprises a set of PIPs as illustrated in FIG. 8. These PIPs may be selectively configured to connect specific direct connect lines to particular CBB Z inputs.

The 6 term inputs (CBE(a0)In, CBE(a1)In, CBE(a2)In, CBE(b0)In, CBE(b1)In, CBE(b2)In) and 2 control inputs (CTL4, CTL5) of CBB Z in VGB(0,0) are connected by lines 518 to multiplexer 517. In an embodiment, lines 518 include MIL# 1–6 and MIL# 9 and 10 as illustrated in FIG. 8. In particular, FIG. 10 illustrates direct connections from the neighboring VGBs to a CBB Z in VGB(0,0). Similar to FIG. 9, output signals are generated from CBBs Z and X in VGB(0,-2), VGB(0,-1), VGB(2,0), VGB(1,0), VGB(0,1), VGB(0,2), VGB(-1,0) and VGB(-2,0) and are transferred on lines 501–516, which are connected to multiplexer 517. Respective direct connect drive amplifiers, as illustrated in FIG. 5A, from respective CSEs, are used to output direct connect output signals. Multiplexer 517 then selectively outputs signals on lines 518 to CBB Z in VGB(0,0).

In an embodiment, a similar direct connect architecture for inputting signals into CBB X of VGB(0,0) from the CBBs X and Z in neighboring VGBs may be used in addition to direct connect architecture 500 illustrated in FIG. 10.

Figure 11:
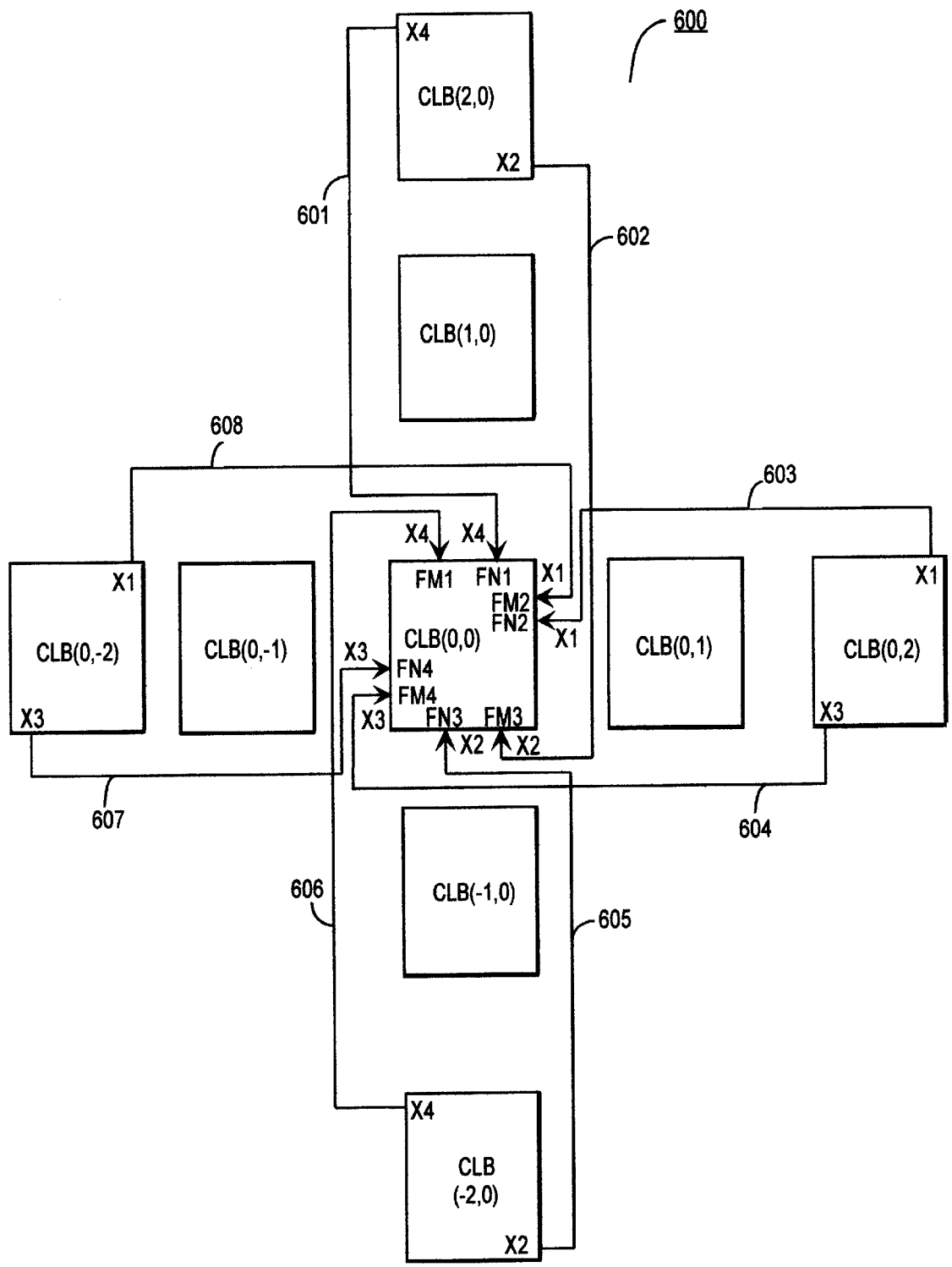
FIGS. 11 and 12 illustrate a previously suggested direct connect architecture between outputs of neighboring four-sided CLBs to inputs of a four-sided CLB.
Figure 12:
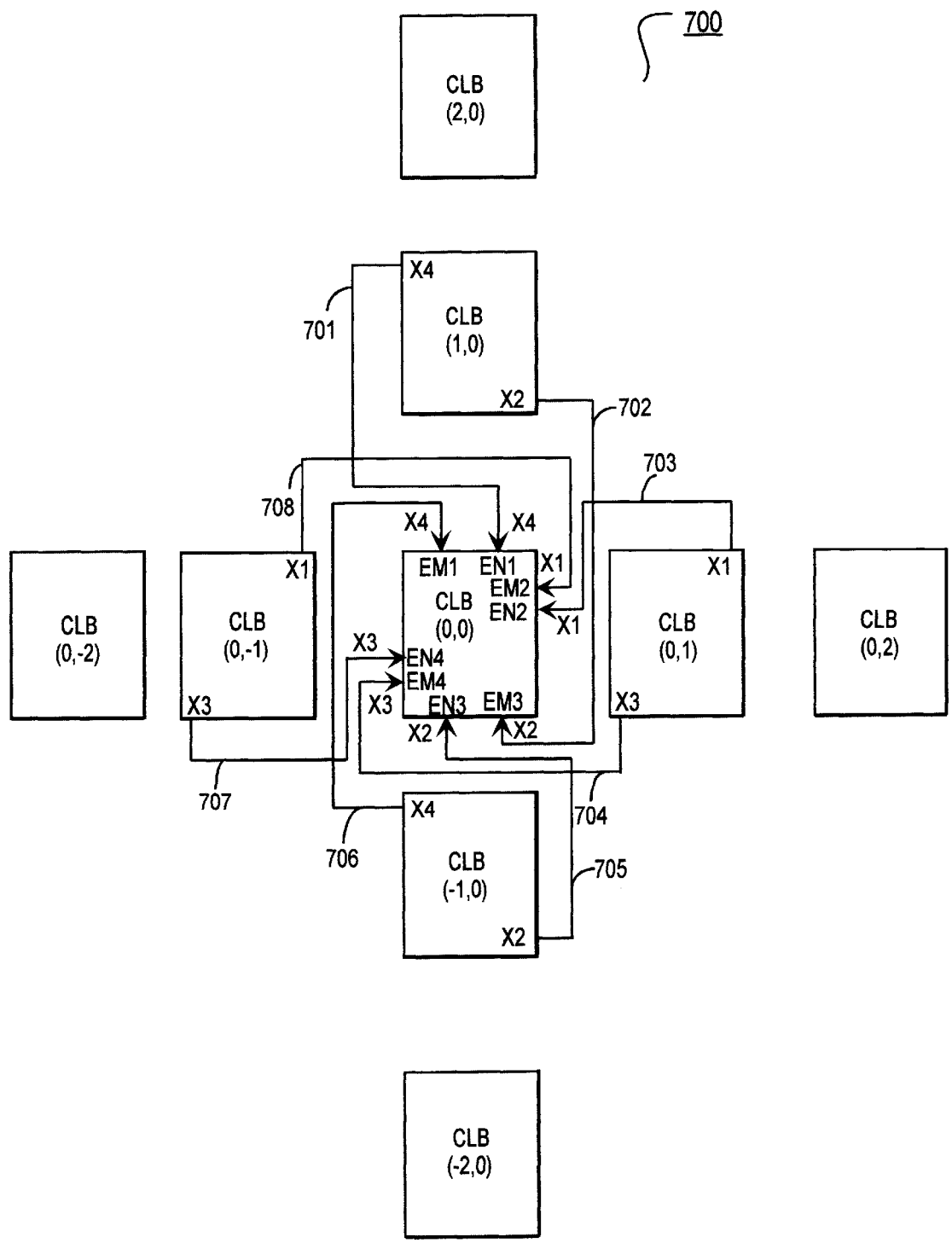

FIGS. 11 and 12 illustrates a direct connect architecture previously suggested in U.S. Pat. No. 5,212,652 referred above. FIG. 11 illustrates a direct connect architecture 600 between next-adjacent CLB(2,0), CLB(0,2), CLB(-2,0), CLB(0,-2) and a center CLB(0,0). Direct connect outputs generated from CLB(2,0) may be output from output X4 on line 601 to input FN1 of CLB(0,0). Likewise, an additional direct connect output generated from CLB(2,0) may be output from output X2 on line 602 to input FM3 of CLB (0,0). As can be seen from FIG. 11, the X4 output is positioned at the upper left or west side of CLB(2,0) and the output X2 is positioned on the lower right or east side of CLB(2,0). The FN1 input for CLB(0,0) is located at the top or north side and the FM3 input is located at the bottom or south side.

Direct connect outputs generated from CLB(0,2) may be output from output Xl on line 603 to input FN2 of CLB(0,0). Likewise, an additional direct connect output generated from CLB(0,2) may be output from output X3 on line 604 to input FM4 of CLB(0,0). As can be seen from FIG. 11, the X3 output is positioned on the bottom side or south side of CLB(0,2) and the output X1 is positioned at the top side or north side of CLB(0,2). The FM2 input for CLB(0,0) is located at the right or east side and the FM4 input is located at the left or west side.

Direct connect outputs generated from CLB(-2,0) may be output from output X2 on line 605 to input FN3 of CLB(0, 0). Likewise, an additional direct connect output generated from CLB(-2,0) may be output from output X4 on line 606 to input FM1 of CLB(0,0). The X2 output is positioned at the lower right side or east side of CLB(-2,0) and the output X1 is positioned at the upper left side or west side of CLB(-2,0). The FM1 input for CLB(0,0) is located at the top or north side and the FN3 input is located at the bottom or south side.

Direct connect outputs generated from CLB(0,-2) may be output from output X3 on line 607 to input FN4 of CLB(0, 0). Likewise, an additional direct connect output generated from CLB(0,-2) may be output from output X1 on line 608 to input FM2 of CLB(0,0). As can be seen from FIG. 11, the X3 output is positioned at the bottom side or south side of CLB(0,-2) and the output X1 is positioned at the top or north side of CLB(0,-2). The FM2 input for CLB(0,0) is located at the right or east side and the FN4 input is located at the left or west side.

FIG. 12, similar to FIG. 11, illustrates a previously suggested direct connect architecture 700. In particular, direct connect lines between adjacent CLB(1,0), CLB(0,1), CLB(-1,0) and CLB(0,-1) and a center CLB(0,0) are illustrated. Outputs generated from CLB(1,0) may be output from output X4 on line 701 to input EN1 of CLB(0,0). Likewise, an additional output generated from CLB(1,0) may be output from output X2 on line 702 to input EM3 of CLB(0,0). As can be seen from FIG. 12, the X4 output is positioned at the upper left or west side of CLB(1,0) and the output X2 is positioned at the lower right or east side of CLB(1,0). The input ENI for CLB(0,0) is located at the top or north side. The input EM3 for CLB(0,0) is located at the bottom or south side.

As in FIG. 11, adjacent CLB(0,1), CLB(-1,0) and CLB (0,-1) are connected by lines 703-708 to center CLB(0,0) inputs.

The direct connect architecture illustrated in FIGS. 9 and 10 offers several advantages over the previously suggested direct connect architecture shown in FIGS. 11 and 12.

First, the present direct connect architecture provides four direct connect output signals from an adjacent and next-adjacent VGB to a center VGB instead of only two. For example, the adjacent VGB(0,1) may output signals from CBBs Y, W, Z and X on lines 407, 408, 507 and 508, respectively, as shown in FIGS. 9 and 10, to center VGB (0,0). In contrast, the previously suggested direct connect architecture as illustrated in FIG. 12, is limited to outputting two direct connect signals from an adjacent CLB to a center CLB. In particular, output signals from outputs X1 and X3 may be generated on lines 703 and 704 to center CLB(0,0) inputs EN2 and EM4, respectively. Likewise, a next-adjacent CLB, such as CLB(0,2) is limited to generating two direct connect signals to a center CLB(0,0). Thus, the use of additional direct connections from adjacent and next-adjacent VGBs enables greater degrees of freedom for the FPGA configuration software. When configuring a FPGA-implemented circuit, the routing phase has additional outputs and direct connect lines to use in establishing connections between chunk-implemented VGBs. Further, the use of the additional direct connect lines enables the FPGA configuration software to select other interconnect resources which would have been otherwise used.

Second, a VGB according to one embodiment of the present invention, has substantially more direct connect inputs than the previously suggested direct connect architecture illustrated in FIGS. 11 and 12. As illustrated in FIGS. 5A–B and 8, a center VGB may receive at least thirty-two direct connect inputs from adjacent and next-adjacent VGBs. In particular, each CBB has six term inputs and two control inputs. As with the increased number of direct connect outputs described above, the number of direct connect inputs allows for greater degrees of freedom in the FPGA configuration software.

Third, the present direct architecture allows for two types of direct connect signals—term inputs and control inputs. Term inputs are input to decoder 1023 on MIL# 1–6 as illustrated in FIG. 8, and control inputs are input to common control 550 on MIL# 7–10 as illustrated in FIGS. 5A–B and 8. The previously suggested direct connect architecture does not have separate direct connect lines for control inputs and term inputs. Furthermore, the previously suggested direct connect lines are not connected to different types of signal processing resources in a CLB.

In the present architecture, control inputs are input directly to common control functions 550 as illustrated in FIG. 5A where term inputs are input to decoder 1023 and a LUT as illustrated in FIGS. 5B and 8. Thus, control inputs do not have the additional signal propagation delays associated with a general term input signal which is input to decoder 1023 and various LUTs.

Fourth, the direct connect architecture illustrated in FIGS. 9 and 10 reduces the direct connect line wire length in many connections between VGB inputs and outputs. For example, the positioning of the direct connect outputs of CLB(0,2) in FIG. 11, as well as the positioning of the inputs FN2 and FM4 in center CLB(0,0) requires greater connect line wire lengths for connect lines 603 and 604 than the direct connect lines 409 and 410 illustrated in FIG. 9. Direct connect line 604 must be routed to the left side of CLB(0,0), requiring additional line length that is not necessary for direct connect lines 409 or 410 illustrated in FIG. 9. This reduction in direct connect line wire length enables reduced costs per direct connect line in manufacturing. The reduction in direct connect line length also enables reductions in the amount of substrate surface area which is necessary for the direct connect portion of a FPGA.

Fifth, the direct connect architecture allows for efficient implementation of random logic nets. The increased direct connect lines and dedicated drive amplifiers efficiently emulate short connections in random logic.

Sixth, the direct connect and symmetric VGB architecture enables the FPGA configuration software to reposition a plurality of circuit chunks requiring high speed direct connect signals placed in a first group of VGBs into a second group of VGBs. Because of the symmetric positioning of VGBs and direct connect architecture, circuit chunks repositioned into the second group of VGBs will have substantially the same direct connect signal delays between respective CBBs as compared to the first group of VGBs.

For example, circuit chunks may be placed by FPGA configuration software into a first group of VGBs forming a cross-hair: VGBs (4,0), (4,1), (4,2), (4,3), (4,4), (2,2), (3,2), (5,2), and (6,2) as illustrated in FIG. 6. The first group of circuit chunk implemented VGBs may require high speed direct connect input and output signals between VGBs.

The FPGA configuration software may then reposition the circuit chunks into a second group of VGBs which still meet the circuit chunk implemented VGB direct connect input and output signal timing requirements. The second group of VGBs may also be in the form of a cross-hair, such as VGBs (0,2), (1,2), (2,2), (3,2), (4,2), (2,0), (2,1), (2,3), and (2,4) as illustrated in FIG. 6. As can be seen, a non-center VGB such as VGB (2,2) in the first group of VGBs can then be a center VGB for the second group of VGBs.

Figure 18:
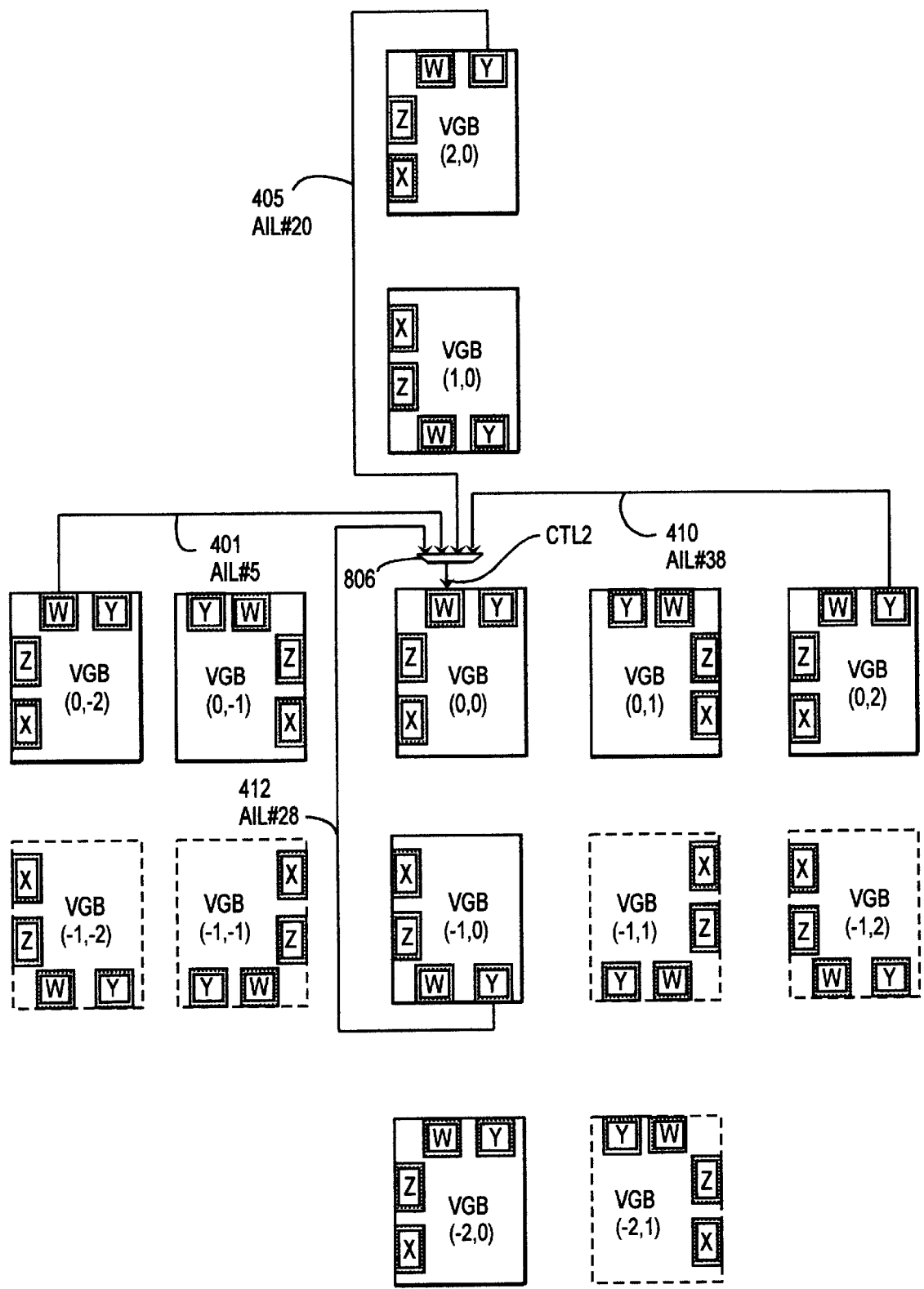
Figure 19:
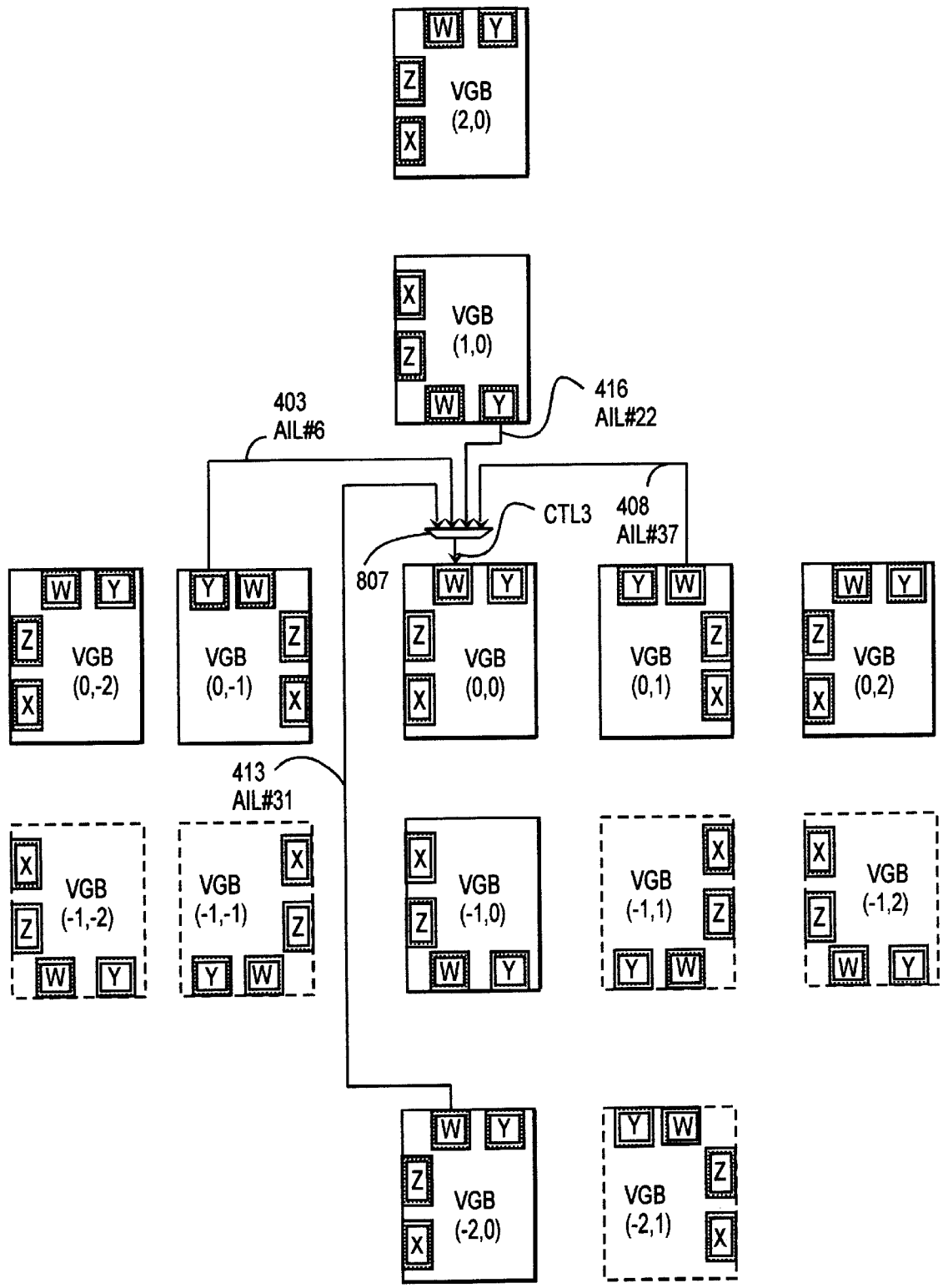

FIGS.—13A, 14–21 illustrate the specific connections between neighboring VGB outputs and a center VGB(0,0) input. As illustrated in FIG. 5A and 8, each CBB W, Y, Z and X includes six term inputs and two control inputs. FIGS.—13A, 14–17 illustrate the direct connections between neighboring VGB direct connect outputs and the six term inputs (CBE(a0)In—CBE(b2)In) of CBB W in center VGB(0,0). FIGS. 18–19 illustrate the direct connections between neighboring VGBs and the two control inputs (CTL2, CTL3) of CBB W in VGB(0,0).

Figure 13:
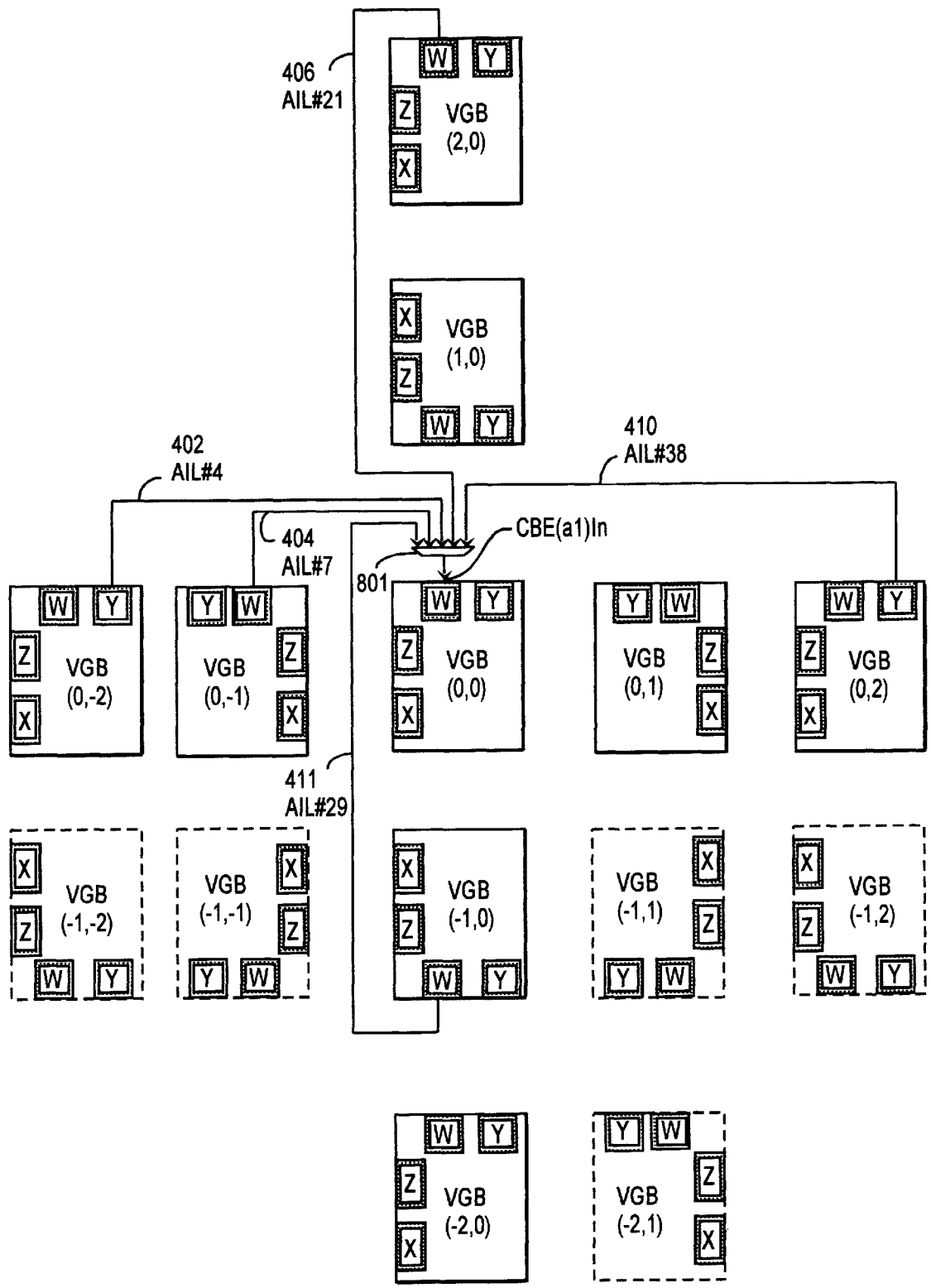
FIGS. 13A, 14–19 illustrate direct connections between W CBB inputs in a center VGB and CBB outputs in neighboring VGBs according to the present invention.
Figure 13A:
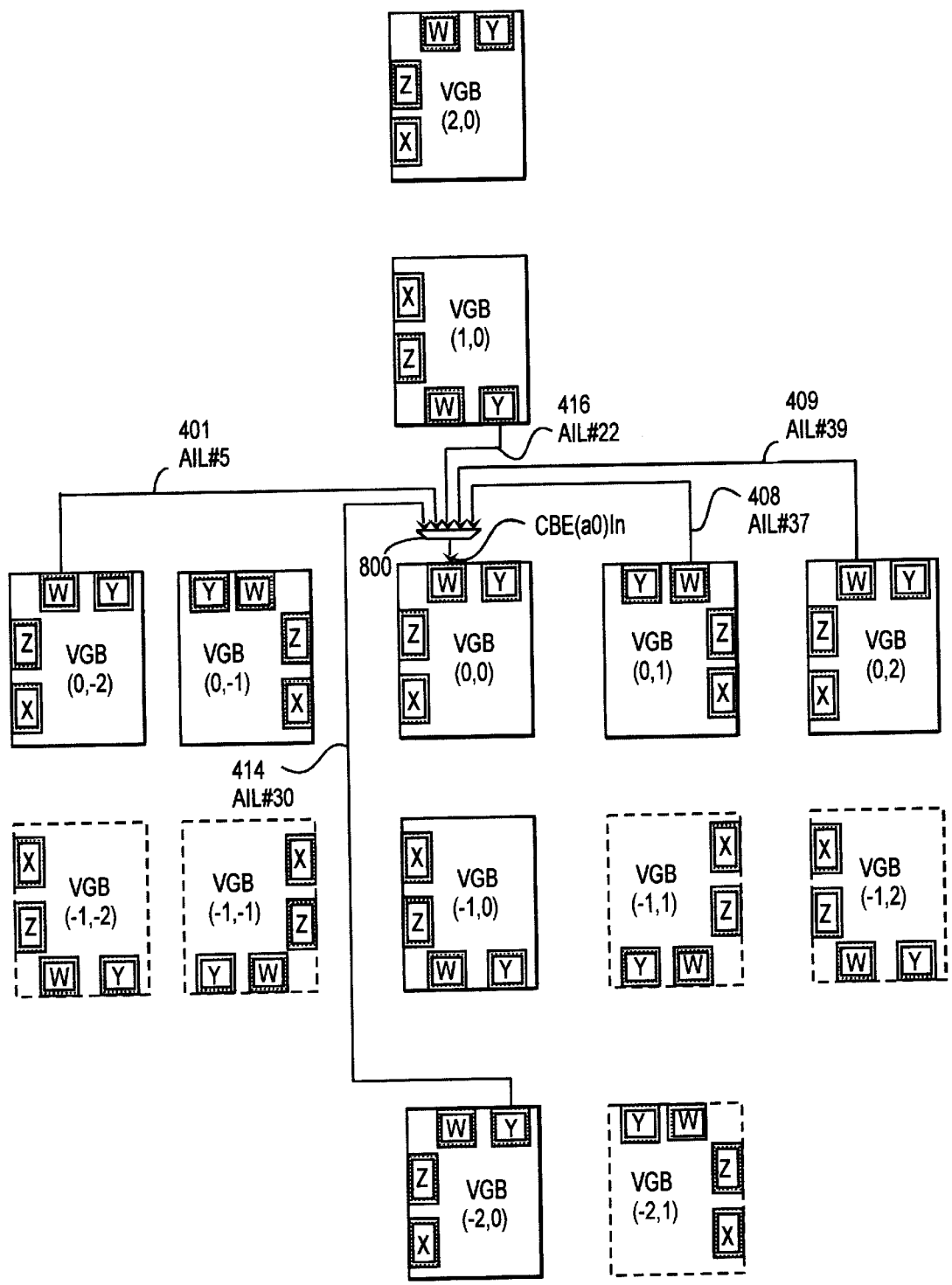

FIG. 13A illustrates how the direct connect outputs from VGB(0,1), VGB(0,2), VGB(−2,0), VGB(0,−1) and VGB(1,0) are connected directly to CBE(a0)In input of CBB W in VGB(0,0). In particular, the direct connect output of CBB W in VGB(0,1) is connected to direct connect line 408. (AIL# 37 as illustrated in FIG. 8.) Direct connect line 408 is coupled to an input-term acquiring multiplexer 800. In an embodiment, multiplexer 800 includes PIPS 1, 7, 10, 12, and 13 on MIL# 1 as shown in FIG. 8. MIL# 1 is connected to CBE(a0)In input of decoder 1023 of CBB W in VGB(0,0). Likewise, direct connect line 409 (AIL# 39 as illustrated in FIG. 8) is coupled to the direct connect output of CBB W in VGB(0,2). Finally, the respective direct connect outputs of Y CBBs in VGB(−2,0), VGB(0,−1) and VGB(1,0) are respectively connected to direct connect lines 414 (AIL# 30), 401 (AIL# 5) and 416 (AIL# 22), which are in turn coupled to multiplexer 800.

FIG. 13 illustrates the connections of the CBB W CBE (a1)In input of VGB(0,0) to the direct connect outputs of neighboring VGBs. The direct connect output of CBB Y in VGB(0,2) is connected to direct connect line 410 (AIL# 38). The direct connect output of CBB W in VGB(−1,0) is connected to direct connecting line 411 (AIL# 29). The direct connect output of CBB W in VGB(0,−1) is connected to direct connect line 404 (AIL# 7). The direct connect output of CBB Y in VGB(0,−2) is connected to line 402 (AIL# 4). The direct connect output of CBB W in VGB(2,0) is connected to direct connect line 406 (AIL# 21). Lines 410 (AIL# 38), 411 (AIL# 29), 404 (AIL# 7), 402 (AIL# 4) and 406 (AIL# 21) are then coupled to input-term acquiring multiplexer 801. In an embodiment, multiplexer 801 includes the direct connect PIPS 20, 21, 26, 28 and 31 on MIL# 2 as shown in FIG. 8. MIL# 2 is connected to CBE(a1)In input of decoder 1023 of CBB W in VGB(0,0).

Figure 14:
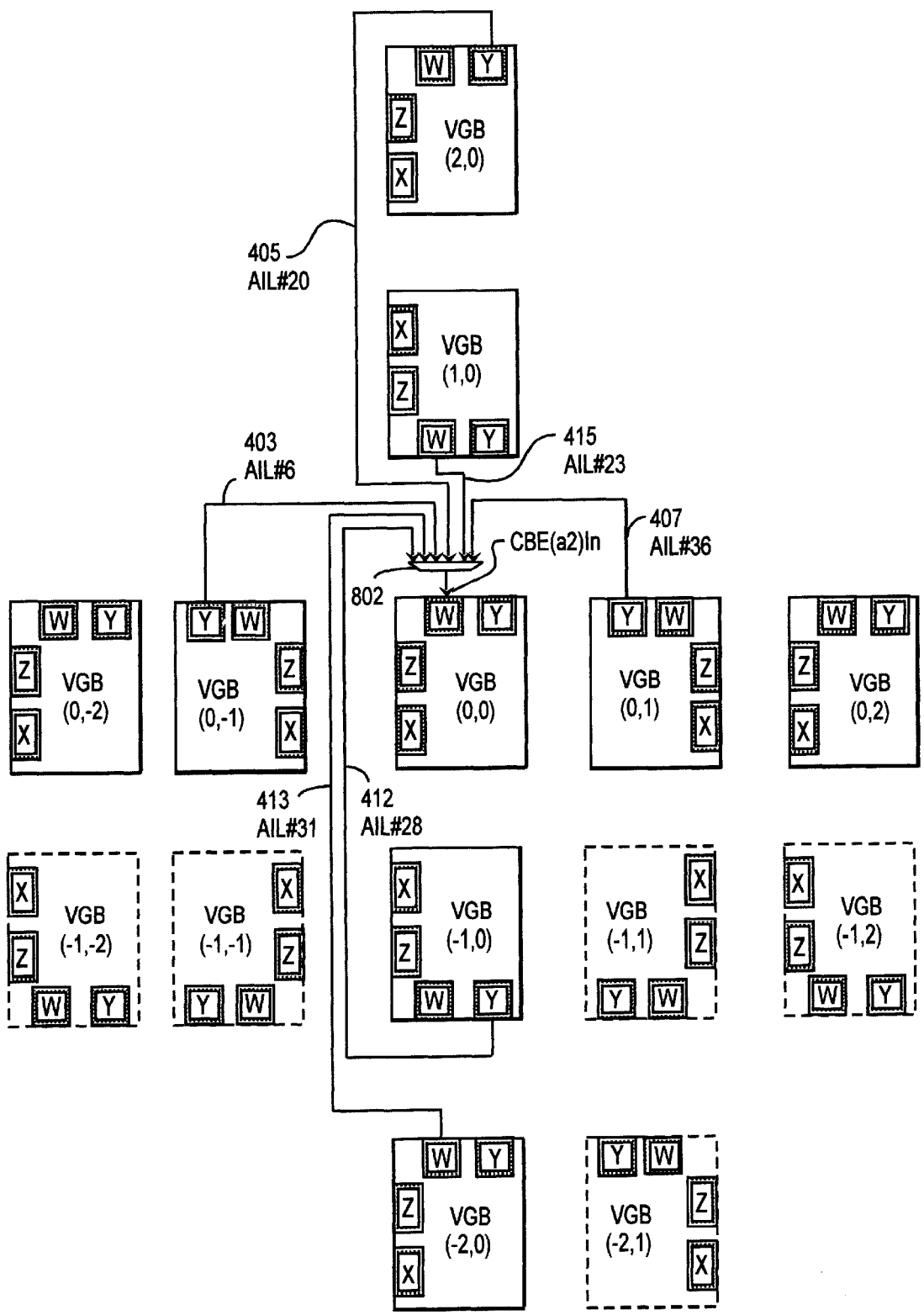

FIG. 14 illustrates the connections of neighboring VGB direct connect outputs to a CBE(a2)In input of CBB W in VGB(0,0). The direct connect output of CBB Y in VGB(0,1) is connected to direct connect line 407 (AIL# 36). The direct connect output of CBB W in VGB(−2,0) is connected to direct connect line 413 (AIL# 31). The direct connect output of CBB Y in VGB(−1,0) is connected to direct connect line 412 (AIL# 28). The direct connect output of the CBB Y in VGB(0,−1) is connected to direct connect line 403 (AIL# 6). The direct connect output of CBB Y in VGB(2,0) is connected to direct connect line 405 (AIL# 20) and the direct connect output of CBB W in VGB(1,0) is connected to direct connect line 415 (AIL# 23). Direct connect lines 407 (AIL# 36), 412 (AIL# 28), 413 (AIL# 31), 403 (AIL# 6), 415 (AIL# 23) and 405 (AIL# 20) are then connected to multiplexer 802. In an embodiment, multiplexer 802 includes the direct connect PIPs 40, 44, 45, 47, 48 and 50 on MIL# 3 as shown in FIG. 8. MIL# 3 is connected to CBE(a2)In input of decoder 1023 in CBB W in VGB(0,0).

Figure 15:
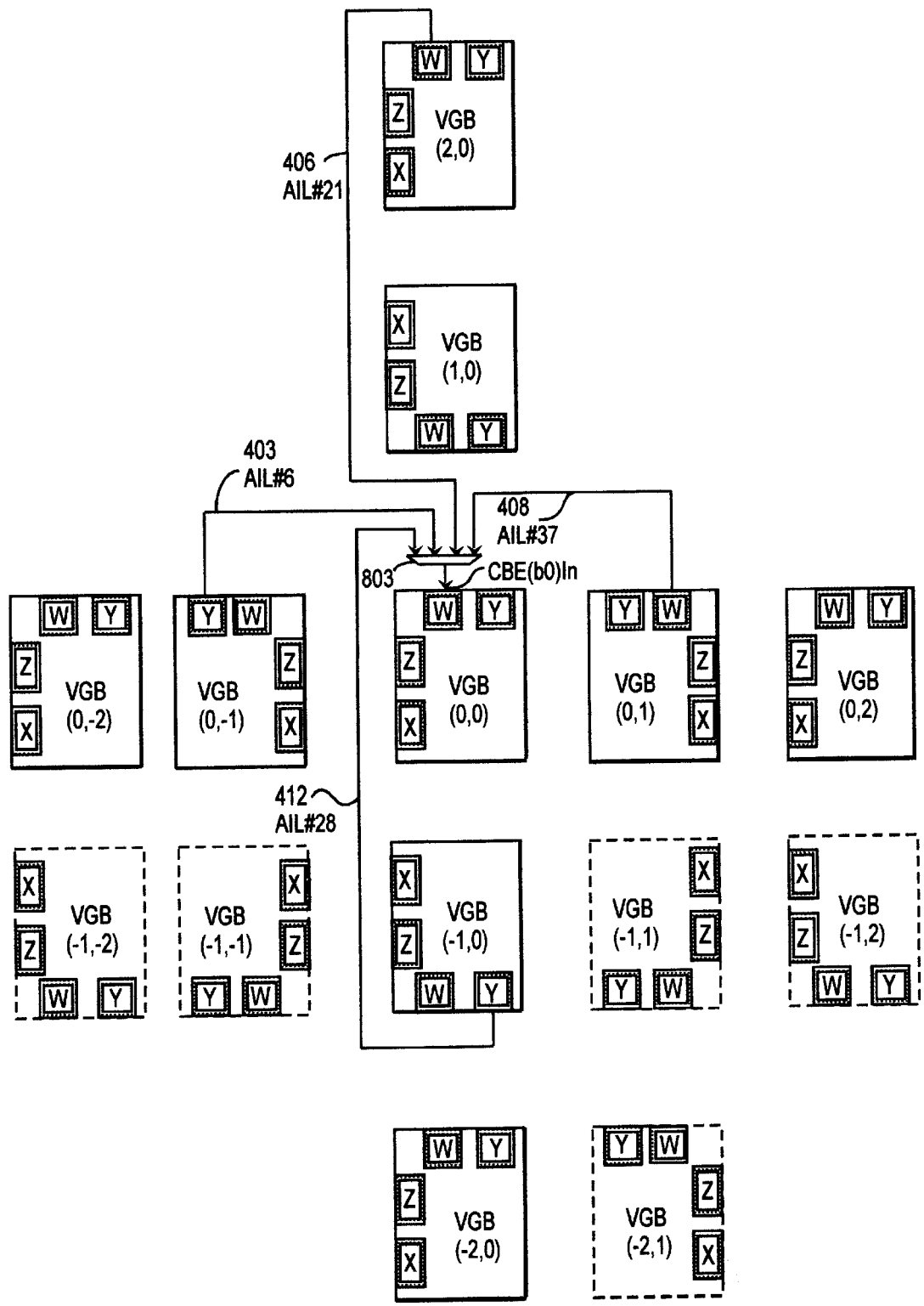

FIG. 15 illustrates the direct connections between the CBE(b0)In input of CBB W in VGB(0,0) to the neighboring VGB direct connect outputs. Specifically, a CBB W direct connect output of VGB(0,1) is connected to direct connect line 408 (AIL# 37). The CBB Y direct connect output of VGB(−1,0) is connected to direct connect line 412 (AIL# 28). The direct connect output of CBB Y in VGB(0,−1) is connected to direct connect line 403 (AIL# 6). The CBB W direct connect output of VGB(2,0) is connected to direct connect line 406 (AIL# 21). Direct connect lines 408 (AIL# 37), 412 (AIL# 28), 403 (AIL# 6) and 406 (AIL# 21) are connected to input-term acquiring multiplexer 803. In an embodiment, multiplexer 803 includes direct connect PIPs 59, 64, 66 and 69 on MIL# 4 as shown in FIG. 8. MIL# 4 is connected to CBE(b0)In input of decoder 1023 of CBB W in VGB(0,0).

Figure 16:
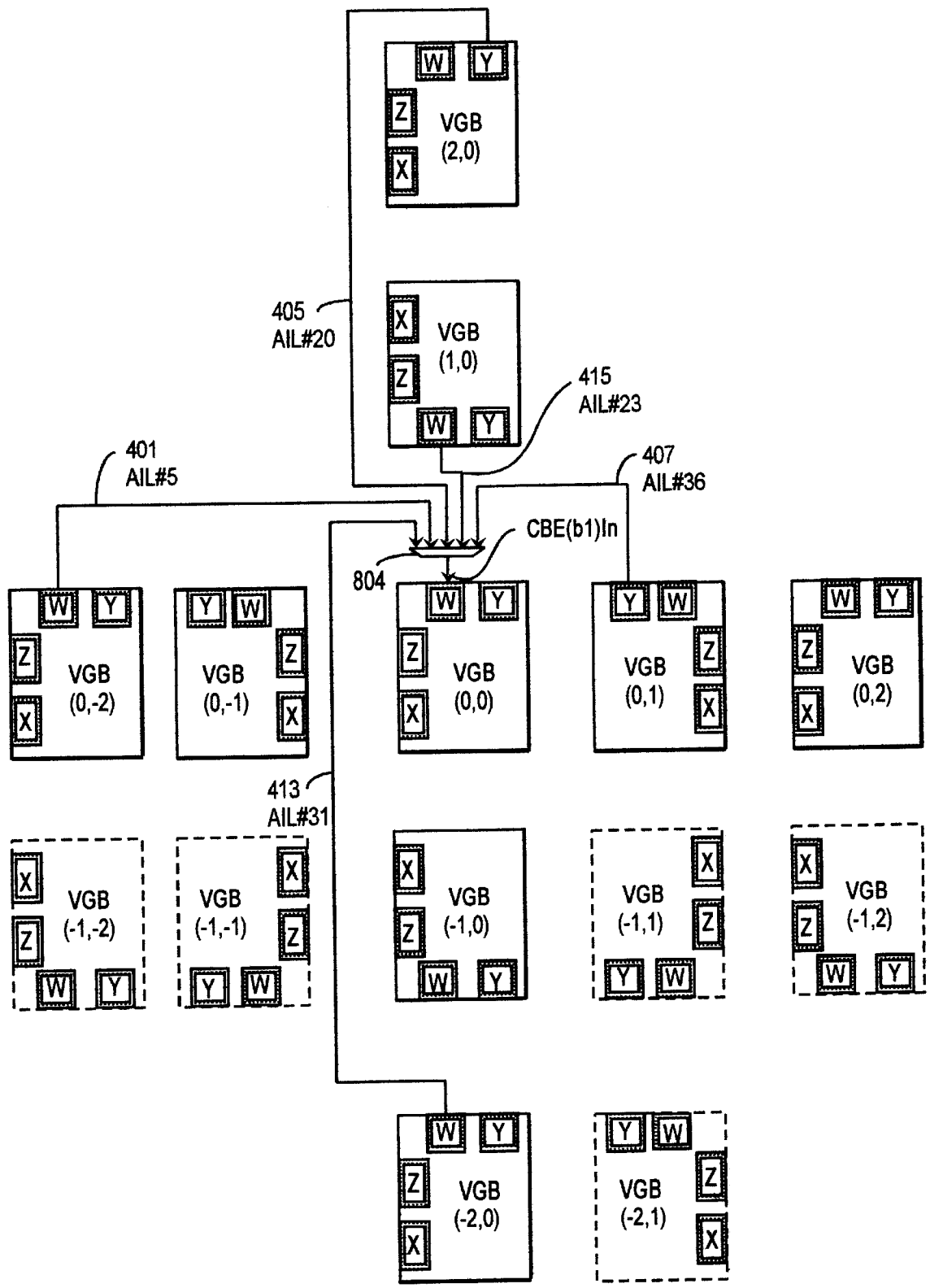

FIG. 16 illustrates direct connections of a CBE(b1)In input of CBB W in VGB(0,0) and a neighboring VGB direct connect outputs. In particular, a direct connect output of CBB Y in VGB(0,1) is connected to direct connect line 407 (AIL# 36). The direct connect output of CBB W in VGB(−2,0) is connected to direct connect line 413 (AIL# 31). The direct connect output of CBB W in VGB(0,−2) is connected to the direct connect line 401 (AIL# 5). The direct connect output of CBB Y in VGB(2,0) is connected to direct connect line 405 (AIL# 20). The output of CBB W in VGB(1,0) is connected to direct connect line 415 (AIL# 23). Lines 407 (AIL# 36), 413 (AIL# 31), 401 (AIL# 5), 405 (AIL# 20) and 415 (AIL# 23) are connected to input-term acquiring multiplexer 804. In an embodiment, multiplexer 804 includes direct connect PIPs 77, 82, 83, 86 and 88 on MIL# 5 as shown in FIG. 8. MIL# 5 is connected to CBE(b1)In input of decoder 1023 of CBB W of VGB(0,0).

Figure 17:
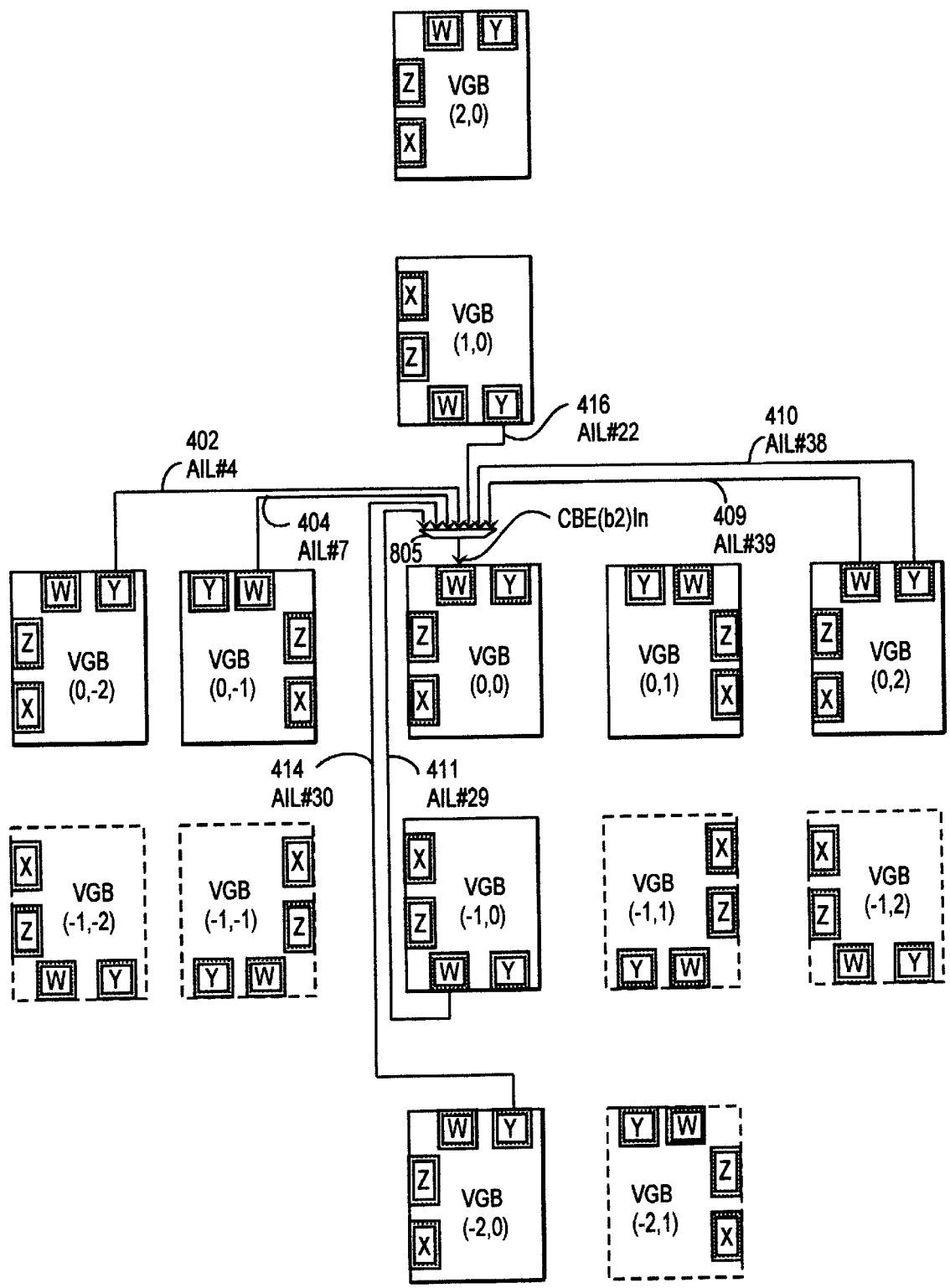

FIG. 17 illustrates the direct connections between CBE (b2)In input of CBB W in VGB(0,0) and direct connect outputs of neighboring VGBs. In particular, the direct connect output of CBB W in VGB(0,2) is connected to direct connect line 409 (AIL# 39). Also, the direct connect output of CBB Y in VGB(0,2) is connected to direct connect line 410 (AIL# 38). The direct connect output of CBB W in VGB(−1,0) is connected to direct connect line 411 (AIL# 29). The direct connect output of CBB Y in VGB(−2,0) is connected to direct connect line 414 (AIL# 30). The direct connect output of CBB W in VGB(0,−1) is connected to direct connect line 404 (AIL# 7). The direct connect output of CBB Y in VGB(0,−2) is connected to direct connect line 402 (AIL# 4). The direct connect output of CBB Y in VGB(1,0) is connected to direct connect line 416 (AIL# 22). Direct connect lines 410 (AIL# 38), 409 (AIL# 39), 414 (AIL# 30), 411 (AIL# 29), 404 (AIL# 7), 402 (AIL# 4) and 416 (AIL# 22) are also connected to input-term acquiring multiplexer 805. In an embodiment, multiplexer 805 includes direct connect PIPs 96, 97, 102, 104, 105, 107 and 108 on MIL# 6 as shown in FIG. 8. MIL# 6 is connected to CBE(b2)In input of decoder 1023 of CBB W in VGB(0,0).

FIG. 18 illustrates the direct connections between control input 2 (CTL2) of CBB W in VGB(0,0) and neighboring VGB direct connect outputs. Specifically, a direct connect output of CBB Y in VGB(0,2) is connected to direct connect line 410 (AIL# 38). The direct connect output of CBB Y in VGB(−1,0) is connected to direct connect line 412 (AIL# 28). The direct connect output of CBB W in VGB(0,−2) is connected to direct line 401 (AIL# 5). The direct connect output of CBB Y in VGB(2,0) is connected to direct connect line 405 (AIL# 20). Direct connect lines 410, 412, 401 and 405 are connected to control-signal acquiring multiplexer 806. In an embodiment, multiplexer 806 includes direct connect PIPs 115, 119, 121 and 123 on MIL# 7 as shown in FIG. 8. MIL# 7 is connected to the control input CTL2 of CBB W in VGB(0,0).

FIG. 19 illustrates direct connections between control input 3 (CTL3) of CBB W in VGB(0,0) and neighboring VGB direct connect outputs. The direct connect output of CBB W in VGB(0,1) is connected to direct connect line 408 (AIL# 37). The direct connect output of CBB W in VGB(−2,0) is connected to direct connect line 413 (AIL# 31). The direct connect output of CBB Y in VGB(0,−1) is connected to direct connect line 403 (AIL# 6). The direct connect output of CBB Y in VGB(1,0) is connected to direct connect line 416 (AIL# 22). The direct connect lines 408 (AIL# 37), 413 (AIL# 31), 403 (AIL# 6) and 416 (AIL# 22) are connected to control-signal acquiring multiplexer 807. In an embodiment, multiplexer 807 includes direct connect PIPs 129, 133, 135 and 137 on MIL# 8 as shown in FIG. 8. MIL# 8 is connected to control input CTL3 of CBB W in VGB (0,0).

FIGS. 13–19, as described above, illustrate the direct connections between neighboring VGB direct connect outputs and inputs of CBB W. A similar direct connect architecture between inputs of CBB Y in VGB(0,0) and neighboring VGBs (CBB Y and W) may likewise be implemented in an embodiment of the present invention.

Further, direct connections between inputs of CBBs Z and X in VGB(0,0) and direct connect outputs of neighboring VGBs (CBBs Z and X) may likewise be implemented in an embodiment of the invention.

Figure 20:
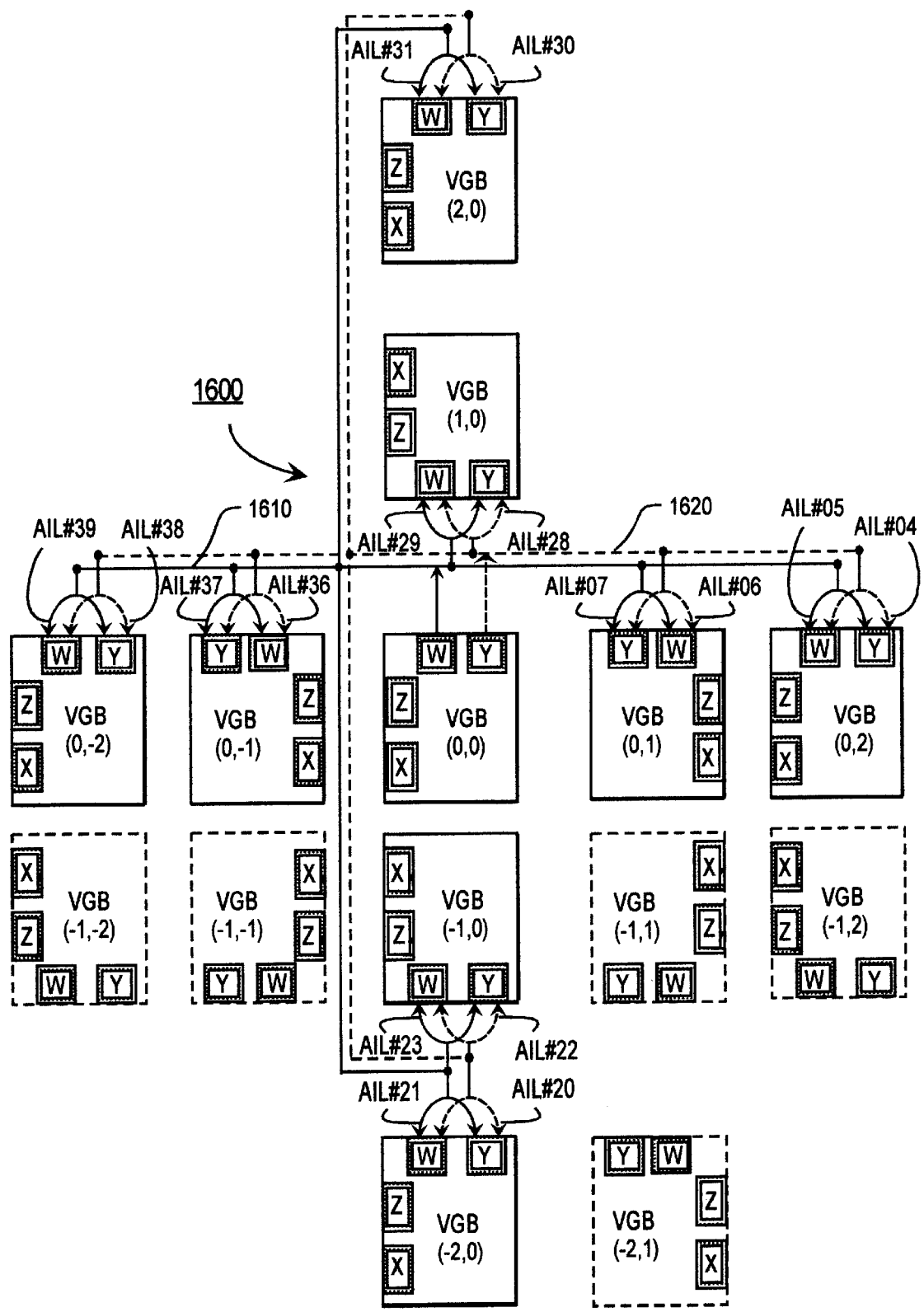
FIG. 20 illustrates direct connections between W and Y CBB outputs in a center VGB and W and Y CBB inputs in 8 neighboring VGBS.

FIG. 20 illustrates an embodiment 1600 of direct connections that may be used within the FPGA device disclosed here. Other direct connection architecture are also usable. In FIG. 20, solid line 1610 represents the DC output of the W CSE within reference VGB(0,0). Dashed line 1620 represents the DC output of the Y CSE within the same reference VGB(0,0). Each of lines 1610 and 1620 extends continuously to the W and Y CBBs of eight other VGBs that neighbor reference VGB(0,0) both adjacent and next-adjacent VGBs. The relative AIL# numbers of continuous lines 1610 and 1620 change as one moves from one to the next of the eight neighboring VGBs as shown. This is so because, by way of example, reference VGB(0,0) is first to the left of VGB(0,1) but second to the left of VGB(0,2). A similar pattern of direct connections is understood to exist for the respective DC outputs of CBBs Z and X of the reference VGB(0,0).

The direct connection architecture of FIG. 20 assists the FPGA configuring software as follows. A CBB-sized, signal-sourcing chunk may be placed equivalently in either of the W and Y CBBs of reference VGB(0,0) with equal capability to transmit its sourced signal to a receiving chunk in one of the eight neighboring VGBs: (0,1), (0,2), (0,−1), (0,−2), (1,0), (2,0), (−1,0), and (−2,0). A CBB-sized, signal-receiving chunk may be placed equivalently in either of the W and Y CBBs of any of the eight neighboring VGBS. Thus a wide range of placement and routing options are provided.

Also, if through-the-AIL strapping is desirable for a signal that is sourced by reference VGB(0,0) and is to be processed by pairs of VGBs such as (0,−2) and (0,−1), or such as (2,0) and (1,0), a DCL such as 1610 or 1620 can provide a convenient and high speed means for carrying out such through-the-AIL strapping. See FIG. 8 for an example of how through-the-AIL strapping may be used to implement large scale, dynamic multiplexers within a super-VGB using in-row adjacent VGBs such as (0,−2) and (0,−1), or using in-column adjacent VGBs such as (2,0) and (1,0).

Additionally, nibble-wide transmission of data from one column or row of VGBs to a next or next-adjacent adjacent column or row of VGBs may be carried out with the direct connections architecture 1600 of FIG. 20. A similar direct connect architecture, as discussed below, may be used for Z and X CBBS. Thus, the W and Y CBBs of reference VGB(0,0) may output a first set of 2 independent bits to corresponding W and Y CBBs of the eight neighboring VGBs while the Z and X CBBs of reference VGB(0,0) may output a second set of 2 independent bits to corresponding Z and X CBBs of the eight neighboring VGBs. Result data may therefore be transferred in nibble-wide quantums by way of the repeated direct connection architecture 1600 from a first column of VGBs either left or right to a next or next-adjacent column of VGBs, or from a first row of VGBs either up or down to a next or next-adjacent row of VGBs, or it may be symmetrically broadcast as a nibble-wide quantum from a reference VGB(0,0) to as many as eight neighboring VGBs.

Figure 21:
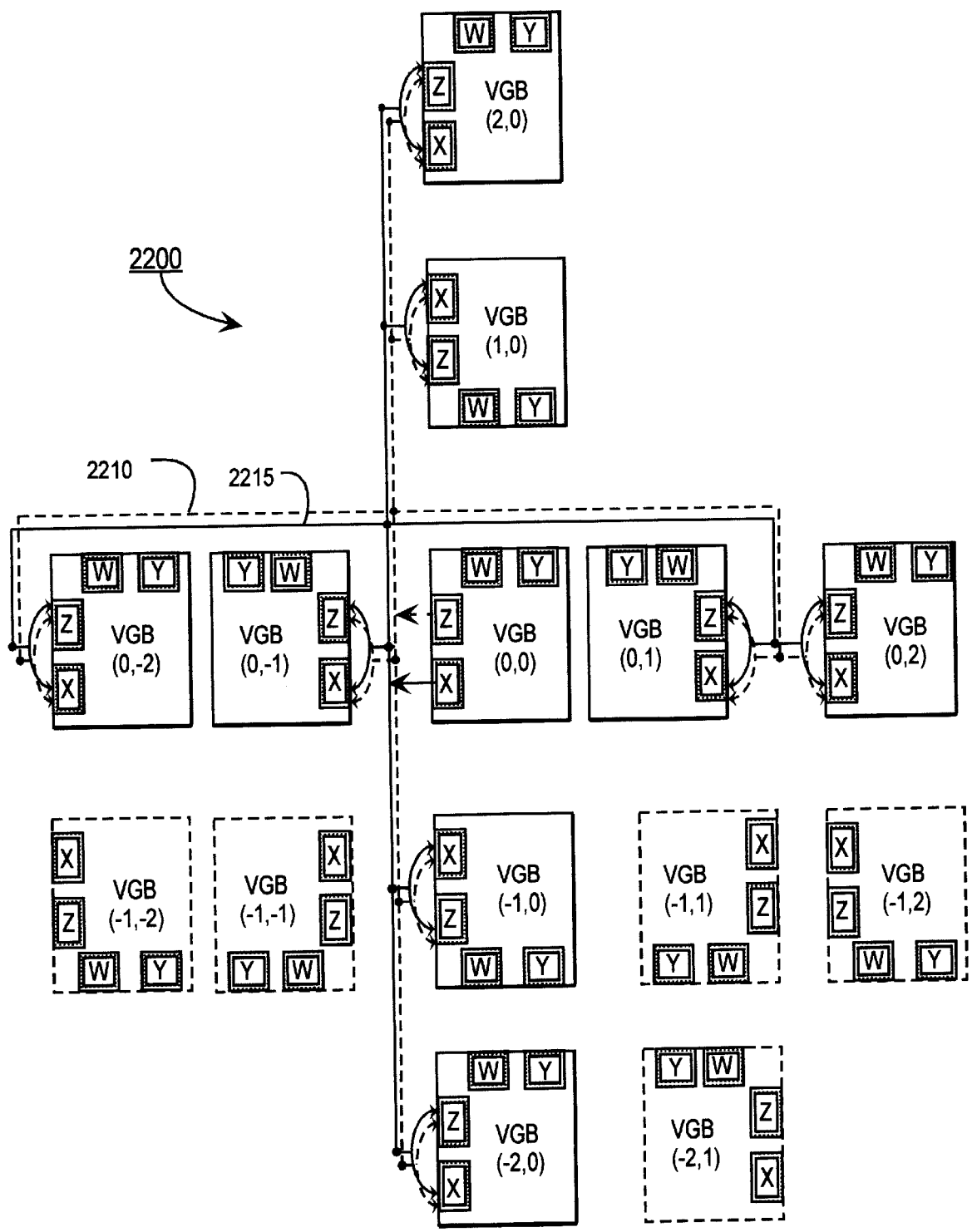
FIG. 21 illustrates direct connections between Z and X CBB outputs in a center VGB and Z and X CBB inputs in 8 neighboring VGBs.

FIG. 21, similar to FIG. 20, illustrates a direct connect architecture 2200 and in particular the direct connections between a direct connect output of CBB Z and X in VGB(0,0) and neighboring VGBs. The direct connect output of CBB Z in VGB(0,0) is connected to direct connect line 2210 (dashed line). Direct connect line 2210 is connected to CBBs Z and X in VGB(0,1), VGB(0,2), VGB(−1,0), VGB (−2,0), VGB(0,−1), VGB(0,−2), VGB(1,0) and VGB(2,0).

A similar direct connect architecture between a direct connect output of CBB X in VGB(0,0) and CBBs X and Z in neighboring VGBs is illustrated by solid line 2115.

Figure 20A:
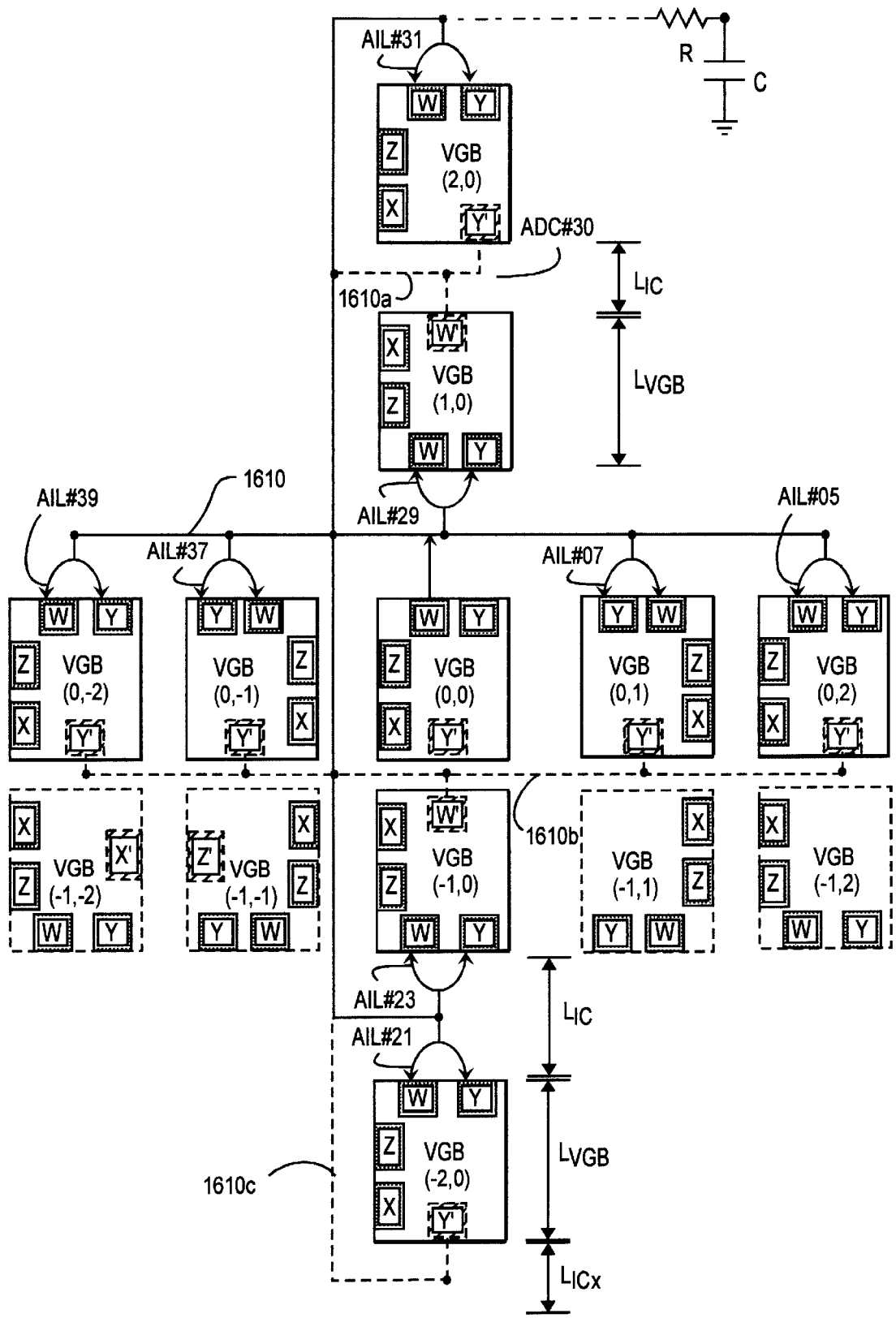
FIG. 20A illustrates a comparison between a direct connect architecture embodiment of the present invention and an alternate direct connect architecture.
Figure 20B:
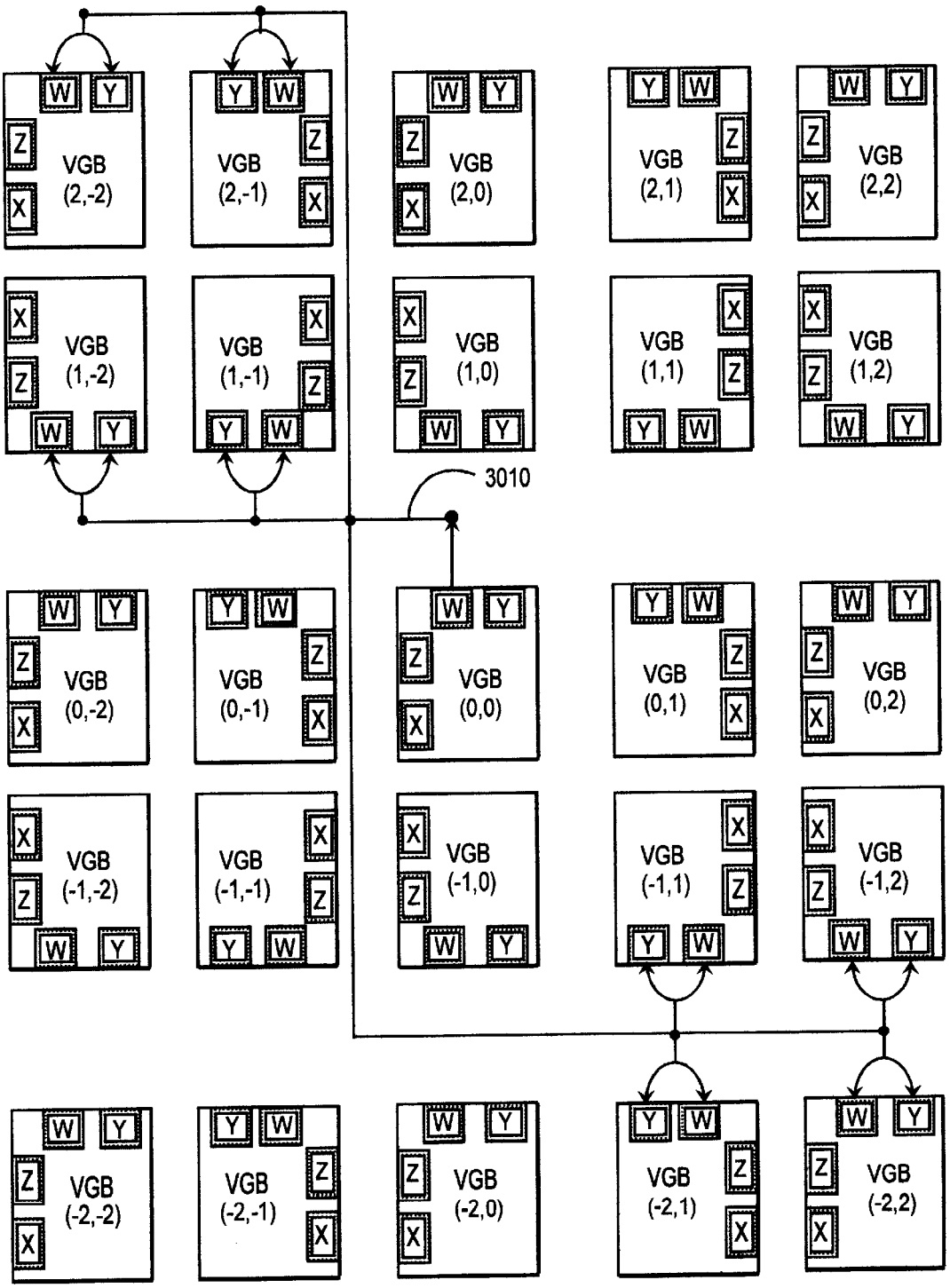
FIGS. 20B–D illustrate direct connections between a W CBB output in a center VGB and W and Y CBB inputs in diagonal VGBs.

FIG. 20B illustrates a direct connect architecture 3000 between VGB(0,0) and diagonal VGBs. Diagonal VGBs in direct connect architecture 3000 include VGBs approximately northwest and southeast from VGB(0,0). In particular, the northwest diagonal VGBs from VGB(0,0) include VGB(2,−2), VGB(2,−1), VGB(1,−2), VGB(1,−1). The southeast diagonal VGBs from VGB(0,0) include VGB (−1,1), VGB(−1,2), VGB(−2,1), and VGB(−2,2). As can be seen from FIG. 20B, the output from CBB W in VGB(0,0) is programmably connected by way of direct connect line 3010 to the direct connect inputs of the W and Y CBBs in the northwest diagonal VGBs and the southeast diagonal VGBs from VGB(0,0).

Figure 20C:
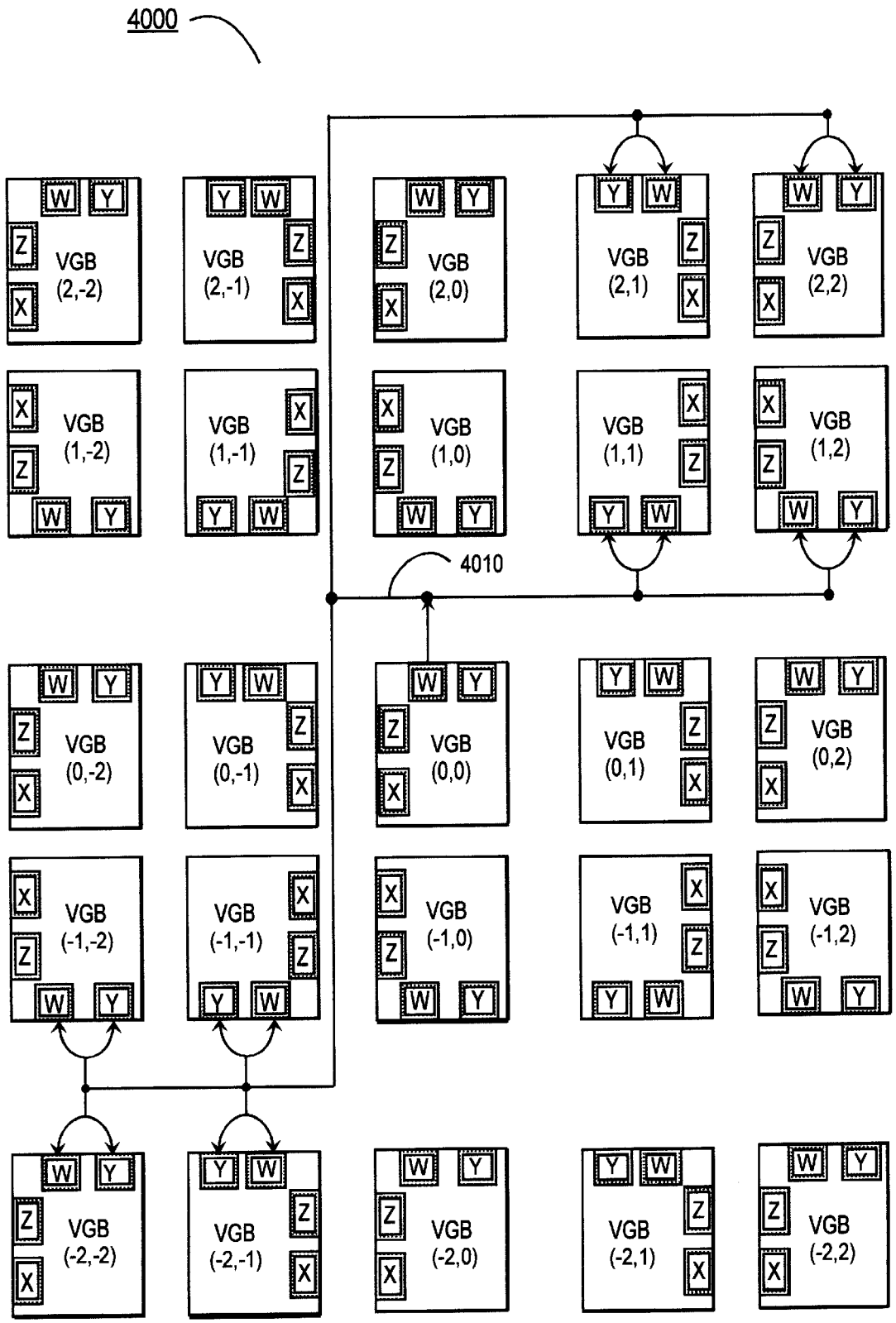

FIG. 20C, similar to FIG. 20B, illustrates a direct connect architecture 4000 between VGB(0,0) and diagonal northeast VGBs and diagonal southwest VGBs. The diagonal northeast VGBs include VGBs(2,1), (2,2), (1,1), and (1,2). The diagonal southwest VGBs include VGB(−1,−2), (−1,−2), (−2,−2), and (−2,−1). The direct connect output of CBB W in VGB(0,0) is programmably connected by way of direct connect line 4010 to the Y and W CBBs in the diagonal northeast VGBs and the diagonal southwest VGBs.

A similar direct connect architecture between direct connect outputs of CBB Z and X in VGB(0,0) and the diagonal VGBs may also be used.

Figure 20D:

In another embodiment, FIG. 20D illustrates an architecture 5000 for providing direct connect signals to the diagonal VGBs illustrated in FIGS. 20B and 20C. Direct line DC 5010 is connected to the output of CBB W in VGB (0,0). Direct connect line DC 5010 is connected to the W and Y CBB inputs of VGB (1,−2) and VGB (1,−1). A direct connect signal is also provided to the W and Y CBB inputs of VGB (2,−2), VGB (2,−1), VGB (−1,1), VGB (−1,2), VGB (−2,1), VGB (−2,2) by way of switchboxes, a 2xL line, and a 4xL line. Direct connect DC 5010 is connected to switchbox SwBx 5021 which couples DC 5010 to double line 2xL 5040. Likewise, direct connect DC 5010 is connected to switchbox SwBx 5021 which couples DC 5010 to quad line 4xL 5030. W and Y CBB inputs of VGB (2,−2) and VGB (2,−1) are connected to double line 2xL 5040. W and Y CBB inputs of VGB (−1,1), VGB (−1,2), VGB (−2,1) and VGB (−2,2) are connected to quad line 4xL 5030.

Figure 22:
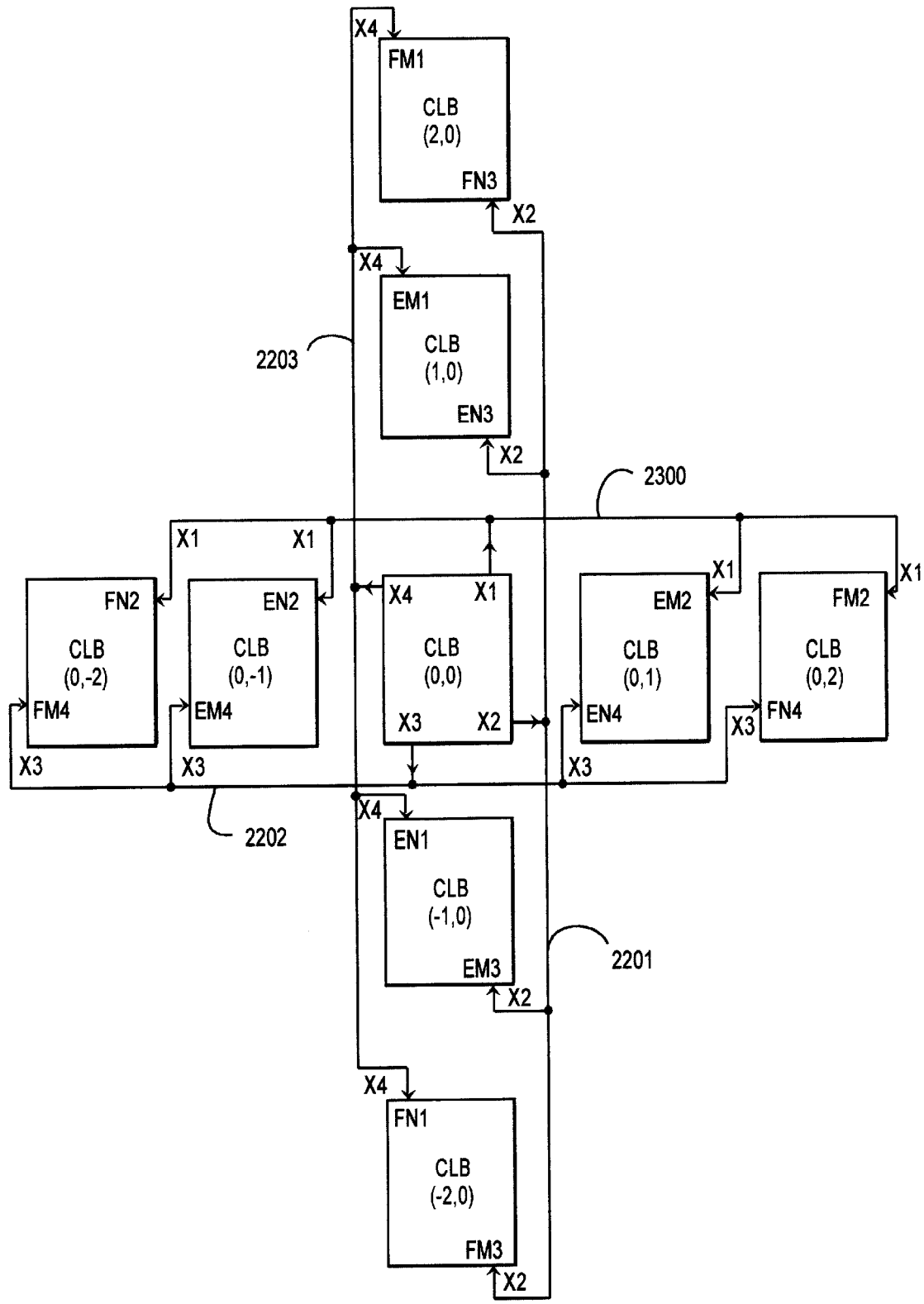
FIG. 22 illustrates a previously suggested direct connect architecture between a four-sided CLB having respective outputs and inputs of neighboring four-sided CLBs.

FIG. 22 illustrates a previously suggested direct connect architecture between outputs of a center CLB(0,0) and neighboring CLB direct connect inputs. The X1 output of CLB(0,0) is connected to direct connect line 2300. Direct connect line 2300 is connected to input FN2 of CLB(0,−2), input EN2 of CLB(0,−1), input EM2 of CLB(0,1) and input FM2 of CLB(0,2). Likewise, the direct connect output X2 of CLB(0,0) is coupled to direct connect line 2201. Direct connect line 2201 is connected to the input FN3 of CLB(2,0), input EN3 of CLB(1,0), input EM3 of CLB(−1,0), input FM3 of CLB(−2,0). The direct connect output X3 of CLB (0,0) is connected to direct connect line 2202. Direct connect line 2202 is connected to the input FM4 of CLB(0,−2), input EM4 of CLB(0,−1), input EN4 of CLB(0,1) and FN4 of CLB(0,2). Finally, the direct connect X4 output of CLB(0,0) is connected to direct connect line 2203. Direct connect line 2203 is connected to the input FM1 of CLB(2,0), input EM1 of CLB(1,0), input EN1 of CLB(−1,0) and input FN1 of CLB(−2,0).

The direct connect architecture according to an embodiment of the present invention, as illustrated in FIGS. 20 and 21, offers several advantages over the previously suggested direct connect architecture illustrated in FIG. 22.

First, the direct connect architecture enables flexible placement of CBB-sized signal-sourcing or signal receiving chunks. For example, the FPGA-configuring software module may place a given circuit chunk in either CBB W or Y. Since the direct connect architecture between CBB W and the neighboring CBBs W and Y are substantially the same as the direct connect architecture between CBB Y and the neighboring CBBs W and Y, the FPGA-configuring software has the flexibility of positioning a given original circuit chunk in either CBB W or CBB Y in VGB(0,0) and the direct connect signal propagation times (RCL delay) between VGB(0,0) and the neighboring VGB will be substantially equal.

The FPGA-configuring software has similar flexibility in placing a given circuit chunk in either CBB Z or CBB X in VGB(0,0).

Second, a direct connect output from a center VGB is connected directly to eight neighboring VGBs on a single direct connect line. The previously suggested direct connect architecture as illustrated in FIG. 22, requires outputting direct connect signals from two direct connect outputs to eight neighboring CLBs. For example, if a direct connect output signal is directed to eight neighboring CLBs, an output signal must be generated at both the X1 output and the X2 output of CLB(0,0).

Third, the length of the direct connect line wires as illustrated in FIGS. 20 and 21 are generally shorter than the direct connect line wires used in the previously suggested direct connect architecture illustrated in FIG. 22 and thus enable reduced signal propagation times and reduced manufacturing costs. For example, the direct connect line 1620 connecting an output of CBB Y in VGB(0,0) to inputs of VGB(0,1) is shorter than direct connect line 2300 connecting output X1 of CLB(0,0) to input EM2 of CLB(0,1).

FIG. 20A also illustrates how the L-organized positioning of the CBBs enables shorter direct connect wire lengths as compared to other alternate designs or possible alternate positioning of the CBBs in the respective VGBs. Moreover, the wedge-together VGBs enable direct connect line wires which do not have to cross over additional interconnect channels as may be required by an alternate design. In particular, FIG. 20A illustrates the additional wire lengths (illustrated by dashed lines) used if the CBBs W' and Y' (illustrated by dashed boxes) are positioned on opposite sides of a VGB in an alternate design.

In this alternate architecture, CBB W' is positioned on the north side of a VGB and CBB Y' is positioned on the south side of a VGB. In still another alternate architecture, CBB X' is positioned on the east side of a VGB and CBB Z' is positioned on the west side of a VGB. For example, CBB Y' is positioned on the south side of VGB(−2,0) instead of the north side. Likewise, VGB W' in VGB(1,0) is positioned on the north side instead of on the south side. Each VGB width is referenced as $L_{VGB}$ and each interconnect channel width is referenced as $L_{IC}$.

According to one embodiment of the present invention, direct connect line 1610 is used to connect the direct connect output of CBB W in VGB(0,0) to neighboring CBBs. In an alternate design where VGBs are not wedged-together, additional direct connect line wires 1610a–c would be needed. For example, direct connect wire 1610a would be used to connect line 1610 to CBB Y' and CBB W' in VGB(2,0) and VGB(1,0), respectively. Similarly, direct connect line wires 1610b and 1610c would be used to connect to respective CBB W' and CBB Y' inputs.

Further, in this alternate design, additional interconnect channels are crossed. For example, horizontal interconnect channel width $L_{ICX}$ is spanned by line 1610c in connecting to the direct connect input of CBB Y' in VGB(−2,0).

The reduced direct connect wire length is important in that the resistance (R), capacitance (C), and inductance (L)

of a direct connect line may be reduced. If additional direct connect wires 1610*a–c* were used, the direct connect line would have a larger RCL or RCL delay. This larger RCL would cause slower signal propagation times on direct connect lines or may require larger direct connect amplifiers to support the larger load.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A field programmable gate array device comprising:
   (a) a plurality of variable grain blocks (VGBS) each carrying out one or more program-defined logic functions, each having inputs for receiving respective input signals and each having outputs for outputting respective output signals; and
   (b) a plurality of interconnect lines for routing signals between the plurality of variable grain blocks (VGBs), the plurality of interconnect lines including a programmably configurable first portion for providing program-defined routing of signals between the plurality of variable grain blocks (VGBs);
   wherein the plurality of VGBs includes:
      (a.1) a first VGB having a top, right, bottom and left side, wherein first and second inputs are located at the top side;
      (a.2) a second VGB having a top, right, bottom and left side, wherein first and second outputs are located at the top side;
   wherein the plurality of interconnect lines further includes a second portion comprising:
      (b.1) a first direct connect line connecting the first output of the second VGB directly to a respective input of the first VGB; and
      (b.2) a second direct connect line connecting the second output of the second VGB directly to respective input of the first VGB.

2. The field programmable gate array device of claim 1, further including:
   (a.3) a third VGB having a top, right, bottom and left side, wherein first and second outputs are located at the top side;
   wherein the second portion includes:
      (b.3) a third direct connect line connecting the first output of the third VGB directly to a respective input of the first VGB; and
      (b.4) a fourth direct connect line connecting the second output of the third VGB directly to a respective input of the first VGB.

3. The field programmable gate array device of claim 2, further including:
   (a.4) a fourth VGB having a top, right, bottom and left side, wherein first and second outputs are located at the bottom side;
   (a.5) a fifth VGB having a top, right, bottom, and left side, wherein first and second outputs are located at the top side;
   wherein the second portion includes:
      (b.5) a fifth direct connect line connecting the first output of the fourth VGB directly to a respective input of the first VGB; and
      (b.6) a sixth direct connect line connecting the second output of the fourth VGB directly to a respective input of the first VGB;
      (b.7) a seventh direct connect line connecting the first output of the fifth VGB directly to a respective input of the first VGB; and
      (b.8) an eighth direct connect line connecting the second output of the fifth VGB directly to a respective input of the first VGB.

4. The field programmable gate array device of claim 3, further including:
   (a.6) a sixth VGB having a top, right, bottom, and left side, wherein first and second outputs are located at the top side;
   (a.7) a seventh VGB having a top, right, bottom, and left side, wherein first and second outputs are located at the top side;
   wherein the second portion includes:
      (b.9) a ninth direct connect line connecting a first output of the sixth VGB directly to a respective input of the first VGB; and
      (b.10) a tenth direct connect line connecting the second output of the sixth VGB directly to a respective input of the first VGB;
      (b.11) an eleventh direct connect line connecting the first output of the seventh VGB directly to a respective input of the first VGB; and
      (b.12) a twelfth direct connect line connecting the second output of the seventh VGB directly to a respective input of the first VGB.

5. The field programmable gate array device of claim 4, further including:
   (a.8) an eighth VGB having a top, right, bottom, and left side, wherein first and second outputs are located at the top side; and
   (a.9) a ninth VGB having a top, right, bottom, and left side, wherein first and second outputs are located at the bottom side;
   wherein the second portion includes:
      (b.13) a thirteenth direct connect line connecting the first output of the eighth VGB directly to a respective input of the first VGB; and
      (b.14) a fourteenth direct connect line connecting the second output of the eighth VGB directly to a respective input of the first VGB;
      (b.15) a fifteenth direct connect line connecting the first output of the ninth VGB directly to a respective input of the first VGB; and
      (b.16) a sixteenth direct connect line connecting the second output of the ninth VGB directly to a respective input of the first VGB.

6. The field programmable gate array device of claim 5, wherein the eighth VGB includes a first and a second CBB having the first and the second respective outputs.

7. The field programmable gate array device of claim 4, wherein the sixth VGB includes a first and a second CBB having the first and the second respective outputs.

8. The field programmable gate array device of claim 3, wherein the fourth VGB includes a first and a second CBB having the first and the second respective outputs.

9. The field programmable gate array device of claim 2, wherein the third VGB includes a first and a second CBB having the first and the second respective outputs.

10. The field programmable partitionable gate array device of claim 1, wherein the first VGB includes a first configurable building block ("CBB") having a first and a second input and the second VGB includes a first and a second CBB having the first and the second respective outputs.

11. A field programmable gate array device comprising:
   (a) a plurality of variable grain blocks (VGBs) each carrying out one or more program-defined logic functions, each having inputs for receiving respective input signals and each having outputs for outputting respective output signals; and
   (b) a plurality of interconnect lines for routing signals between the plurality of variable grain blocks (VGBs), the plurality of interconnect lines including a programmably configurable first portion for providing program-defined routing of signals between the plurality of variable grain blocks (VGBs);
   wherein the plurality of VGBS includes:
      (a.1) a first VGB having a top, right, bottom and left side, wherein a plurality of inputs are located at the top side;
      (a.2) a first adjacent VGB having a top, right, bottom and left side, wherein first and second outputs are located at the top side;
      (a.3) a second adjacent VGB having a top right, bottom and left side, wherein first and second outputs are located at the bottom side;
      (a.4) a third adjacent VGB having a top, right, bottom, and left side, wherein first and second outputs are located at the top side;
      (a.5) a fourth adjacent VGB having a top, right, bottom and left side, wherein first and second outputs are located at the bottom side;
   wherein the plurality of interconnect lines further includes a second portion comprising:
      (b.1) a first direct connect line connecting the first output of the first adjacent VGB directly to a respective input of the first VGB; and
      (b.2) a second direct connect line connecting the second output of the first adjacent VGB directly to a respective input of the first VGB;
      (b.3) a third direct connect line connecting the first output of the second adjacent VGB directly to a respective input of the first VGB;
      (b.4) a fourth direct connect line connecting the second output of the second adjacent VGB directly to a respective input of the first VGB;
      (b.5) a fifth direct connect line connecting the first output of the third adjacent VGB directly to a respective input of the first VGB;
      (b.6) a sixth direct connect line connecting the second output of the third adjacent VGB directly to a respective input of the first VGB;
      (b.7) a seventh direct connect line connecting the first output of the fourth adjacent VGB directly to a respective input of the first VGB; and
      (b.8) an eighth direct connect line connecting the second output of the fourth adjacent VGB directly to a respective input of the first VGB.

12. A field programable gate array device comprising:
   (a) a plurality of variable grain blocks (VGBs) each carrying out one or more program-defined logic functions, each having inputs for receiving respective input signals and each having outputs for outputting respective output signals; and
   (b) a plurality of interconnect lines for routing signals between the plurality of variable grain blocks (VGBs), the plurality of interconnect lines including a programmably configurable first portion for providing program-defined routing of signals between the plurality of variable grain blocks (VGBs);
   wherein the plurality of VGBs includes:
      (a.1) a first VGB having a top, right, bottom and left side, wherein a plurality of inputs are located at the top side;
      (a.2) a first next-adjacent VGB having a top, right, bottom and left side, wherein first and second outputs are located at the top side;
      (a.3) a second next-adjacent VGB having a top, right, bottom and left side, wherein first and second outputs are located at the top side;
      (a.4) a third next-adjacent VGB having a top, right, bottom, and left side, wherein first and second outputs are located at the top side;
      (a.5) a fourth next-adjacent VGB having a top, right, bottom and left side, wherein first and second outputs are located at the top side;
   wherein the plurality of interconnect lines further includes a second portion comprising:
      (b.1) a first direct connect line connecting the first output of the first next-adjacent VGB directly to a respective input of the first VGB; and
      (b.2) a second direct connect line connecting the second output of the first next-adjacent VGB directly to a respective input of the first VGB;
      (b.3) a third direct connect line connecting the first output of the second next-adjacent VGB directly to a respective input of the first VGB;
      (b.4) a fourth direct connect line connecting the second output of the second next-adjacent VGB directly to a respective input of the first VGB;
   (b.5) a fifth direct connect line connecting the first output of the third next-adjacent VGB directly to a respective input of the first VGB;
   (b.6) a sixth direct connect line connecting the second output of the third next-adjacent VGB directly to a respective input of the first VGB;
   (b.7) a seventh direct connect line connecting the first output of the fourth next-adjacent VGB directly to a respective input of the first VGB; and
   (b.8) an eighth direct connect line connecting the second output of the fourth next-adjacent VGB directly to a respective input of the first VGB.

13. A field programmable gate array device comprising:
   (a) a plurality of variable grain blocks (VGBs) each carrying out one or more program-defined logic functions, each having inputs for receiving respective input signals and each having outputs for outputting respective output signals; and
   (b) a plurality of interconnect lines for routing signals between the plurality of variable grain blocks (VGBs), the plurality of interconnect lines including a programmably configurable first portion for providing program-defined routing of signals between the plurality of variable grain blocks (VGBs);
   wherein said plurality of VGBs includes:
      (a.1) a first VGB having a top, right, bottom and left side, wherein first and second outputs are located at the top side;

(a.2) a second VGB having a top, right, bottom and left side, wherein first and second outputs are located at the top side;
(a.3) a third VGB having a top, right, bottom and left side, wherein a plurality of inputs are located at the top side;
(a.4) a fourth VGB having a top, right, bottom and left side, wherein first and second outputs are located at the top side;
(a.5) a fifth VGB having a top, right, bottom and left side, wherein first and second outputs are located at the top side;
wherein the first, second, third, fourth and fifth VGBs are arranged consecutively in a row;
wherein the plurality of interconnect lines further includes a second portion comprising:
(b.1) a first direct connect line connecting the first output of the first VGB directly to a respective input of the third VGB;
(b.2) a second direct connect line connecting the second output of the first VGB directly to a respective input of the third VGB;
(b.3) a third direct connect line connecting the first output of the second VGB directly to a respective input of the third VGB;
(b.4) a fourth direct connect line connecting the second output of the second VGB directly to a respective input of the third VGB;
(b.5) a fifth direct connect line connecting the first output of the fourth VGB directly to a respective input of the third VGB;
(b.6) a sixth direct connect line connecting the second output of the fourth VGB directly to a respective input of the third VGB;
(b.7) a seventh direct connect line connecting the first output of the fifth VGB directly to a respective input of the third VGB; and
(b.8) an eighth direct connect line connecting the second output of the fifth VGB directly to a respective function input of the third VGB.

14. A field programmable gate array device comprising:
(a) a plurality of variable grain blocks (VGBs) each carrying out one or more program-defined logic functions, each having inputs for receiving respective input signals and each having outputs for outputting respective output signals; and
(b) a plurality of interconnect lines for routing signals between the plurality of variable grain blocks (VGBs), the plurality of interconnect lines including a programmably configurable first portion for providing program-defined routing of signals between the plurality of variable grain blocks (VGBs);
wherein said plurality of VGBs includes:
(a.1) a first VGB having a top, right, bottom and left side, wherein a first and second outputs are located at the top side;
(a.2) a second VGB having a top, right, bottom and left side, wherein first and second outputs are located at the bottom side;
(a.3) a third VGB having a top, right, bottom and left side, wherein a plurality of inputs are located at the top side;
(a.4) a fourth VGB having a top, right, bottom and left side, wherein first and second outputs are located at the bottom side;
(a.5) a fifth VGB having a top, right, bottom and left side, wherein first and second outputs are located at the top side;
wherein the first, second, third, fourth and fifth VGBs are arranged consecutively in a column;
wherein the plurality of interconnect lines further includes a second portion comprising:
(b.1) a first direct connect line connecting the first output of the first VGB directly to a respective input of the third VGB;
(b.2) a second direct connect line connecting the second output of the first VGB directly to a respective input of the first VGB;
(b.3) a third direct connect line connecting the first output of the second VGB directly to a corresponding input of the third VGB;
(b.4) a fourth direct connect line connecting the second output of the second VGB directly to a respective input of the third VGB;
(b.5) a fifth direct connect line connecting the first output of the fourth VGB directly to a respective input of the third VGB;
(b.6) a sixth direct connect line connecting the second output of the fourth VGB directly to a respective input of the third VGB;
(b.7) a seventh direct connect line connecting the first output of the fifth VGB directly to a respective input of the third VGB; and
(b.8) an eighth direct connect line connecting the second output of the fifth VGB directly to a corresponding input of the third VGB.

15. A field programmable gate array device comprising:
(a) a plurality of variable grain blocks (VGBs) each carrying out one or more program-defined logic functions, each having inputs for receiving respective input signals and each having outputs for outputting respective output signals; and
(b) a plurality of interconnect lines for routing signals between the plurality of variable grain blocks (VGBs), the plurality of interconnect lines including a programmably configurable first portion for providing program-defined routing of signals between the plurality of variable grain blocks (VGBs);
wherein the plurality of VGBs includes:
(a.1) a first VGB having a top, right, bottom and left side, wherein a plurality of inputs are located at the left side;
(a.2) a second VGB having a top, right, bottom and left side, wherein first and second outputs are located at the right side;
wherein the plurality of interconnect lines further includes a second portion comprising:
(b.1) a first direct connect line connecting the first output of the second VGB directly to a respective input of the first VGB; and
(b.2) a second direct connect line connecting the second output of the second VGB directly to a respective input of the first VGB.

16. The field programmable gate array device of claim 15, further including:
(a.3) a third VGB having a top, right, bottom and left side, wherein first and second outputs are located at the left side;
wherein the second portion includes:
(b.3) a third direct connect line connecting the first output of the third VGB directly to a respective input of the first VGB; and
(b.4) a fourth direct connect line connecting the second output of the third VGB directly to a respective input of the first VGB.

17. The field programmable gate array device of claim 16, further including:
- (a.4) a fourth VGB having a top, right, bottom and left side, wherein first and second outputs are located at the left side;
- (a.5) a fifth VGB having a top, right, bottom, and left side, wherein first and second outputs are located at the left side;

wherein said second portion includes:
- (b.5) a fifth direct connect line connecting the first output of the fourth VGB directly to a respective input of the first VGB;
- (b.6) a sixth direct connect line connecting the second output of the fourth VGB directly to a corresponding input of the first VGB;
- (b.7) a seventh direct connect line connecting the first output of the fifth VGB directly to a respective input of the first VGB; and
- (b.8) an eighth direct connect line connecting the second output of the fifth VGB directly to a corresponding function input of the first VGB.

18. The field programmable gate array device of claim 17 further including:
- (a.6) a sixth VGB having a top, right, bottom, and left side, wherein first and second outputs are located at the right side;
- (a.7) a seventh VGB having a top, right, bottom, and left side, wherein first and second outputs are located at the left side;

wherein the second portion includes:
- (b.9) a ninth direct connect line connecting the first output of the sixth VGB directly to a respective input of the first VGB; and
- (b.10) a tenth direct connect line connecting the second output of the sixth VGB directly to a respective input of the first VGB;
- (b.11) an eleventh direct connect line connecting the first output of the seventh VGB directly to a respective input of the first VGB; and
- (b.12) a twelfth direct connect line connecting the second output of the seventh VGB directly to a respective input of the first VGB.

19. The field programmable gate array device of claim 18, further including:
- (a.8) an eighth VGB having a top, right, bottom, and left side, wherein first and second outputs are located at the left side; and
- (a.9) a ninth VGB having a top, right, bottom, and left side, wherein first and second outputs are located at the left side;

wherein the second portion includes:
- (b.13) a thirteenth direct connect line connecting the first output of the eighth VGB directly to a respective input of the first VGB; and
- (b.14) a fourteenth direct connect line connecting the second output of the eighth VGB directly to a respective input of the first VGB;
- (b.15) a fifteenth direct connect line connecting a first output of the ninth VGB directly to a respective input of the first VGB; and
- (b.16) a sixteenth direct connect line connecting the second output of the ninth VGB directly to a respective input of the first VGB.

20. The field programmable gate array device of claim 19, wherein the eighth VGB includes a first and second CBB having the first and second respective outputs.

21. The field programmable gate array device of claim 18, wherein the sixth VGB includes a first and second CBB having the first and second respective outputs.

22. The field programmable gate array device of claim 17, wherein the fourth VGB includes a first and second CBB having the first and second respective outputs.

23. The field programmable gate array device of claim 16, wherein the third VGB includes a first and second CBB having the first and second respective outputs.

24. The field programmable gate array device of claim 15, wherein the first VGB includes a first CBB having a first and second input and the second VGB includes a first and second CBB having the first and second respective outputs.

25. A field programmable gate array device comprising:
- (a) a plurality of variable grain blocks (VGBs) each carrying out one or more program-defined logic functions, each having inputs for receiving respective input signals and each having outputs for outputting respective output signals; and
- (b) a plurality of interconnect lines for routing signals between the plurality of variable grain blocks (VGBs), the plurality of interconnect lines including a programmably configurable first portion for providing program-defined routing of signals between the plurality of variable grain blocks (VGBs);

wherein the plurality of VGBs includes:
- (a.1) a first VGB having a top, right, bottom and left side, wherein a plurality of inputs are located at the left side;
- (a.2) a first adjacent VGB having a top, right, bottom and left side, wherein first and second outputs are located at the right side;
- (a.3) a second adjacent VGB having a top right, bottom and left side, wherein first and second outputs are located at the left side;
- (a.4) a third adjacent VGB having a top, right, bottom, and left side, wherein first and second outputs are located at the right side;
- (a.5) a fourth adjacent VGB having a top, right, bottom and left side, wherein first and second outputs are located at the left side;

wherein the plurality of interconnect lines further includes a second portion comprising:
- (b.1) a first direct connect line connecting the first output of the first adjacent VGB directly to a respective input of the first VGB; and
- (b.2) a second direct connect line connecting the second output of the first adjacent VGB directly to a respective input of the first VGB;
- (b.3) a third direct connect line connecting the first output of the second adjacent VGB directly to a respective input of the first VGB;
- (b.4) a fourth direct connect line connecting the second output of the second adjacent VGB directly to a respective input of the first VGB;
- (b.5) a fifth direct connect line connecting the first output of the third adjacent VGB directly to a respective input of the first VGB;
- (b.6) a sixth direct connect line connecting the second output of the third adjacent VGB directly to a respective input of the first VGB;
- (b.7) a seventh direct connect line connecting the first output of the fourth adjacent VGB directly to a respective input of the first VGB; and
- (b.8) an eighth direct connect line connecting the second output of the fourth adjacent VGB directly to a respective input of the first VGB.

26. A field programmable gate array device comprising:
(a) a plurality of variable grain blocks (VGBs) each carrying out one or more program-defined logic functions, each having inputs for receiving respective input signals and each having outputs for outputting respective output signals; and
(b) a plurality of interconnect lines for routing signals between the plurality of variable grain blocks (VGBs), the plurality of interconnect lines including a programmably configurable first portion for providing program-defined routing of signals between the plurality of variable grain blocks (VGBs);

wherein the plurality of VGBs includes:
  (a.1) a first VGB having a top, right, bottom and left side, wherein a plurality of inputs are located at the left side;
  (a.2) a first next-adjacent VGB having a top, right, bottom and left side, wherein first and second outputs are located at the left side;
  (a.3) a second next-adjacent VGB having a top right, bottom and left side, wherein first and second outputs are located at the left side;
  (a.4) a third next-adjacent VGB having a top, right, bottom, and left side, wherein first and second outputs are located at the left side;
  (a.5) a fourth next-adjacent VGB having a top right bottom and left side, wherein first and second outputs are located at the left side;

wherein the plurality of interconnect lines further includes a second portion comprising:
  (b.1) a first direct connect line connecting the first output of the first next-adjacent VGB directly to a respective input of the first VGB; and
  (b.2) a second direct connect line connecting the second output of the first next-adjacent VGB directly to a respective input of the first VGB;
  (b.3) a third direct connect line connecting the first output of the second next-adjacent VGB directly to a respective input of the first VGB;
  (b.4) a fourth direct connect line connecting the second output of the second next-adjacent VGB directly to a respective input of the first VGB;
  (b.5) a fifth direct connect line connecting the first output of the third next-adjacent VGB directly to a respective input of the first VGB;
  (b.6) a sixth direct connect line connecting the second output of the third next-adjacent VGB directly to a respective input of the first VGB;
  (b.7) a seventh direct connect line connecting the first output of the fourth next-adjacent VGB directly to a respective input of the first VGB; and
  (b.8) an eighth direct connect line connecting the second output of the fourth next-adjacent VGB directly to a respective input of the first VGB.

27. A field programmable gate array device comprising:
(a) a plurality of variable grain blocks (VGBs) each carrying out one or more program-defined logic functions, each having inputs for receiving respective input signals and each having outputs for outputting respective output signals; and
(b) a plurality of interconnect lines for routing signals between the plurality of variable grain blocks (VGBs), the plurality of interconnect lines including a programmably configurable first portion for providing program-defined routing of signals between the plurality of variable grain blocks (VGBs);

wherein the plurality of VGBs includes:
  (a.1) a first VGB having a top, right, bottom and left side, wherein first and second outputs are located at the left side;
  (a.2) a second VGB having a top, right, bottom and left side, wherein first and second outputs are located at the right side;
  (a.3) a third VGB having a top, right, bottom and left side, wherein a plurality of inputs are located at the left side;
  (a.4) a fourth VGB having a top, right, bottom and left side, wherein first and second outputs are located at the right side;
  (a.5) a fifth VGB having a top, right, bottom and left side, wherein first and second outputs are located at the left side;

wherein the first, second, third, fourth and fifth VGBs are arranged consecutively in a row;

wherein the plurality of interconnect lines further includes a second portion comprising:
  (b.1) a first direct connect line connecting the first output of the first VGB directly to a respective input of the third VGB;
  (b.2) a second direct connect line connecting the second output of the first VGB directly to a respective input of the third VGB;
  (b.3) a third direct connect line connecting the first output of the second VGB directly to a respective input of the third VGB;
  (b.4) a fourth direct connect line connecting the second output of the second VGB directly to a respective input of the third VGB;
  (b.5) a fifth direct connect line connecting the first output of the fourth VGB directly to a respective input of the third VGB;
  (b.6) a sixth direct connect line connecting the second output of the fourth VGB directly to a respective input of the third VGB;
  (b.7) a seventh direct connect line connecting the first output of the fifth VGB directly to a respective input of the third VGB; and
  (b.8) an eighth direct connect line connecting the second output of the fifth VGB directly to a respective input of the third VGB.

28. A field programmable gate array device comprising:
(a) a plurality of variable grain blocks (VGBS) each carrying out one or more program-defined logic functions, each having inputs for receiving respective input signals and each having outputs for outputting respective output signals; and
(b) a plurality of interconnect lines for routing signals between the plurality of variable grain blocks (VGBs), the plurality of interconnect lines including a programmably configurable first portion for providing program-defined routing of signals between the plurality of variable grain blocks (VGBs);

wherein the plurality of VGBs includes:
  (a.1) a first VGB having a top, right, bottom and left side, wherein a first and second outputs are located at the left side;
  (a.2) a second VGB having a top, right, bottom and left side, wherein first and second outputs are located at the left side;
  (a.3) a third VGB having a top, right, bottom and left side, wherein a plurality of inputs are located at the left side;

(a.4) a fourth VGB having a top, right, bottom and left side, wherein first and second outputs are located at the left side;

(a.5) a fifth VGB having a top, right, bottom and left side, wherein first and second outputs are located at the left side;

wherein the first, second, third, fourth and fifth VGBs are arranged consecutively in a column;

wherein the plurality of interconnect lines further includes a second portion comprising:

(b.1) a first direct connect line connecting the first output of the first VGB directly to a respective input of the third VGB;

(b.2) a second direct connect line connecting the second output of the first VGB directly to a respective input of the first VGB;

(b.3) a third direct connect line connecting the first output of the second VGB directly to a respective input of the third VGB;

(b.4) a fourth direct connect line connecting the second output of the second VGB directly to a respective input of the third VGB;

(b.5) a fifth direct connect line connecting the first output of the fourth VGB directly to a respective input of the third VGB;

(b.6) a sixth direct connect line connecting the second output of the fourth VGB directly to a respective input of the third VGB;

(b.7) a seventh direct connect line connecting the first output of the fifth VGB directly to a respective input of the third VGB; and (b.8) an eighth direct connect line connecting the second output of the fifth VGB directly to a respective input of the third VGB.

* * * * *